US005769963A

United States Patent [19]
Fujioka et al.

[11] Patent Number: 5,769,963
[45] Date of Patent: Jun. 23, 1998

[54] PHOTOVOLTAIC DEVICE

[75] Inventors: Yasushi Fujioka; Shotaro Okabe, both of Nara; Masahiro Kanai; Akira Sakai, both of Soraku-gun; Yuzo Koda, Tsuzuki-gun; Tadashi Hori, Nara; Tomonori Nishimoto, Tsuzuki-gun; Takahiro Yajima, Soraku-gun, all of Japan

[73] Assignee: Canon Kabushiki Kaisha, Tokyo, Japan

[21] Appl. No.: 697,783

[22] Filed: Aug. 30, 1996

[30] Foreign Application Priority Data

Aug. 31, 1995 [JP] Japan .................................. 7-223942
Aug. 31, 1995 [JP] Japan .................................. 7-223943

[51] Int. Cl.⁶ .............................................. H01L 31/0352
[52] U.S. Cl. ........................ 136/258; 136/249; 257/458
[58] Field of Search ....................... 136/249 TJ, 258 AM, 136/258 PC; 257/440, 458

[56] References Cited

U.S. PATENT DOCUMENTS

| | | | |
|---|---|---|---|
| 4,451,970 | 6/1984 | Izu et al. | 437/8 |
| 4,598,306 | 7/1986 | Nath et al. | 257/458 |
| 4,729,970 | 3/1988 | Nath et al. | 437/225 |
| 5,401,330 | 3/1995 | Saito et al. | 136/259 |

FOREIGN PATENT DOCUMENTS

| | | | |
|---|---|---|---|
| 58-132984 | 8/1983 | Japan | 136/258 AM |
| 59-96775 | 6/1984 | Japan | 136/258 AM |
| 62-35680 | 2/1987 | Japan | 136/258 AM |
| 62-93983 | 4/1987 | Japan | 136/258 AM |
| 62-106670 | 5/1987 | Japan | 136/258 AM |
| 62-209871 | 9/1987 | Japan | 136/258 AM |
| 63-220581 | 9/1988 | Japan | 136/258 |
| 63-244887 | 10/1988 | Japan | 136/258 AM |
| 63-258078 | 10/1988 | Japan | 136/258 |
| 4-168770 | 6/1992 | Japan | 136/258 AM |
| 4-240778 | 8/1992 | Japan | 136/258 AM |

*Primary Examiner*—Nam Nguyen
*Attorney, Agent, or Firm*—Fitzpatrick, Cella, Harper & Scinto

[57] ABSTRACT

A photovoltaic device comprises a semiconductor region having at least one set of semiconductor layers comprised of a first semiconductor layer having a first conductivity type, an intrinsic or substantially intrinsic second semiconductor layer, and a third semiconductor layer having a conductivity type opposite to that of the first conductivity type, the layers being formed in this order, and first and second electrodes provided such that the electrodes interpose the semiconductor region; wherein the density of a dopant impurity determining the conductivity type of the first semiconductor layer in a set of semiconductor layers which is in contact with the first electrode is varied so as to be lower on the side of the first electrode, or the grain size of crystals in the first semiconductor layer is varied so as to be smaller on the side of the first electrode. This provides a photovoltaic device that does not exhibit great lowering of characteristics even when short circuits locally occur in the semiconductor layers during long-term service.

38 Claims, 18 Drawing Sheets

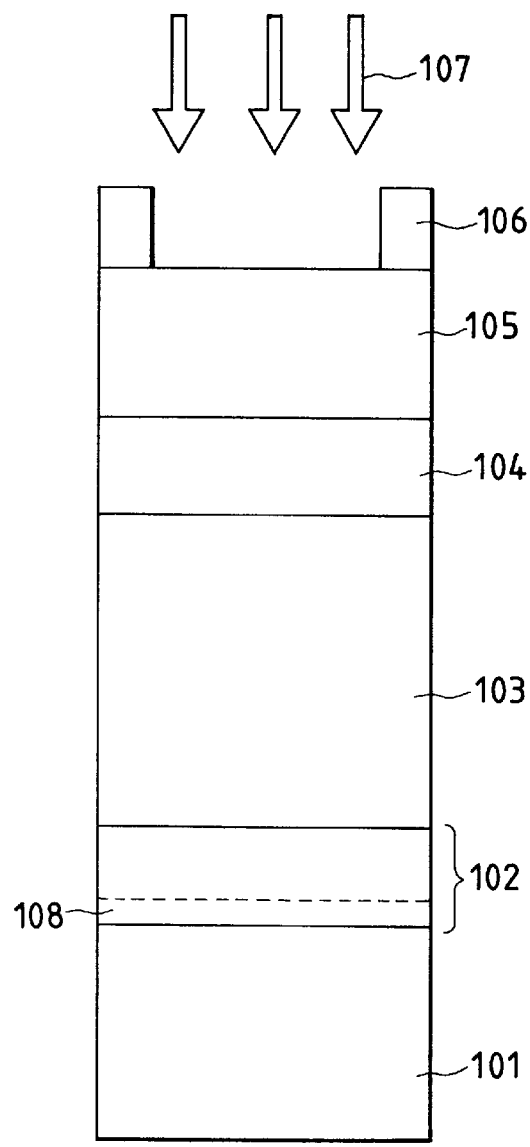
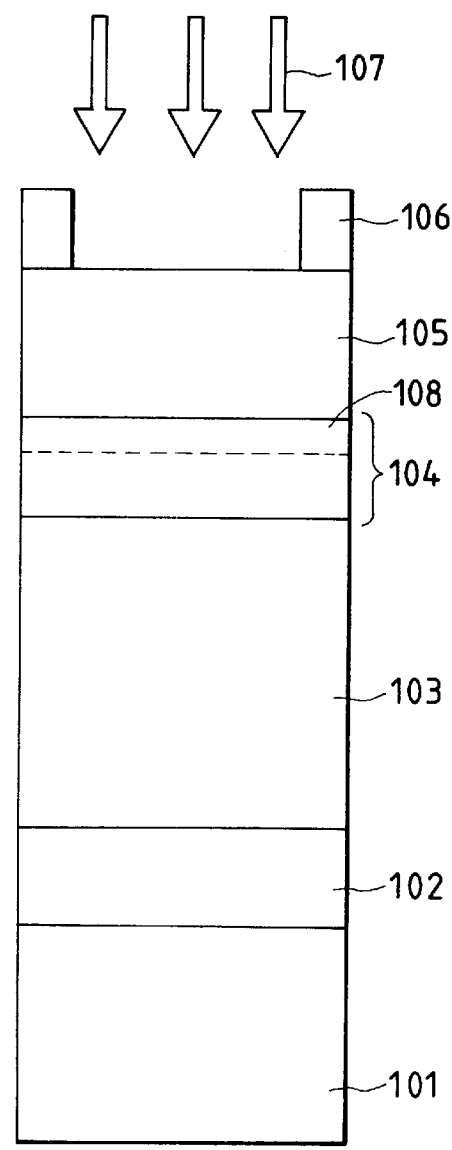

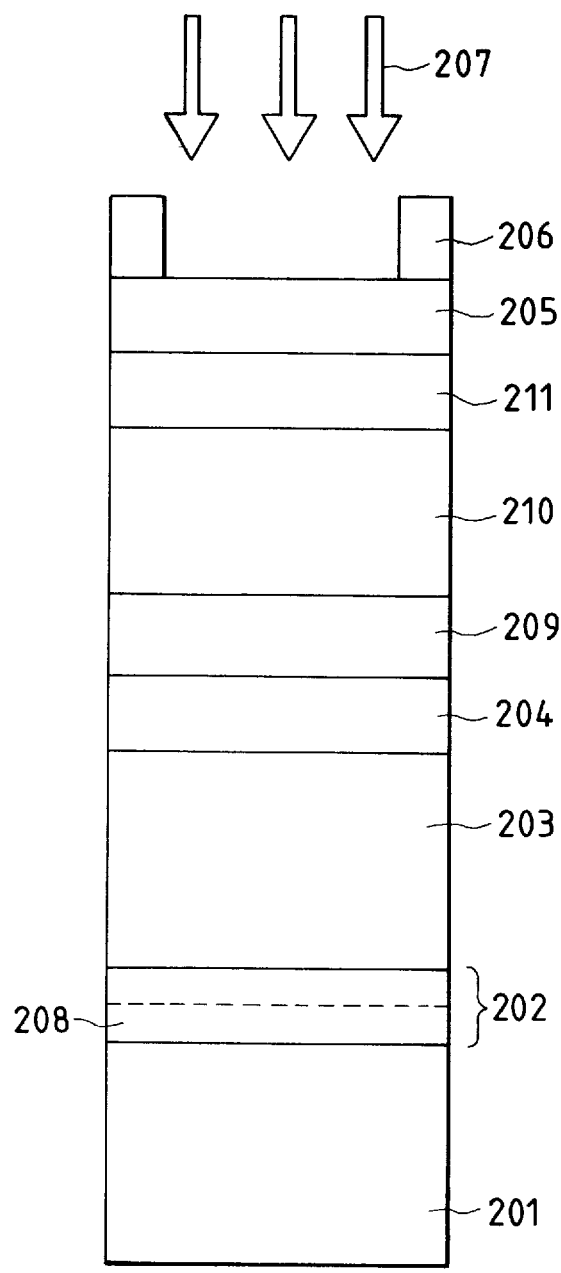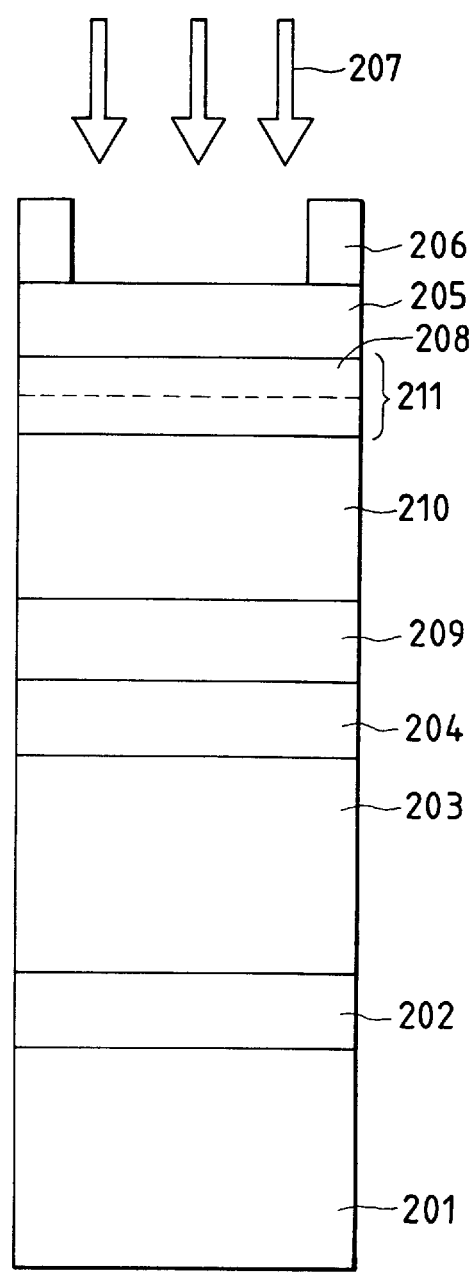

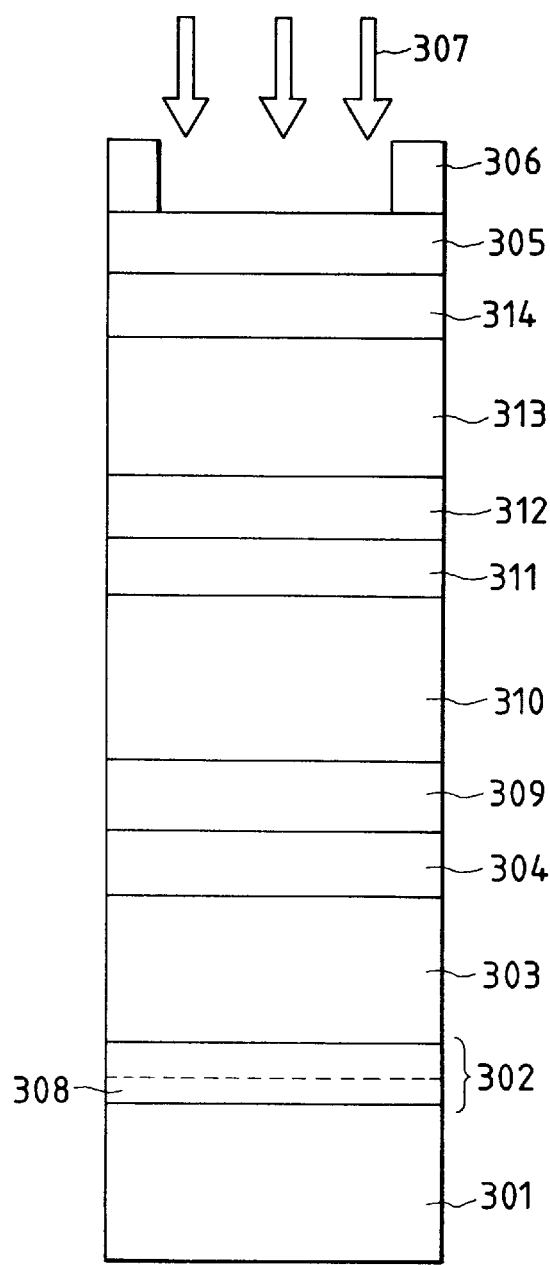
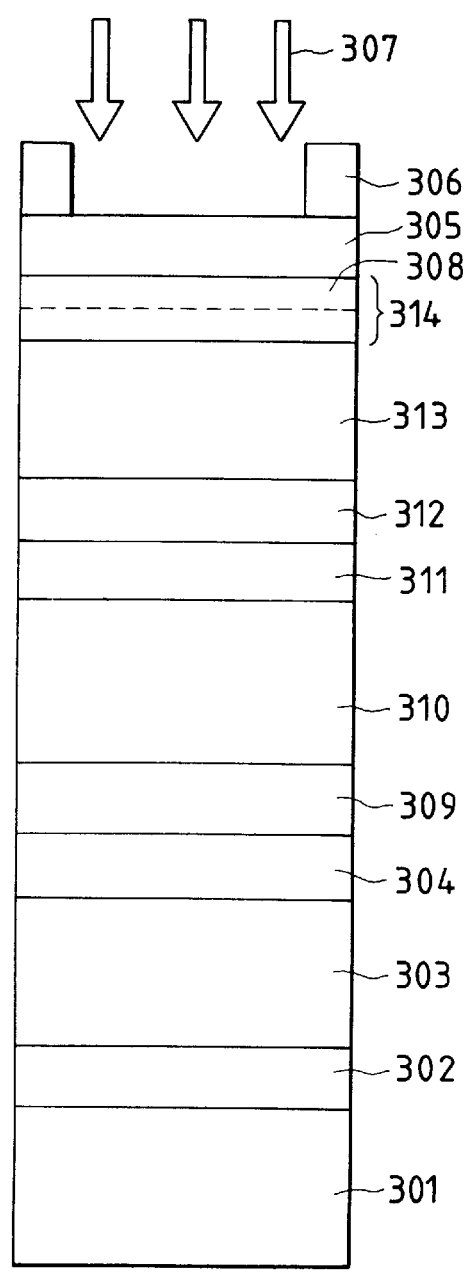

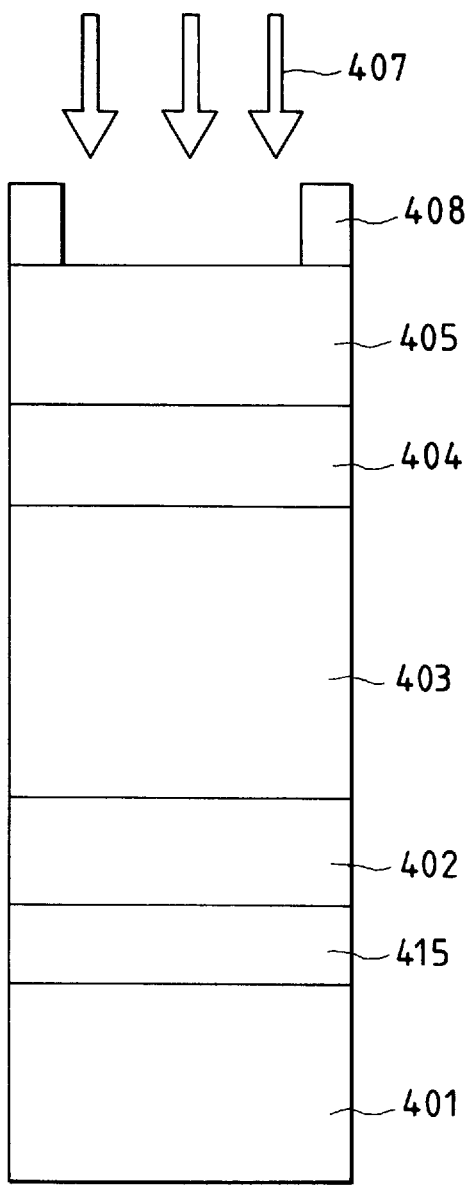
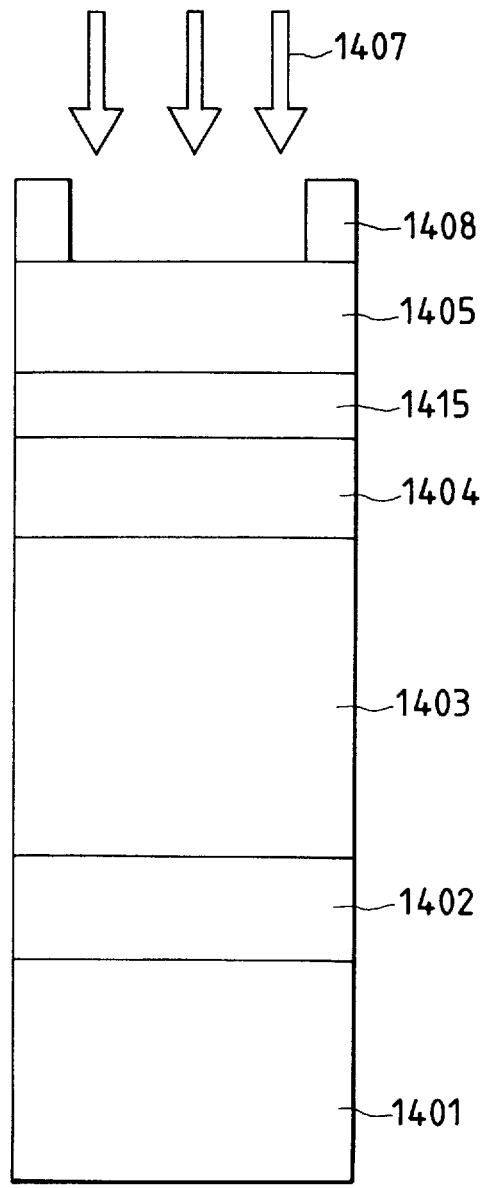

PHOTOVOLTAIC DEVICE

BACKGROUND OF THE INVENTION

1. Field of the Invention

This invention relates to a photovoltaic device, and more particularly to a photovoltaic device as typified by solar cells, having a superior long-term reliability.

2. Related Background Art

In recent years, as one type of photovoltaic device, thin-film solar cells making use of silicon type non-single-crystal semiconductors have been developed having the advantages that they can be formed on relatively inexpensive large area substrates such as glass or metal sheets and may be formed in a small layer thickness, making it possible to achieve cost reduction and larger area, compared with solar cells making use of single-crystal or polycrystalline semiconductors. They also have attracted interest from the viewpoint of sunlight electricity generation that can provide clean energy.

Now, when solar cells are used for power supply, e.g., in typical homes, it becomes necessary to have an output of about 3 kW. Assuming that the solar cells have a photoelectric conversion efficiency of 10%, the solar cells must have an area as large as 30 m$^2$.

However, in the solar cells formed of silicon type non-single-crystal semiconductors, the semiconductor layers have a small thickness of hundreds of nanometers (nm) at most. Hence, in view of the fabrication process of semiconductors, it is very difficult to produce solar cells having semiconductor layers that are free from defects or imperfections due to pinholes and inclusions over such a large area. As is well known, pinholes may occur in semiconductor layers because of the presence of dust during film formation of semiconductor layers or because of scratches and projections of substrates, and inclusions made of, e.g., conductive dust particles may be formed which tend to short-circuit the electrodes provided at upper and lower semiconductor layers. Especially when a metal sheet such as a stainless steel sheet whose surface is not mirror-finished is used as a substrate and when the substrate is made to have an irregular surface for the purpose of increasing the electric current to be generated, solar cells with a large area have tended to become short-circuited at some points.

As a result, the lower electrode and upper electrode of a solar cell come in direct contact at the pinholes of semiconductor layers, or the upper and lower electrodes are connected through conductive dust particles having entered the semiconductor layers or spike-like projections of the substrate come in contact with the upper electrode to produce short-circuited portions having low resistance, so that the electric current generated by light flows into the low-resistance, short-circuited portions to cause an abrupt drop of output voltage and output electric current, resulting in an abrupt lowering of electrical characteristics.

As countermeasures for the above short circuits, the following techniques are known in the art:

i) A method in which the inside of a semiconductor forming apparatus is cleaned so that neither pinholes nor inclusions may occur in semiconductor layers, to thereby prevent the presence of the dust causative of pinholes and inclusions.

ii) A method in which the short-circuited portions are selectively covered with an insulating material after the formation of semiconductor layers, or made to have high resistance by a chemical means, as disclosed in U.S. Pat. Nos. 4,451,970 and 4,729,970.

iii) A method in which light-transmitting barrier layers having a higher resistance than electrodes are provided between electrodes and semiconductor layers to prevent a great short-circuit current from flowing even when short-circuited portions are present, as disclosed in U.S. Pat. No. 4,598,306.

The above techniques conventionally used, however, have the following problems:

(1) The method i) has a limit because, as previously stated, it is very difficult to bring semiconductor layers into a state perfectly free from defects due to pinholes and inclusions over such a large area.

(2) The method ii) in which the short-circuited portions are insulated immediately after the formation of semiconductor layers can not cope with an instance where in the semiconductor layers in which the short-circuited portions are removed new short-circuited portions occur because of mechanical damage or invasion of moisture which occurs during use of the solar cells for many years.

Hence, in the case of solar cells used outdoors over a long period of time, in order to prevent the abrupt lowering of characteristics which happens with occurrence of short circuits and to improve long-term reliability, it is necessary to remove short-circuited portions by the method i) or ii) and also to beforehand take the countermeasure of the method iii) so that the characteristics can be prevented from abruptly lowering as a result of the flow of a great short-circuit current even when the short-circuited portions occur for any reason during long-term service.

In the above U.S. Pat. No. 4,598,306 shown in the method iii), the light-transmitting barrier layers having a higher resistance than electrodes, provided between electrodes and semiconductor layers, are exemplified by layers of oxides, nitrides, carbonates or the like of In, Sn, Cd, Zn, Sb, Si, Cr, or the like.

However, to provide such barrier layers in addition to semiconductor layers and electrodes, an apparatus for forming barrier layers is additionally required, so that the fabrication process becomes complicated. This has been a problem to be solved.

Of these materials, materials such as $InO_x$, $SnO_x$, $ZnO_x$, SiC, SiN, and SiO are widely used in photovoltaic devices making use of non-single-crystal silicon semiconductors. In order to obtain, using such materials, films that are transparent and also having resistance within a range suited for such purpose, it is necessary to delicately control impurities and it is difficult to obtain barrier layers of the same quality with good reproducibility. This has also been a problem. That is, films of $InO_x$, $SnO_x$ and $ZnO_x$ are films having a fairly low resistance, commonly used as transparent conductive films, and films of SiC, SiN and SiO are films having a fairly high resistance, commonly used as insulating films. Hence, in order to control the resistance within a proper range intermediate a conductive film and an insulating film which are provided for the purpose of preventing a great short-circuit current from locally flowing when short-circuit portions occur, it has been necessary to fairly delicately adjust the quantity of impurities to be doped.

In addition, for the purpose of enhancing light absorption in semiconductor layers to increase output current, a high-reflectance metal layer formed of Ag, Al or the like, is provided on the substrate surface. Also, for the purpose of preventing the high-reflectance metal layer from diffusing into semiconductor layers and for the purpose of increasing output current by increasing the optical path length of incident light, a transparent conductive film having an irregular surface according to the crystalline structure is formed on the conductive substrate. These are commonly done in the art.

In such cases, the form disclosed in U.S. Pat. No. 4,598,306 can be achieved when $InO_x$, $SnO_x$ and $ZnO_x$ are used as materials for the transparent conductive films and these are made to have a little higher resistance. Here, however, the film-forming conditions for increasing the optical path length of incident light according to the crystalline structure and to form such appropriate irregularities that do not cause short circuits are different from the film-forming conditions to control the resistance within a proper range. Thus, it has been difficult to fulfill both conditions at the same time.

As previously stated, in the conventional photovoltaic devices making use of silicon type non-single-crystal semiconductors, a great short-circuit current may flow, causing an abrupt lowering of electrical characteristics, when short-circuited portions occur during long-term service. In order to provide the barrier layers to prevent such a lowering of characteristics, an apparatus for forming barrier layers is additionally required, causing a problem in that the fabrication process becomes complicated. It has also been a problem that many of the barrier layer materials disclosed in the art are difficult to obtain with the same quality with good reproducibility.

SUMMARY OF THE INVENTION

An object of the present invention is to provide a photovoltaic device that does not suffer a great reduction of electrical characteristics even when short circuits locally occur in the semiconductor layers during long-term service, has a long-term reliability, and can achieve such advantages without complicating the fabrication process.

The present invention provides a photovoltaic device comprising, in its layer configuration, a conductive substrate, a first semiconductor layer having a first conductivity type, a substantially intrinsic second semiconductor layer, a third semiconductor layer having a conductivity type opposite to that of the first conductivity type, and a transparent electrode; the first to third semiconductor layers each comprising a silicon type non-single-crystal semiconductor and the light being incident on the side of the transparent electrode; wherein a dopant impurity determining the conductivity type of the first semiconductor layer is distributed therein so that the density of the impurity is lower on the side of the conductive substrate than on the side of the second semiconductor layer.

The present invention also provides a photovoltaic device comprising, in its layer configuration, a conductive substrate, a first semiconductor layer having a first conductivity type, a substantially intrinsic second semiconductor layer, a third semiconductor layer having a conductivity type opposite that of the first semiconductor, a fourth semiconductor layer having the first conductivity type, a substantially intrinsic fifth semiconductor layer, a sixth semiconductor layer having a conductivity type opposite that of the first conductivity type, and a transparent electrode; the first to sixth semiconductor layers each comprising a silicon type non-single-crystal semiconductor and the light being incident on the side of the transparent electrode; wherein a dopant impurity determining the conductivity type of the first semiconductor layer is distributed therein so that the density of the impurity is lower on the side of the conductive substrate than on the side of the second semiconductor layer.

The present invention also provides a photovoltaic device comprising, in its layer configuration, a conductive substrate, a first semiconductor layer having a first conductivity type, a substantially intrinsic second semiconductor layer, a third semiconductor layer having a conductivity type opposite that of the first semiconductor, a fourth semiconductor layer having the first conductivity type, a substantially intrinsic fifth semiconductor layer, a sixth semiconductor layer having a conductivity type opposite that of the first conductivity type, a seventh semiconductor layer having the first conductivity type, a substantially intrinsic eighth semiconductor layer, a ninth semiconductor layer having a conductivity type opposite that of the first conductivity type, and a transparent electrode; the first to ninth semiconductor layers each comprising a silicon type non-single-crystal semiconductor and the light being incident on the side of the transparent electrode; wherein a dopant impurity determining the conductivity type of the first semiconductor layer is distributed therein so that the density of the impurity is lower on the side of the conductive substrate than on the side of the second semiconductor layer.

The present invention further provides a photovoltaic device comprising, in its layer configuration, a conductive substrate, a first semiconductor layer having a first conductivity type, a substantially intrinsic second semiconductor layer, a third semiconductor layer having a conductivity type opposite that of the first conductivity type, and a transparent electrode; the first to third semiconductor layers each comprising a silicon type non-single-crystal semiconductor and the light being incident on the side of the transparent electrode; wherein crystal grains constituting the first semiconductor layer are distributed therein so that the size of the crystal grains is smaller on the side of the conductive substrate than on the side of the second semiconductor layer.

The present invention still further provides a photovoltaic device comprising, in its layer configuration, a conductive substrate, a first semiconductor layer having a first conductivity type, a substantially intrinsic second semiconductor layer, a third semiconductor layer having a conductivity type opposite that of the first semiconductor, a fourth semiconductor layer having the first conductivity type, a substantially intrinsic fifth semiconductor layer, a sixth semiconductor layer having a conductivity type opposite that of the first conductivity type, and a transparent electrode; the first to sixth semiconductor layers each comprising a silicon type non-single-crystal semiconductor and the light being incident on the side of the transparent electrode; wherein crystal grains constituting the first semiconductor layer are distributed therein so that the size of the crystal grains is smaller on the side of the conductive substrate than on the side of the second semiconductor layer.

The present invention still further provides a photovoltaic device comprising, in its layer configuration, a conductive substrate, a first semiconductor layer having a first conductivity type, a substantially intrinsic second semiconductor layer, a third semiconductor layer having a conductivity type opposite that of the first semiconductor, a fourth semiconductor layer having the first conductivity type, a substantially intrinsic fifth semiconductor layer, a sixth semiconductor layer having a conductivity type opposite that of the first conductivity type, a seventh semiconductor layer having the first conductivity type, a substantially intrinsic eighth semiconductor layer, a ninth semiconductor layer having a conductivity type opposite that of the first conductivity type, and a transparent electrode; the first to ninth semiconductor layers each comprising a silicon type non-single-crystal semiconductor and the light being incident on the side of the transparent electrode; wherein crystal grains constituting the first semiconductor layer are distributed therein so that the size of the crystal grains is smaller on the side of the conductive substrate than on the side of the second semiconductor layer.

The present invention still further provides a photovoltaic device comprising, in its layer configuration, a conductive substrate, a first semiconductor layer having a first conductivity type, a substantially intrinsic second semiconductor layer, a third semiconductor layer having a conductivity type opposite that of the first conductivity type, and a transparent electrode; the first to third semiconductor layers each comprising a silicon type non-single-crystal semiconductor and the light being incident on the side of the transparent electrode; wherein a dopant impurity determining the conductivity type of the third semiconductor layer is distributed therein so that the density of the impurity is lower on the side of the transparent electrode than on the side of the second semiconductor layer.

The present invention still further provides a photovoltaic device comprising, in its layer configuration, a conductive substrate, a first semiconductor layer having a first conductivity type, a substantially intrinsic second semiconductor layer, a third semiconductor layer having a conductivity type opposite that of the first semiconductor, a fourth semiconductor layer having the first conductivity type, a substantially intrinsic fifth semiconductor layer, a sixth semiconductor layer having a conductivity type opposite that of the first conductivity type, and a transparent electrode; the first to sixth semiconductor layers each comprising a silicon type non-single-crystal semiconductor and the light being incident on the side of the transparent electrode; wherein a dopant impurity determining the conductivity type of the sixth semiconductor layer is distributed therein so that the density of the impurity is lower on the side of the transparent electrode than on the side of the fifth semiconductor layer.

The present invention still further provides a photovoltaic device comprising, in its layer configuration, a conductive substrate, a first semiconductor layer having a first conductivity type, a substantially intrinsic second semiconductor layer, a third semiconductor layer having a conductivity type opposite that of the first semiconductor, a fourth semiconductor layer having the first conductivity type, a substantially intrinsic fifth semiconductor layer, a sixth semiconductor layer having a conductivity type opposite that of the first conductivity type, a seventh semiconductor layer having the first conductivity type, a substantially intrinsic eighth semiconductor layer, a ninth semiconductor layer having a conductivity type opposite that of the first conductivity type, and a transparent electrode; the first to ninth semiconductor layers each comprising a silicon type non-single-crystal semiconductor and the light being incident on the side of the transparent electrode; wherein a dopant impurity determining the conductivity type of the ninth semiconductor layer is distributed therein so that the density of the impurity is lower on the side of the transparent electrode than on the side of the eighth semiconductor layer.

The present invention still further provides a photovoltaic device comprising, in its layer configuration, a conductive substrate, a first semiconductor layer having a first conductivity type, a substantially intrinsic second semiconductor layer, a third semiconductor layer having a conductivity type opposite that of the first conductivity type, and a transparent electrode; the first to third semiconductor layers each comprising a silicon type non-single-crystal semiconductor and the light being incident on the side of the transparent electrode; wherein crystal grains constituting the third semiconductor layer are distributed therein so that the size of the crystal grains is smaller on the side of the transparent electrode than on the side of the second semiconductor layer.

The present invention still further provides a photovoltaic device comprising, in its layer configuration, a conductive substrate, a first semiconductor layer having a first conductivity type, a substantially intrinsic second semiconductor layer, a third semiconductor layer having a conductivity type opposite that of the first semiconductor, a fourth semiconductor layer having the first conductivity type, a substantially intrinsic fifth semiconductor layer, a sixth semiconductor layer having a conductivity type opposite that of the first conductivity type, and a transparent electrode; the first to sixth semiconductor layers each comprising a silicon type non-single-crystal semiconductor and the light being incident on the side of the transparent electrode; wherein crystal grains constituting the sixth semiconductor layer are distributed therein so that the size of the crystal grains is smaller on the side of the transparent electrode than on the side of the fifth semiconductor layer.

The present invention still further provides a photovoltaic device comprising, in its layer configuration, a conductive substrate, a first semiconductor layer having a first conductivity type, a substantially intrinsic second semiconductor layer, a third semiconductor layer having a conductivity type opposite that of the first semiconductor, a fourth semiconductor layer having the first conductivity type, a substantially intrinsic fifth semiconductor layer, a sixth semiconductor layer having a conductivity type opposite that of the first conductivity type, a seventh semiconductor layer having the first conductivity type, a substantially intrinsic eighth semiconductor layer, a ninth semiconductor layer having a conductivity type opposite that of the first conductivity type, and a transparent electrode; the first to ninth semiconductor layers each comprising a silicon type non-single-crystal semiconductor and the light being incident on the side of the transparent electrode; wherein crystal grains constituting the ninth semiconductor layer are distributed therein so that the size of the crystal grains is smaller on the side of the transparent electrode than on the side of the eighth semiconductor layer.

The present invention still further provides a photovoltaic device comprising i) a semiconductor region having at least one set of semiconductor layers comprised of a first semiconductor layer having a first conductivity type, an intrinsic or substantially intrinsic second semiconductor layer and a third semiconductor layer having a conductivity type opposite that of the first conductivity type, the layers being formed in this order, and ii) first and second electrodes provided such that they interpose the semiconductor region; wherein the density of a dopant impurity determining the conductivity type of the first semiconductor layer in a set of semiconductor layers which is in contact with the first electrode is made lower on the side of the first electrode, or the grain size of crystals in the first semiconductor layer is made smaller on the side of the first electrode.

The object of the present invention can be achieved by, stated briefly, a photovoltaic device having a pair of electrodes and semiconductor layers provided between the electrodes and in which the density of a dopant impurity in a certain semiconductor layer is made lower, or the grain size of crystals in that layer is made smaller, in that layer on the side of any one of the electrodes.

Namely, in the present invention, the dopant impurity density is made lower on the side of one electrode. Thus, a high-resistance region is formed in the vicinity of the interface between the electrode and the semiconductor layer to thereby prevent excessive currents from flowing even when a short circuit locally occurs.

In another embodiment of the present invention, crystal grains are distributed in that layer so that the size of the crystal grains is smaller on the side of one electrode. Thus, a high-resistance region is formed in the vicinity of the interface between the semiconductor layer and the electrode to thereby prevent excessive currents from flowing even when a short circuit locally occurs.

Stated more specifically, the photovoltaic device has, e.g., i) a first electrode, ii) a semiconductor region having at least one set of semiconductor layers comprised of a first semiconductor layer having a first conductivity type, an intrinsic or substantially intrinsic second semiconductor layer and a third semiconductor layer having a conductivity type opposite that of the first conductivity type, the layers being formed in this order, and iii) a second electrode provided on the third semiconductor layer in a set of semiconductor layers at the outermost side of the semiconductor region, and a dopant impurity determining the conductivity type of the first semiconductor layer is distributed therein so that the density of the impurity is lower on the side of the first electrode, e.g., a conductive substrate. Thus, a high-resistance region can be formed in the first semiconductor layer in the vicinity of the interface with the conductive substrate, so that excessive short-circuit currents can be prevented from flowing even when a short circuit locally occurs in the semiconductor layers, without requiring an additional formation apparatus (semiconductor film-forming chambers), and photovoltaic devices having the same effect as those provided with the barrier layers previously stated can be obtained.

In another embodiment, having the above layer configuration, the crystal grains constituting the first semiconductor layer are distributed therein so that the size of the crystal grains is smaller on the side of the first electrode, e.g., a conductive substrate. Thus, a high-resistance region can be formed in the first semiconductor layer in the vicinity of the interface with the conductive substrate, so that excessive short-circuit currents can be prevented from flowing even when a short circuit locally occurs in the semiconductor layers, without requiring an additional formation apparatus (semiconductor film-forming chamber), and photovoltaic devices having the same effect as those provided with the barrier layers previously stated can be obtained.

Alternatively, in the present invention, a dopant impurity type imparting a conductivity to the third semiconductor layer in contact with the second electrode on the light-incident side, e.g., a transparent electrode, is distributed in the third semiconductor layer so that the density of the impurity is lower on the side of the transparent electrode than on the side of the second semiconductor layer. Thus, in the semiconductor layer in contact with the light-incident side transparent electrode, a high-resistance region can be formed in the vicinity of the interface with the transparent electrode, so that excessive short-circuit currents can be prevented from flowing even when a short circuit locally occurs in the semiconductor layers, without adding a formation apparatus (semiconductor film-forming chambers), and photovoltaic devices having the same effect as those provided with the barrier layers previously stated can be obtained.

In the present invention, the crystal grains constituting the third semiconductor layer in contact with the second electrode on the light-incident side, e.g., a transparent electrode, may also be distributed in the third semiconductor layer so that the size of the crystal grains is lower on the side of the transparent electrode than on the side of the second semiconductor layer. Thus, in the semiconductor layer in contact with the light-incident side transparent electrode, a high-resistance region can be formed in the vicinity of the interface with the transparent electrode, so that excessive short-circuit currents can be prevented from flowing even when a short circuit locally occurs in the semiconductor layers, without requiring an additional formation apparatus (semiconductor film-forming chambers), and photovoltaic devices having the same effect as those provided with the barrier layers previously stated can be obtained.

BRIEF DESCRIPTION OF THE DRAWINGS

FIGS. 1 to 6 are diagrammatic cross sections showing examples of the constitution of the photovoltaic device according to the present invention.

FIGS. 7 and 11 are diagrammatic cross sections of the constitution of photovoltaic devices, used to described the present invention.

DESCRIPTION OF THE PREFERRED EMBODIMENTS

Figure 8:
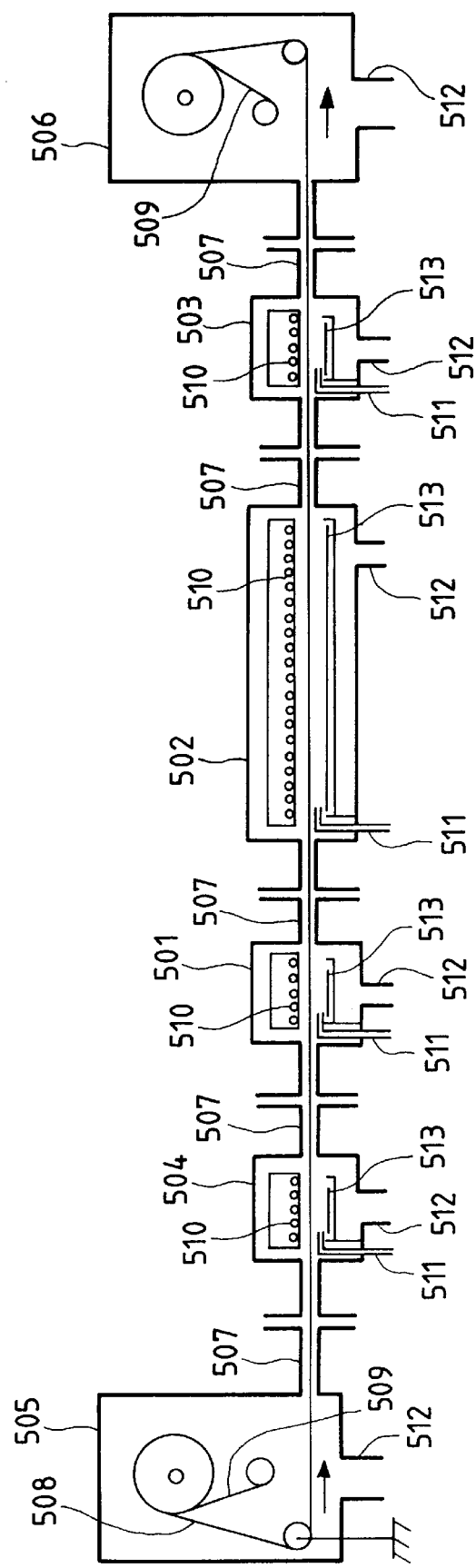
FIGS. 8 and 12 are diagrammatic cross sections for illustrating the construction of fabrication apparatus for producing the photovoltaic devices shown in FIGS. 7 and 11, respectively.

The constitution of the photovoltaic device of the present invention will be described below with reference to the accompanying drawings.

Single Cell Photovoltaic Device

Examples of the constitution of a single cell photovoltaic device (i.e., provided with a semiconductor region having one set of superposed semiconductor layers comprised of a first semiconductor layer, a second semiconductor layer and a third semiconductor layer) according to the present invention are shown in FIGS. 1 and 2 as diagrammatic cross-sectional views.

In FIGS. 1 and 2, reference numeral 101 denotes a conductive substrate serving as a first electrode; 102, a first semiconductor layer having a first conductivity type; 103, an intrinsic or substantially intrinsic second semiconductor layer; 104, a third semiconductor layer having a conductivity type opposite to that of the first conductivity type; 105, a transparent electrode serving as the second electrode; 106, a collector electrode; 107, incident light; and 108, an interface-adjacent region.

In FIGS. 1 and 2, the photovoltaic device comprises the conductive substrate 101 and an n- or p-type first semiconductor layer 102 provided thereon, the intrinsic or substantially intrinsic (i-type) second semiconductor layer 103, a p- or e-type third semiconductor layer 104 and the transparent electrode 105, which are superposingly formed in this order. The collector electrode 106 is provided on the transparent electrode 105, and the incident light 107 enters at the side of the transparent electrode 105.

In the device shown in FIG. 1, in its first semiconductor layer 102, the density of a dopant impurity determining the conductivity type of the first semiconductor layer 102 is lower on the side of the conductive substrate 101, i.e., in the interface-adjacent region 108, than on the side of the second semiconductor layer 103, or the grain size of crystals constituting the first semiconductor layer 102 is smaller on the side of the conductive substrate than on the side of the second semiconductor layer 103.

In the device shown in FIG. 2, in its third semiconductor layer 104, the density of an impurity determining the conductivity type of the third semiconductor layer 104 is lower on the side of the transparent electrode 105, i.e., in the interface-adjacent region 108, than on the side of the second semiconductor layer 103, or the grain size of crystals constituting the third semiconductor layer 104 is smaller on the side of the transparent electrode than on the side of the second semiconductor layer 103.

Double-layer Tandem Photovoltaic Device Subsequently, examples of the construction of devices having two sets of the semiconductor layers will be described with reference to diagrammatic cross-sectional views shown as FIGS. 3 and 4.

In FIGS. 3 and 4, the photovoltaic device of the present invention comprises a conductive substrate 201 serving as a first electrode, and a semiconductor region having a set of semiconductor layers provided thereon which has an n- or p-type first semiconductor layer 202, an intrinsic or substantially intrinsic (i-type) second semiconductor layer 203 and a p- or n-type third semiconductor layer 204 and further having on this set of semiconductor layers another set of semiconductor layers which has an n- or p-type fourth semiconductor layer 209, an intrinsic or substantially intrinsic (i-type) fifth semiconductor layer 210 and a p- or n-type sixth semiconductor layer 211, and a transparent electrode 205, which are superposingly formed in this order. A collector electrode 206 is provided on the transparent electrode 205 serving as the second electrode, and the incident light 207 enters at the side of the transparent electrode 205.

In the device shown in FIG. 3, in its first semiconductor layer 202, the density of a dopant impurity determining the conductivity type of the first semiconductor layer 202 is lower on the side of the conductive substrate 201, i.e., in the interface-adjacent region 208, than on the side of the second semiconductor layer 203, or the grain size of crystals constituting the first semiconductor layer 202 is smaller on the side of the conductive substrate than on the side of the second semiconductor layer 203.

In the device shown in FIG. 4, in its sixth semiconductor layer 211, the density of a dopant impurity determining the conductivity type of the sixth semiconductor layer 211 is lower on the side of the transparent electrode 205, i.e., in the interface-adjacent region 208, than on the side of the fifth semiconductor layer 210, or the grain size of crystals constituting the sixth semiconductor layer 211 is smaller on the side of the transparent electrode than on the side of the fifth semiconductor layer 210.

Three-layer Triple Cell Photovoltaic Device

Subsequently, examples of the construction of devices having three sets of the semiconductor layers will be described with reference to diagrammatic cross-sectional views shown as FIGS. 5 and 6.

In FIGS. 5 and 6, the photovoltaic device of the present invention comprises a conductive substrate 301 serving as a first electrode, and a semiconductor region having three sets of semiconductor layers provided thereon, comprised of a set of semiconductor layers which has an n- or p-type first semiconductor layer 302, an intrinsic or substantially intrinsic (i-type) second semiconductor layer 303 and a p- or n-type third semiconductor layer 304 in this order, a set of semiconductor layers which has an n- or p-type fourth semiconductor layer 309, an intrinsic or substantially intrinsic (i-type) fifth semiconductor layer 310 and a p- or n-type sixth semiconductor layer 311 in this order and a set of semiconductor layers which has an n- or p-type seventh semiconductor layer 312, an intrinsic or substantially intrinsic (i-type) eighth semiconductor layer 313 and a p- or n-type ninth semiconductor layer 314 in this order, and a transparent electrode 305 serving as a second electrode, which are superposingly formed in this order. A collector electrode 306 is provided on the transparent electrode 305, and the incident light 307 enters at the side of the transparent electrode 305.

In the device shown in FIG. 5, in its first semiconductor layer 302, the density of a dopant impurity determining the conductivity type of the first semiconductor layer 302 is lower on the side of the conductive substrate 301, i.e., in the interface-adjacent region 308, than on the side of the second semiconductor layer 303, or the grain size of crystals constituting the first semiconductor layer 302 is smaller on the side of the conductive substrate than on the side of the second semiconductor layer 303.

In the device shown in FIG. 6, in its ninth semiconductor layer 314, the density of a dopant impurity determining the conductivity type of the ninth semiconductor layer 314 is lower on the side of the transparent electrode 305, i.e., in the interface-adjacent region 308, than on the side of the eighth semiconductor layer 313, or the grain size of crystals constituting the ninth semiconductor layer 314 is smaller on the side of the transparent electrode than on the side of the fifth semiconductor layer 310.

The basis for how the present inventors invented the photovoltaic devices described above will be explained below.

With regard to the changing of dopant impurity density in an impurity-doped layer or the changing of crystal grain size in that layer, Japanese Patent Application Laid-open No. 63-220581 discloses the concept of making the dopant impurity density higher on the side of the interface with an electrode, and Japanese Patent Application Laid-open No. 63-258078 discloses making crystal grain size smaller in the region of the interface with an i-type semiconductor layer. These distributions, however, are in directions opposite to those of the present invention. When such distributions are provided, the interface-adjacent region in the impurity-doped layer on the side of the conductive substrate has a higher impurity density or greater crystallinity (larger crystal grain size) and hence is considered to have a lower resistance than other regions of that layer. Thus, they cannot achieve the aim of the present invention that the impurity-doped layer on the side nearest to the conductive substrate 101 is made to have higher resistance in its interface-adjacent region on the side of the conductive substrate. The fundamental semiconductor junctions (p-i junction, i-n junction, etc.) of the photovoltaic device are also affected.

The present invention has been accomplished after repeated studies based on the following obtained as a result of experiments made by the present inventors.

(1)

In a photovoltaic device of nip or pin structure formed of non-single-crystal silicon, the present inventors inserted between its conductive substrate and a semiconductor layer a semiconductor layer having a conductivity type opposite to that of the former semiconductor layer, the conductive substrate being on the side opposite to the light-incident side, thus forming a photovoltaic device of pnip or npin structure, and examined how the voltage-current characteristics at the opposite-direction junction between individual devices of the tandem multi-layered device change depending on the characteristics of an impurity-doped layer that forms the opposite-direction junction.

A diagrammatic cross section of the constitution of this photovoltaic device is shown in FIG. 7.

In FIG. 7, reference numeral 401 denotes the conductive substrate; 402, an n- or p-type semiconductor layer; 403, an intrinsic or substantially intrinsic (i-type) semiconductor layer; 404, a p- or n-type semiconductor layer; 405, a transparent electrode; 407, incident light; 408, a collector electrode; and 415, a semiconductor layer having a conductivity type opposite to that of the n- or p-type semiconductor layer 402.

The semiconductor layers of the photovoltaic device were formed using a fabrication apparatus of roll-to-roll type system as shown in FIG. 8.

In FIG. 8, reference numerals 504, 501, 502, and 503 respectively denote p-, n-, i-, and p-type or n-, p-, i-, and n-type layer film-forming chambers; 505 and 506, a feed chamber and a wind-up chamber, respectively, of a conductive belt substrate. Vacuum chambers of the respective film-forming chambers are connected through gas gates 507 in the narrow spaces of which a purging gas such as hydrogen is flowed to prevent gases in the respective film-forming chambers from being intermixed with one another. Reference numeral 508 denotes a belt substrate such as a stainless steel sheet, e.g., 0.13 mm thick and 36 cm wide. It is unwound from the substrate feed in chamber 505 and, while being continuously transported, passes through the four film-forming chambers 504, 501, 502, and 503 until it is taken up in the wind-up chamber 506, in the course of which multiple layers of non-single-crystal silicon semiconductors for photovoltaic devices having four-layer pnip or npin structure are formed on its surface.

Reference numeral 509 denotes a belt made of heat-resistant nonwoven fabric, which is simultaneously wound when the belt substrate is unwound (and vice versa) so that the surface of the belt substrate can be prevented from being scratched.

Each of the film-forming chambers 504, 501, 502, and 503 is provided with a heater 510 for heating the substrate to a predetermined temperature, a raw material gas feed pipe 511 through which raw material gases for forming semiconductor layers are introduced from a gas feeding means (not shown) into each film-forming chamber, a discharge pipe 512 through which the film-forming chamber is evacuated by an evacuation means (not shown) to control its interior at a predetermined pressure, and a discharge electrode 513 that supplies high-frequency power from a high-frequency power source (not shown) to the gases inside the film-forming chamber to cause glow discharge to take place between it and the substrate ground. In the film-forming chambers 504, 501, 502, and 503, p-, n-, i- and p-type or n-, p-, i- and n-type non-single-crystal silicon semiconductor layers are respectively deposited by plasma-assisted CVD (chemical vapor deposition).

Using the above semiconductor film forming apparatus constructed as shown in FIG. 8, the present inventors deposited non-single-crystal silicon multi-layer films of pnip structure on a substrate comprised of a cold-rolled stainless steel belt (SUS430BA) 0.13 mm thick and 36 cm wide, finished by bright heat treatment, having a highest-level surface smoothness among stainless steel sheets commonly available in a large quantity without any special mirror polishing of the surface. On the films thus formed, they superposingly formed an ITO transparent electrode by means of a known vacuum deposition apparatus, and, thereon, further screen-printed a silver paste to form a grid-shaped collector electrode 0.15 mm wide with 3 mm pitch. Thus, photovoltaic devices were produced.

Individual photovoltaic devices were 30 cm×30 cm in size, and a hundred photovoltaic devices (Sample 1) were produced at one time from a belt substrate about 50 m long.

In this case, the p-type semiconductor layer on the side nearest to the conductive substrate had a resistivity of $1 \times 10^4$ $\Omega$.cm and a layer thickness of 15 nm, and the n-type semiconductor layer on that layer had a resistivity of 1 $\Omega$.cm and a thickness of 20 nm. The i-type semiconductor layer had a layer thickness of 300 nm, and the p-type semiconductor layer on the light-incident side had a thickness of 10 nm.

As comparison samples (Sample 2), a hundred non-single-crystal silicon photovoltaic devices of nip structure were produced using the semiconductor film forming apparatus shown in FIG. 8, in the same manner except that the formation of the fourth semiconductor layer in the film-forming chamber 504 was not carried out.

The present inventors compared characteristics of these photovoltaic devices of Sample 1 and Sample 2 to obtain the following results.

Open-circuit voltages of the one hundred 30 cm×30 cm photovoltaic devices of nip structure (Sample 2) thus produced were measured under low-illuminance light obtained by passing artificial sunlight with an air mass (AM) of 1.5 and 100 mW/cm$^2$ through an ND filter with a transmittance of 1%, without any post-treatment for making short-circuited portions have high resistance. Compared with open-circuit voltages under low-illuminance light, measured on 1 cm×1 cm photovoltaic devices of the same nip structure (Sample 3) perfectly free of short-circuited portions due to pinholes and defects, separately prepared, the open-circuit voltages of Sample 2 were greatly lowered to about ⅛ on average. Voltage-current characteristics of the 30 cm×30 cm photovoltaic devices of nip structure (Sample 2) were examined in their dark state using a curve tracer. As a result, the voltage-current curve was seen to deviate from the voltage axis in the vicinity of O V, indicating that short-circuited portions locally occurred in the device. It was found that the open-circuit voltages were greatly lowered because generated electric currents flowed into the short-circuited portions which locally occurred and were greatly affected especially when the amount of incident light was small and the generated electric currents were small.

Also, open-circuit voltages of the one hundred 30 cm×30 cm photovoltaic devices of pnip structure thus produced (Sample 1) were measured under low-illuminance light (AM 1.5, 1 mW/cm$^2$). Compared with the open-circuit voltages under low-illuminance light, measured on separately prepared 1 cm×1 cm photovoltaic devices of nip structure (Sample 3) perfectly free of short-circuited portions due to pinholes and defects, the open-circuit voltages of Sample 1 were about ¾ on the average, i.e., the voltages were less lowered.

(2)

With respect to the phenomenon in (1) above, the present inventors considered whether in Sample 1 the p-type semiconductor layer further superposingly formed increased the total thickness of the semiconductor layers and the underlying substrate was more completely covered, so that the number of short-circuited portions decreased. In order to test this hypothesis, they produced two groups of one hundred photovoltaic devices of nip structure (Samples 4 and 5) formed of non-single-crystal silicon, in the same manner as in Sample 1 except that the layer thickness of the n-type semiconductor layer or i-type semiconductor layer superposingly formed was increased by 15 nm, which is the layer thickness of the p-type semiconductor layer provided at a lower position in Sample 1.

Open-circuit voltages of the one hundred 30 cm×30 cm photovoltaic devices of nip structure for each group (Samples 4 and 5) thus produced were measured under low-illuminance light (AM 1.5, 1 mW/cm$^2$).

However, compared with the open-circuit voltages under low-illuminance light, measured on separately prepared 1 cm×1 cm photovoltaic devices of nip structure (Sample 3) perfectly free of short-circuited portions due to pinholes and defects, the open-circuit voltages of both Samples 4 and 5 had lowered to about ⅛ on average.

From the foregoing experimental results, it was found that the reason why the adverse effect due to the local short-circuited portions was inhibited in the photovoltaic devices of pnip structure produced by the present inventors was not merely that the layer thickness of the semiconductor layers was made larger.

It was also clear that conditions of the semiconductor layer formation apparatus, the substrate used, etc. were not changed at all and these were not the causes.

(3)

The present inventors also considered whether the phenomenon in (1) above was caused by the fact that the semiconductor layer on the side of the conductive substrate had a p-type conductivity. Accordingly, they reversed the nip layer order of the n-, i-, and p-type semiconductor layers to pin without changing the thickness of each layer, and produced one hundred 30 cm×30 cm photovoltaic devices of pin structure (Sample 6). However, open-circuit voltages of Sample 6 devices under low-illuminance light were lowered to about ⅛ on average, compared with the open-circuit voltages in the above Sample 3. From these results, it was found that the semiconductor layer on the side of the conductive substrate having p-type conductivity was not the cause.

(4)

Then, the present inventors considered whether the above phenomenon was caused by the fact that the semiconductor layer in contact with the conductive substrate had a resistance ($\rho=1\times10^4$ Ω.cm) substantially higher than the resistance of the conductive substrate ($\rho=6\times10^{-5}$ Ω.cm) and that of the n-type semiconductor layer ($\rho=1$ Ω.cm). Accordingly, they changed the formation conditions of the semiconductor layer in contact with the conductive substrate, made the dopant impurity density higher without changing layer thickness and made the crystal grain size larger so that the p-type semiconductor layer had a resistivity equal to the resistivity of the overlying n-type semiconductor layer ($\rho=1$ Ω.cm). Thus, they produced one hundred 30 cm×30 cm photovoltaic devices of pnip structure (Sample 7).

However, compared with the open-circuit voltages under low-illuminance light, measured on separately prepared 1 cm×1 cm photovoltaic devices of nip structure (Sample 3) perfectly free of short-circuited portions due to pinholes and defects, the open-circuit voltages of Sample 7 had lowered to about ⅛ on average.

From these experimental results, it was found that the reason why the adverse effect due to the local short-circuited portions was controlled in the photovoltaic devices of pnip structure produced by the present inventors was that the semiconductor layer in contact with the conductive substrate had a resistance ($\rho=1\times10^4$ Ω.cm) substantially higher than the resistance of the conductive substrate ($\rho=6\times10^{-5}$ Ω.cm) and the resistance of the n-type semiconductor layer ($\rho=1$ Ω.cm).

That is, a layer having a high resistance, as long as it does not increase the series resistance of a photovoltaic device, is provided between the main body of the photovoltaic device of nip structure and its conductive substrate, and it is considered that this makes it possible to prevent excessive short-circuit currents from flowing in the local short-circuited portions, without lowering the electrical characteristics of the photovoltaic device.

(5)

Using the roll-to-roll film-forming apparatus as shown in FIG. 8, the present inventors formed films on a SUS430BA substrate to produce photovoltaic devices of nip structure of about 200 nm to about 400 nm in total semiconductor layer thickness, and observed them with an electron microscope. As a result, it was confirmed that short-circuited portions extending through the semiconductor layers had occurred at intervals of one spot on the average, per 10 cm×10 cm=100 cm$^2$, having an effective diameter of about 5 μm on the average. Thus, it is considered that, in the case of devices having a relatively large area of 30 cm×30 cm=900 cm$^2$, excessive short-circuit currents flowed at the short-circuited portions present at 9 spots on average, and hence the electrical characteristics of the photovoltaic devices were greatly reduced.

However, in the photovoltaic device of the present invention, a high-resistance semiconductor layer having a resistivity of $1\times10^4$ Ω.cm and a layer thickness of 15 nm is uniformly superposingly formed on and in contact with the conductive substrate, and hence a resistance of 7.5 kΩ per spot of the short-circuited portions was produced and the electric currents flowing in the short-circuited portions were substantially inhibited, so that the characteristics of the 30 cm×30 cm photovoltaic devices were substantially lowered. The result can be explained in this way.

(6)

As long as the pn interface is in a state of a sufficiently ohmic junction when the semiconductor layer in contact with the conductive substrate has a resistivity of $\rho=1\times10^4$ Ω.cm and a layer thickness of 15 nm, the increase in series resistance that is due to the insertion of that layer is as small as 0.015 Ω.cm$^2$, and is almost negligible compared with photovoltaic devices having series resistance of several to several tens of Ω.cm$^2$.

According to the details described in the above (1) to (6), the present inventors have discovered that excessive short-circuit currents can be prevented from flowing even when locally short-circuited portions occur, by a method in which a semiconductor layer having a conductivity type opposite to that of an impurity-doped layer on the side nearest to the substrate and having a higher resistance than the resistance of the conductive substrate and the resistance of the layer on the side nearest to the substrate of the photovoltaic device, is provided in contact with the conductive substrate on the side opposite to the light-incident side of the photovoltaic device.

In this method, compared with conventional methods, the same semiconductor material as used for semiconductor films of the main body of the photovoltaic device is used in the layer serving as a resistance layer, and hence the resistivity can be controlled with ease in accordance with dopant impurity density and crystallinity (crystal grain size). This method is also advantageous in that a layer with a very small thickness of 20 nm or less can be uniformly spread over the semiconductor films of the main body of the photovoltaic device even if the layer is not formed in a large thickness using a transparent material.

However, a semiconductor layer having a conductivity type opposite to that of the impurity-doped layer on the side nearest to the substrate, of the main body of the photovoltaic device, must be additionally formed. Hence, in order to produce devices having such constitution without reversely transporting the substrate in what is called the three-chamber separated type film-forming apparatus provided with film-forming chambers exclusively used for the n-, i- and p-type semiconductor layers, respectively, and through which the substrate is successively transported, it has been necessary to add one more film-forming chamber for the p-type semiconductor layer in addition to the film-forming chambers for the n-, i- and p-type semiconductor layers.

Also in the roll-to-roll type film-forming apparatus, it has been necessary to add one more film-forming chamber via a gas gate so that it can have the apparatus construction as shown in FIG. 8, because the impurity-doped layer on the side nearest to the substrate, has a conductivity type different from that of the underlying high-resistance semiconductor layer. Hence, this method has not solved the problem that an additional formation device is required to form the additional layer and the fabrication process becomes complicated, which has been a problem in the techniques conventionally used.

(7)

The present invention has been accomplished as a result of studies further made by the present inventors in order to solve the problem described in (6) above.

More specifically, when the impurity-doped layer on the side nearest to the substrate is formed, the dopant impurity density is made lower in the region adjacent to the interface with the conductive substrate (the interface-adjacent region), or the crystallinity (crystal grain size) in the interface-adjacent region is made smaller, to form a high-resistance region in the vicinity of the interface with the conductive substrate.

In this way, the resistance is varied in one impurity-doped layer so that a high-resistance region is provided in the region in contact with the conductive substrate. Hence, the photovoltaic device of the present invention makes it possible to prevent excessive short-circuit currents from flowing even when short-circuited portions locally occur in the semiconductor layers, without adding an additional formation apparatus (semiconductor film-forming chamber).

In the following, conditions for forming "the impurity-doped layer on the side nearest to the substrate", referred to in the present invention will be described in greater detail.

In the photovoltaic device of the present invention, the region in contact with the interface with the conductive substrate, formed in the impurity-doped layer on the side nearest to the substrate, may preferably have a thickness d (nm) in the range of $2<d<200$.

In the photovoltaic device of the present invention, the preferable range of thickness d (nm) of the region in contact with the interface with the conductive substrate, formed in the impurity-doped layer on the side nearest to the substrate, is determined in view of the conditions that no photoelectric current is generated, the generated electric current is prevented from decreasing because of a decrease in reflected light from the substrate, caused by providing a layer which is not transparent, and the high-resistance region is uniformly spread over the whole device region. That is, if the region has a thickness smaller than 2 nm, it is difficult for the high-resistance region to cover the whole surface. If it has a thickness larger than 200 nm, the thickness of the region becomes substantially the same as the substantially intrinsic semiconductor layer to cause a decrease in reflected light from the substrate, resulting in a great decrease in output current of the device.

In the photovoltaic device of the present invention, the region in contact with the interface with the conductive substrate, formed in the impurity-doped layer on the side nearest to the substrate, may preferably have a resistivity $\rho(\Omega.cm)$ of $10^2<\rho<10^5$.

The resistivity $\rho(\Omega.cm)$ of the region in contact with the conductive substrate in the photovoltaic device of the present invention is within such a preferable range such that, within the above preferable range of thickness d (nm) of the region, the region has a resistance high enough to prevent excessive short-circuit currents from flowing even when locally short-circuited portions occur, and the resistance in the layer thickness direction of the region does not increase the series resistance of the photovoltaic device.

Using as the substrate the cold-rolled stainless steel belt (SUS430BA) finished by bright heat treatment, having a highest-level surface smoothness among stainless steel sheets commonly available, the present inventors produced photovoltaic devices formed of silicon type non-single-crystal semiconductors by use of the roll-to-roll film-forming apparatus, where the short-circuited portions extending through the semiconductor layers occurred at intervals of one spot on average and one hundred spots at maximum, per 10 cm×10 cm=100 cm$^2$, having an effective diameter of about 5 μm on average. Under such conditions, the resistivity $\rho(\Omega.cm)$ of that region was controlled to a value of $\rho>10^2$, so that, even when the high-resistance region had a thickness of 2 nm, which is the smallest within the preferable range, the resistance at the short-circuited portions per 1 cm$^2$ of the photovoltaic device was controllably larger than $1\times10^3\Omega$, which is a boundary level at which device characteristics abruptly lower.

The resistivity $\rho(\Omega.cm)$ of the high-resistance region in contact with the conductive substrate was also controlled to be a value of $\rho<10^5$, so that, even when the high-resistance region had a thickness of 200 nm, which is the largest within the preferable range, the increase in the series resistance of the photovoltaic device was controllably smaller than 2 $\Omega.cm^2$, at which device characteristics begin to lower.

Figure 9A:
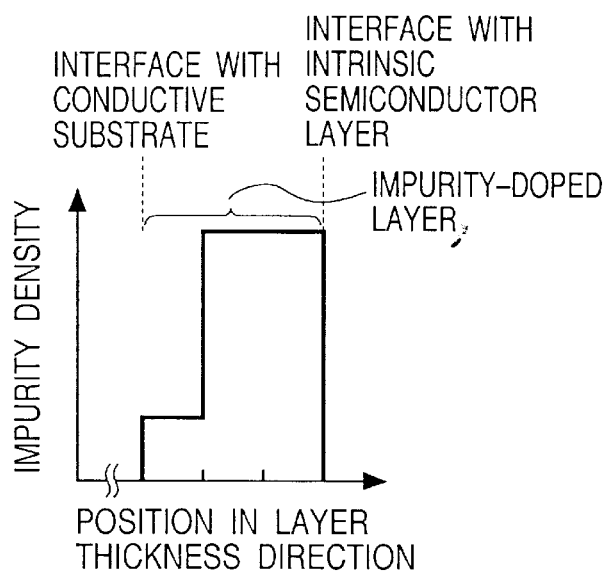
FIGS. 9A to 9C and FIGS. 13A to 13C are graphic representations for illustrating examples of distribution of dopant impurity density.
Figure 9B:
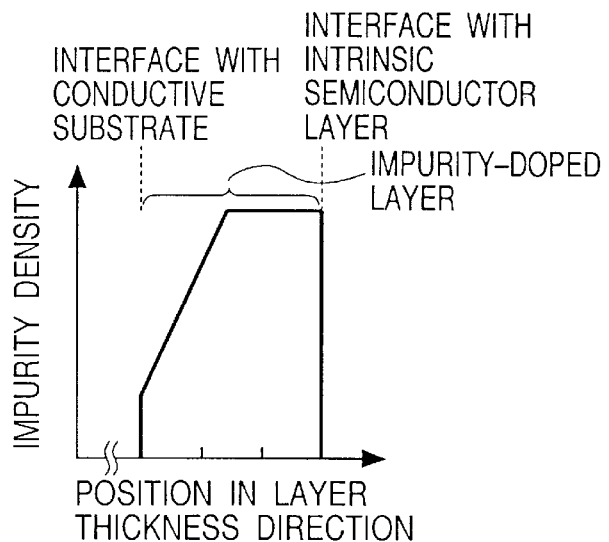
Figure 9C:
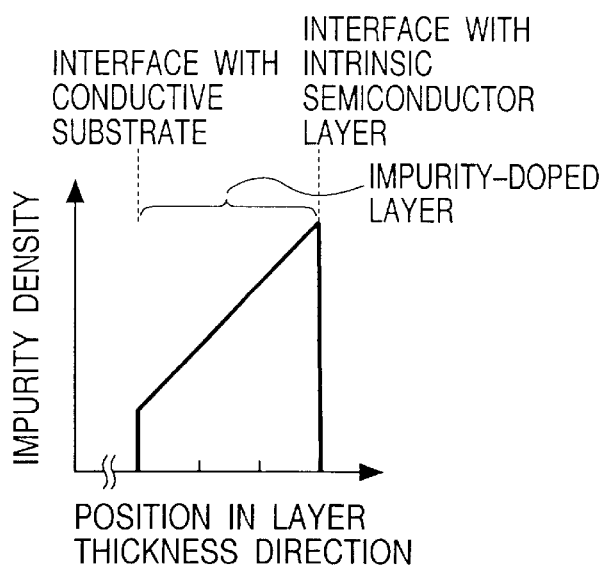

In the photovoltaic device of the present invention, in the case where a dopant impurity determining the conductivity type of the impurity-doped layer in contact with the conductive substrate is distributed therein so that the density of the impurity is lower on the side of the interface with the conductive substrate, the form of distribution of the impurity density may include, e.g., the forms as shown in FIGS. 9A to 9C. The impurity may be distributed in various forms so long as the impurity density is controlled within the predetermined lower range in the region adjacent to the interface of the conductive substrate and the above conditions of $\rho$ and d are fulfilled.

Such distribution of impurity density in the layer thickness direction can be obtained by, e.g., varying the feed proportion of silicon and dopant impurity at the time of deposition of the impurity-doped layer.

Impurities used for valence electron control of the silicon type non-single-crystal semiconductors may include, as those which impart p-type conductivity, the elements of Group 3B of the periodic table as exemplified by B, Al, Ga, In, and Tl, and, as those which impart n-type conductivity, the elements of Group 5B of the periodic table as exemplified by N, P, As, Sb, and Bi. In particular, B, Ga, P, and Sb are preferred. As substances for introducing such impurity elements, those which are gaseous at normal temperature and normal pressure or readily gasifiable at least under film-forming conditions may be employed when, e.g., the silicon type non-single-crystal semiconductors are formed by plasma-assisted CVD. Such substances for introducing impurities may specifically include $PH_3$, $P_2H_4$, $PF_3$, $PCl_3$, $AsH_3$, $AsF_3$, $AsF_5$, $AsCl_3$, $SbH_3$, $SbF_5$, $BiH_3$, $BF_3$, $BCl_3$, $BBr_3$, $B_2H_6$, $B_4H_4$, $B_5H_9$, $B_5H_{11}$, $B_6H_{10}$, $B_6H_{12}$, $AlCl_3$, $B(CH_3)_3$, $Al(CH_3)_3$, $Ga(CH_3)_3$, and $As(CH_3)_3$. These compounds containing impurity elements may each be used alone or in combination of two or more kinds.

Figure 10A:
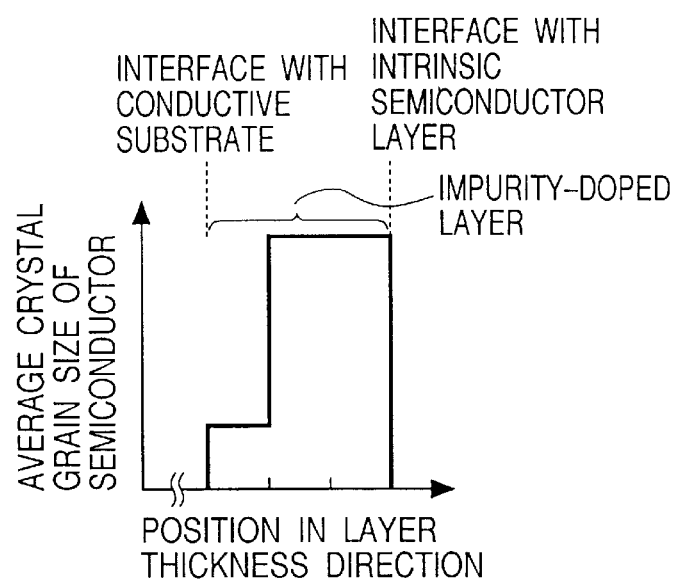
FIGS. 10A to 10C and FIGS. 14A to 14C are graphic representations for illustrating examples of distribution of crystal grain size.
Figure 10B:
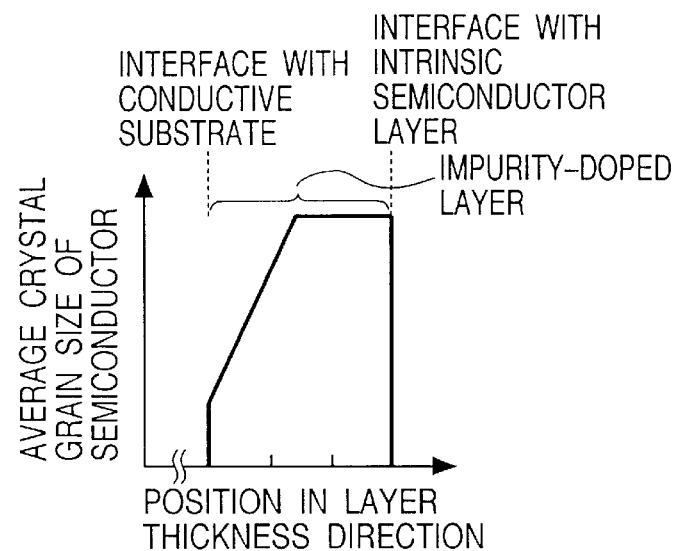
Figure 10C:
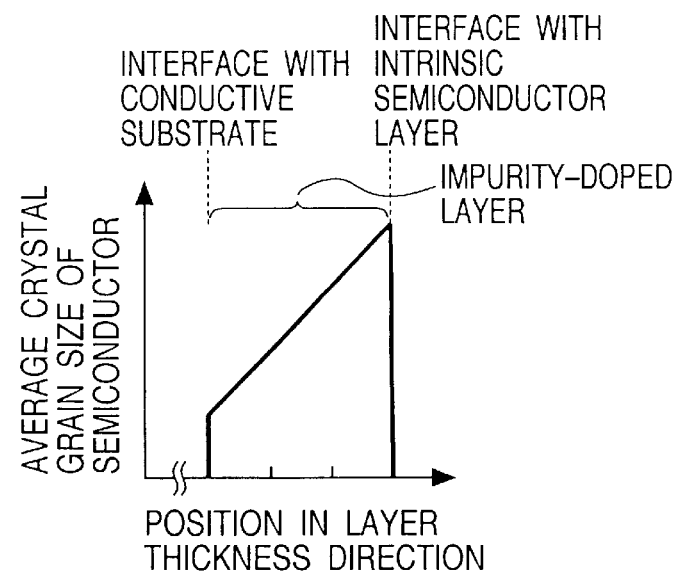

In the photovoltaic device of the present invention, in the case where the crystal grains of silicon in the impurity-doped layer in contact with the conductive substrate are distributed in that layer such that the size of the crystal grains is lower on the side of the interface with the conductive substrate, the form of distribution of the impurity density may include, e.g., the forms as shown in FIGS. 10A to 10C.

The crystal grain size referred to in the present invention is the size of a silicon crystal grain observed with a cross-sectional TEM (transmission electron microscope), which size is represented as the diameter of a sphere having the volume of the crystal grain. When the crystal grain has the shape of a column having a height in the layer thickness direction, the crystal grain size at a certain position in the layer thickness direction is defined as the diameter of a circle having the cross-sectional area at this position of this column-like crystal.

The non-single-crystal silicon referred to in the present invention means silicon having polycrystalline to perfectly amorphous structure. Compared with what is called amorphous in a narrow sense, containing almost no microcrystalline phase and having an average crystal grain size of about 2 nm or smaller, what is called microcrystals, containing many microcrystalline phases and a little amorphous phases and having an average crystal grain size of about 2 nm or larger, are known to make the resistivity lower by three to four orders. Accordingly, the region adjacent to the interface with the conductive substrate can be made to have a higher resistivity by making the crystal grain size smaller in the non-single-crystal silicon in the vicinity of the interface with the conductive substrate.

Such distribution of crystal grain size in the layer thickness direction can be obtained by, e.g., when the impurity-doped layer is deposited by plasma-assisted CVD, changing the conditions such as discharge power, dilution with hydrogen and deposition temperature that affect the crystallinity of deposited films. In the plasma-assisted CVD, as methods for enlarging the crystal grain size of non-single-crystal silicon, methods are known in which the discharge power is made greater with respect to raw material gas flow rate or the dilution with hydrogen is made higher with respect to the raw material gas. The crystal grain size in the region adjacent to the interface with the conductive substrate can be made smaller by making the discharge power smaller in the vicinity of the interface or by making the dilution with hydrogen lower.

Making crystal grain size smaller in the impurity-doped layer in the region adjacent to the interface with the conductive substrate and making the dopant impurity density lower in that region may be carried out alone or in combination. Both the crystal grain size and the dopant impurity density may be varied in the impurity-doped layer so as to be smaller on the side of the interface with the conductive substrate. In such an instance, the form of distribution of crystal grain size and the form of distribution of impurity density need not be identical. For example, the crystal grain size may be distributed stepwise with an abrupt change in the middle of the distribution and the impurity density may be distributed slopewise with a continuous change.

The non-single-crystal silicon is known to tend to have a large crystal grain size when it contains P as a dopant impurity element and to tend to have a small crystal grain size when it contains B as a dopant impurity element. Hence, when B is used as a dopant impurity element and the impurity density is made lower in the impurity-doped layer in its region adjacent to the interface with the conductive substrate, there is a possibility that the crystal grain size becomes abruptly larger as a result of a decrease in the B content to make the region have a low resistance opposite to what is intended. In order to avoid this possibility, it is necessary not to use film-forming conditions that may cause an abrupt change of what is called the amorphous state in a narrow sense into what is called the microcrystalline state, and to set film-forming conditions so that a decrease in the B content does not cause an abrupt change in crystal structure.

(8)

In a photovoltaic device of nip or pin structure formed of non-single-crystal silicon, the present inventors also inserted between the transparent electrode on the light-incident side and a semiconductor layer an additional semiconductor layer having a conductivity type opposite to that of the former semiconductor layer, to prepare a photovoltaic device of nipn or pinp structure, and examined how the voltage-current characteristics at the opposite-direction junction between individual devices of the tandem multi-layered device change depending on the characteristics of an impurity-doped layer that forms the opposite-direction junction.

A diagrammatic cross section view of the constitution of this photovoltaic device is shown in FIG. 11.

In FIG. 11, reference numeral 1401 denotes a conductive substrate; 1402, an n- or p-type semiconductor layer; 1403, an intrinsic or substantially intrinsic (i-type) semiconductor layer; 1404, a p- or n-type semiconductor layer; 1405, the transparent electrode; 1407, incident light; 1408, a collector electrode; and 1415, a semiconductor layer having a conductivity type opposite to that of the n- or p-type semiconductor layer 1404.

Figure 12:
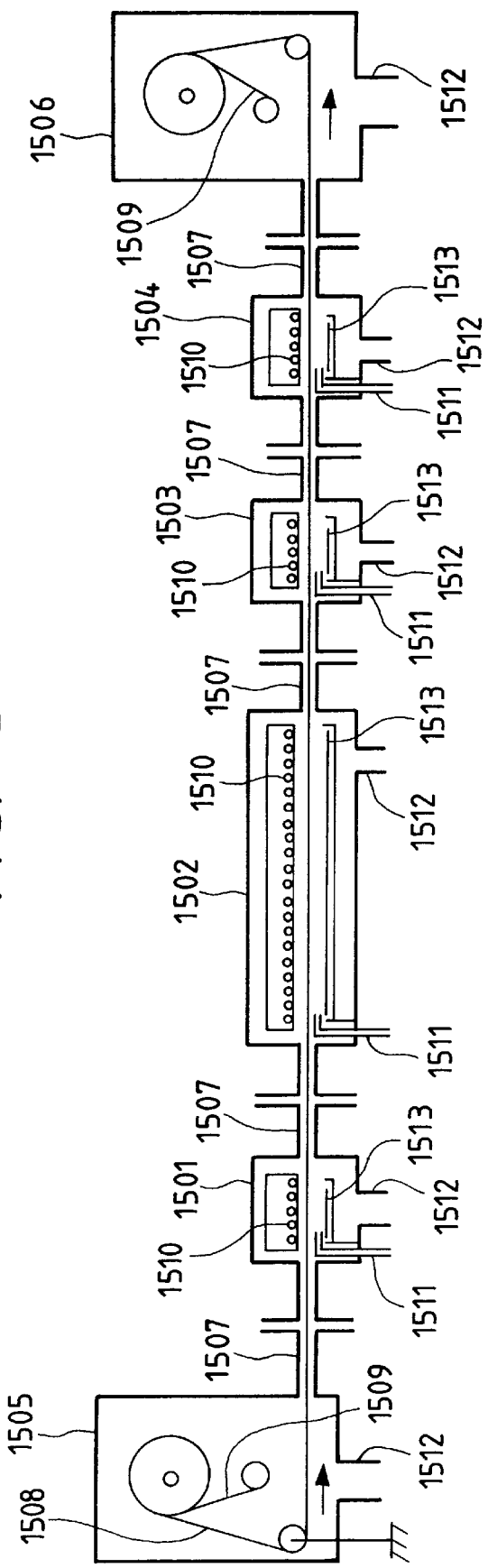

The semiconductor layers of the photovoltaic device were formed using a fabrication apparatus of what is called a roll-to-roll system as shown in FIG. 12.

In FIG. 12, reference numerals 1501, 1502, 1503, and 1504 respectively denote n-, i-, p-, and n-type or p-, i-, n- and p-type layer film-forming chambers; 1505 and 1506, a feed chamber and a wind-up chamber, respectively, of a conductive belt substrate. Vacuum chambers of the respective film-forming chambers are connected through gas gates 1507 in the narrow spaces of which a purge gas such as hydrogen is flowed to prevent gases in the respective film-forming chambers from being intermixed with one another. Reference numeral 1508 denotes a belt substrate such as a stainless steel sheet, e.g., 0.13 mm thick and 36 cm wide. It is wound off from a bobbin in the substrate feed chamber 1505 and, while being continuously transported, passes through the four film-forming chambers 1501, 1502, 1503, and 1504 until it is taken up on a bobbin in the wind-up chamber 1506, in the course of which non-single-crystal silicon semiconductor multiple layers for photovoltaic devices having four-layer nipn or pinp structure are formed on its surface.

Reference numeral 1509 denotes a belt made of heat-resistant nonwoven fabric, which is simultaneously wound when the belt substrate is unwound (and vice versa) so that the surface of the belt substrate can be prevented from being scratched.

Each of the film-forming chambers 1501, 1502, 1503, and 1504 is provided with a heater 1510 for heating the substrate to a predetermined temperature, a raw material gas feed pipe 1511 through which raw material gases for forming semiconductor layers are introduced from a gas feeding means (not shown) into each film-forming chamber, a discharge pipe 1512 through which the film-forming chamber is evacuated by an evacuation means (not shown) to control its interior at a predetermined pressure, and a discharge electrode 1513 that supplies high-frequency power from a high-frequency power source (not shown) to the gases inside the film-forming chamber to cause glow discharge to take place between it and the grounded substrate. In the film-forming chambers 1501, 1502, 1503, and 1504, n-, i-, p- and n-type or p-, i-, n- and p-type non-single-crystal silicon semiconductor layers are respectively deposited by plasma-assisted CVD (chemical vapor deposition).

Using the above semiconductor film forming apparatus constructed as shown in FIG. 12, the present inventors deposited non-single-crystal silicon multi-layer films of nipn structure on a substrate comprised of a cold-rolled stainless steel belt (SUS430BA) 0.13 mm thick and 36 cm wide, finished by bright heat treatment, having the highest-level surface smoothness among stainless steel sheets commonly available in a large quantity without any special mirror polishing of the surface. On the films thus formed, they superposingly formed an ITO transparent electrode by means of a known vacuum deposition apparatus, and, thereon, further screen-printed a silver paste to form a collector electrode grid with fingers 0.15 mm wide and with 3 mm pitch. Thus, photovoltaic devices were produced.

Individual photovoltaic devices were 30 cm×30 cm in size, and a hundred photovoltaic devices (Sample 8) were produced at one time from a belt substrate about 50 m long.

In this case, the uppermost n-type semiconductor layer in contact with the ITO transparent electrode had a resistivity of $1 \times 10^4$ $\Omega \cdot$cm and a thickness of 15 nm, and the p-type semiconductor layer beneath that layer had a resistivity of 1 $\Omega \cdot$cm and a thickness of 10 nm. The i-type semiconductor layer had a thickness of 300 nm, and the n-type semiconductor layer on the side of the substrate had a thickness of 30 nm.

As comparative samples (Sample 9), one hundred non-single-crystal silicon photovoltaic devices of nip structure were produced using the semiconductor film forming apparatus shown in FIG. 12, in the same manner except that the formation of the fourth (uppermost) semiconductor layer in the film-forming chamber 504 was not carried out.

The present inventors compared characteristics of these photovoltaic devices of Sample 8 and Sample 9 and obtained the following results.

Open-circuit voltages of the one hundred 30 cm×30 cm photovoltaic devices of nip structure (Sample 9) thus produced were measured under low-illuminance light obtained by passing artificial sunlight with an air mass (AM) of 1.5 and 100 mW/cm² through an ND filter with a transmittance of 1%, without any post-treatment for making short-circuited portions have high resistance. Compared with open-circuit voltages under low-illuminance light, measured on 1 cm×1 cm separately prepared photovoltaic devices of the same nip structure (Sample 10) perfectly free of short-circuited portions due to pinholes and defects, the open-circuit voltages of Sample 9 were greatly lowered to about ⅛ on average.

For the 30 cm×30 cm photovoltaic devices of nip structure (Sample 9), voltage-current characteristics in their dark state were examined using a curve tracer. As a result, the voltage-current curve was seen to deviate from the voltage axis in the vicinity of O V, indicating that short-circuited portions locally occurred in the device. It was found that the open-circuit voltages were greatly lowered because the generated current flowed into the locally occurred short-circuited portions and were greatly affected especially when the amount of incident light was small and the generated current was small.

Meanwhile, open-circuit voltages of the one hundred 30 cm×30 cm photovoltaic devices of nipn structure (Sample 8) thus produced were measured under low-illuminance light (AM 1.5, 1 mW/cm²). Compared with the open-circuit voltages under low-illuminance light, measured on separately prepared 1 cm×1 cm photovoltaic devices of nip structure (Sample 10) perfectly free of short-circuited portions due to pinholes and defects, the open-circuit voltages of Sample 8 were about ⅞ on the average, i.e. the voltages were lowered only a little amount.

(9)

With respect to the phenomenon in (8) above, the present inventors considered whether in Sample 8 the n-type semiconductor layer further superposingly formed made the total thickness of the semiconductor layers larger and the underlying substrate more completely covered, so that the amount of short-circuited portions decreased. To test this hypothesis, they produced two groups of one hundred photovoltaic devices of nip structure (Samples 11 and 12) formed of non-single-crystal silicon, in the same manner as in Sample 8 except that the thickness of the p-type semiconductor layer or i-type semiconductor layer was increased by 15 nm, which is the thickness of the n-type semiconductor layer superposingly formed on it.

Under low-illuminance light (AM 1.5, 1 mW/cm²), open-circuit voltages of the one hundred 30 cm×30 cm photovoltaic devices of nip structure for each group (Samples 11 and 12) thus produced were measured.

However, compared with the open-circuit voltages under low-illuminance light, measured on separately prepared 1 cm×1 cm photovoltaic devices of nip structure (Sample 10) perfectly free of short-circuited portions due to pinholes and defects, the open-circuit voltages of both Samples 11 and 12 had lowered to about ⅛ on average.

From the foregoing experimental results, it was found that the reason why the adverse effect due to the locally short-circuited portions was inhibited in the photovoltaic devices of nipn structure produced by the present inventors was not merely that the layer thickness of the semiconductor layers was made larger.

It was also clear that the conditions of the semiconductor layer formation apparatus, the substrate used, etc. were not changed at all and thus these were not the causes.

(10)

The present inventors also considered whether the phenomenon in (8) above was caused by the fact that the semiconductor layer in contact with the ITO transparent electrode had n-type conductivity. Accordingly, they reversed the nip layer order of the n-, i- and p-type semiconductor layers to pin without changing the thickness of each layer, and produced one hundred 30 cm×30 cm photovoltaic devices of pin structure (Sample 13). However, the open-circuit voltages of Sample 13 devices under low-illuminance light lowered to about ⅛ on average, compared with the open-circuit voltages in the above Sample 10. From these results, it was found that the semiconductor layer in contact with the ITO transparent electrode having an n-type conductivity was not the cause.

(11)

Then, the present inventors considered whether the above phenomenon was caused by the fact that the semiconductor layer in contact with the ITO transparent electrode had a resistance ($\rho=1\times10^4$ $\Omega$.cm) substantially higher than the resistance of the ITO transparent electrode ($\rho=7\times10^{-4}$ $\Omega$.cm) and the resistance of the underlying p-type semiconductor layer ($\rho=1$ $\Omega$.cm). Accordingly, they changed conditions for formation of the semiconductor layer in contact with the ITO transparent electrode, making the dopant impurity density higher without changing its thickness and made the crystal grain size larger so that the n-type semiconductor layer had a resistivity equal to the resistivity of the underlying p-type semiconductor layer ($\rho=1$ $\Omega$.cm). Thus, they produced one hundred 30 cm×30 cm photovoltaic devices of nipn structure (Sample 14).

However, compared with the open-circuit voltages under low-illuminance light, measured on separately prepared 1 cm×1 cm photovoltaic devices of nip structure (Sample 10) perfectly free of short-circuited portions due to pinholes and defects, the open-circuit voltages of Sample 14 were lowered to about ⅛ on average.

From these experimental results, it was found that the reason why the adverse effect due to the locally short-circuited portions was inhibited in the photovoltaic devices of nipn structure produced by the present inventors was that the semiconductor layer in contact with the ITO transparent electrode had a resistance ($\rho=1\times10^4$ $\Omega$.cm) substantially higher than the resistance of the ITO transparent electrode ($\rho=7\times10^{-4}$ $\Omega$.cm) and the resistance of the underlying p-type semiconductor layer ($\rho=1$ $\Omega$.cm).

That is, a layer having a high resistance, as long as it causes no increase in the series resistance of a photovoltaic device, is provided between the main body of the photovoltaic device of nip structure and its transparent electrode, and makes it possible to prevent excessive short-circuit currents from flowing in the locally short-circuited portions, without a lowering of the characteristics of the photovoltaic device.

(12)

Using the roll-to-roll film-forming apparatus as shown in FIG. 12, the present inventors formed films on a SUS430BA substrate to produce photovoltaic devices of nip structure of about 200 nm to about 400 nm in total semiconductor layer thickness, and observed them with an electron microscope. As a result, it was confirmed that short-circuited portions extending through the semiconductor layers had occurred at intervals of one spot on average, per 10 cm×10 cm=100 cm², having an effective diameter of about 5 $\mu$m on average. Thus, in this case also, it is considered that, in the case of devices having a relatively large area of 30 cm×30 cm=900 cm², excessive short-circuit currents flowed at the short-circuited portions present at 9 spots on average, and hence the electrical characteristics of the photovoltaic devices were greatly lowered.

However, in the photovoltaic device of the present invention, a high-resistance semiconductor layer having a resistivity of $1\times10^4$ $\Omega$.cm and a thickness of 15 nm is uniformly superposingly formed in contact with the ITO transparent electrode, and hence a resistance of 7.5 k$\Omega$ per each spot of the short-circuited portions was produced and the electric currents flowing in the short-circuited portions were reasonably controlled, so that the characteristics of the 30 cm×30 cm photovoltaic devices were practically not lowered. The effect can be explained in this way.

(13)

As long as the pn interface is in a state of sufficiently ohmic junction when the semiconductor layer in contact with the ITO transparent electrode has a resistivity of $\rho=1\times10^4$ $\Omega$.cm and a layer thickness of 15 nm, the increase in series resistance due to the insertion of that layer is as small as 0.015 $\Omega$.cm², and is almost negligible compared with the series resistance of photovoltaic devices of several to several tens of $\Omega$.cm².

According to the details described in (8) to (13) above, the present inventors have discovered that excessive short-circuit currents can be prevented from flowing even when locally short-circuited portions occur, by a method in which a semiconductor layer having a conductivity type opposite that of an impurity-doped layer on the outermost surface side of a photovoltaic device and having a higher resistance than the resistance of the transparent electrode and the impurity-doped layer on the outermost surface side of the photovoltaic device is provided in contact with the transparent electrode on the light-incident side of the photovoltaic device.

In this method, compared with conventional methods, the same materials for semiconductor films of the main body of the photovoltaic device are used in the layer serving as a resistance layer, and hence the resistivity can be controlled with ease in accordance with dopant impurity density and crystallinity (crystal grain size). This method is also advantageous in that a layer with a very small thickness of 20 nm or less can be uniformly spread over the semiconductor films of the main body of the photovoltaic device even if the layer is not formed in a large thickness using a transparent material.

However, in this case also, a semiconductor layer having a conductivity type opposite that of the impurity-doped layer on the outermost surface side of the main body of the photovoltaic device must be additionally formed. Hence, in order to produce photovoltaic devices having such a constitution without reversely transporting the substrate in what is called the three-chamber separated type film-forming apparatus provided with film-forming chambers exclusively used for the n-, i- and p-type semiconductor layers, respectively, and through which the substrate is successively transported, it is necessary to add one more film-forming chamber for the n-type semiconductor layer in addition to the film-forming chambers for the n-, i-, and p-type semiconductor layers.

Also in the roll-to-roll type film-forming apparatus, it is necessary to add one more film-forming chamber through a gas gate so that it can have the construction as shown in FIG. 8, because the impurity-doped layer on the outermost surface side of the main body of the photovoltaic device has a conductivity type different from that of the overlying high-resistance semiconductor layer. Hence, this method has not solved the problem that an additional formation device is required to form an additional layer and the fabrication process become complicated, which has been a problem to be solved in the techniques conventionally used.

(14)

The present invention has been accomplished as a result of further studies made by the present inventors in order to solve the problem shown in the (13) above.

More specifically, when the impurity-doped layer on the outermost surface side of the main body of the photovoltaic device is formed, the impurity density is made lower in the region adjacent to the interface with the transparent electrode (the interface-adjacent region) than in the other regions of the layer, or the crystallinity (crystal grain size) in that region is made smaller than in other regions of the layer, to form a high-resistance region in the vicinity of the interface between that layer and the transparent electrode.

In this way, the resistance of the semiconductor is varied in one impurity-doped layer so that a high-resistance region is provided in the region in contact with the transparent electrode. Hence, the photovoltaic device of the present invention makes it possible to prevent excessive short-circuit currents from flowing even when locally short-circuited portions occur in the semiconductor layers, without adding an additional formation apparatus (semiconductor film-forming chamber).

In the following, conditions for forming "the impurity-doped layer on the outermost surface side of the main body of the photovoltaic device" referred to in the present invention will be described in greater detail.

In the photovoltaic device of the present invention, the region in contact with the transparent electrode preferably has a thickness d (nm) in the range of 2<d<20.

In the photovoltaic device of the present invention, the thickness d (nm) of the region in contact with the transparent electrode has its preferable range determined in view of the conditions that no photoelectric current is generated, generated current is prevented from decreasing because of a decrease in reflected light from the substrate, caused by providing on the light-incident side a layer which is not transparent, and the high-resistance region uniformly covers the whole device region. That is, if the region has a thickness smaller than 2 nm, it is difficult for the high-resistance region to cover the whole device region. If it has a thickness larger than 20 nm, the absorption of light in that region is so large that output current of the device may greatly decrease.

In the photovoltaic device of the present invention, the region in contact with the transparent electrode may preferably have a resistivity $\rho(\Omega.cm)$ of $10<\rho<10^6$.

The resistivity $\rho(\Omega.cm)$ of the region in contact with the transparent electrode in the photovoltaic device of the present invention has its preferable range determined so that within the above range of the thickness d (nn) of the region it has a resistance high enough to prevent excessive short-circuit currents from flowing even when locally short-circuited portions locally, and the resistance in the layer thickness direction of that region does not cause an increase in the series resistance of the photovoltaic device.

Using as the substrate the cold-rolled stainless steel belt (SUS430BA) finished by bright heat treatment, having the highest-level surface smoothness among stainless steel sheets commonly available, the present inventors produced photovoltaic devices formed of silicon type non-single-crystal semiconductors by use of the roll-to-roll film-forming apparatus, where the short-circuited portions extending through the semiconductor layers occurred at intervals of one spot on average and one hundred spots at maximum, per 10 cm×10 cm=100 cm², having an effective diameter of about 5 µm on average. Under such conditions, the resistivity $\rho(\Omega.cm)$ of that region was controlled to a value of $\rho>10^2$, so that, even when the high-resistance region had a thickness of 2 nm, which is the smallest thickness within the preferable range, the resistance at the short-circuited portions per 1 cm² of the photovoltaic device was controllable to be larger than $1\times10^3$ $\Omega$, which is a boundary level at which device characteristics abruptly lower.

The resistivity $\rho(\Omega.cm)$ of the high-resistance region in contact with the transparent electrode was also controlled to a value of $\rho<10^6$, so that, even when the high-resistance region had a thickness of 20 nm, which is the largest within the preferable range, the increase in the series resistance of the photovoltaic device was controllable to be smaller than 2 $\Omega.cm^2$, at which device characteristics begin to lower.

Figure 13A:
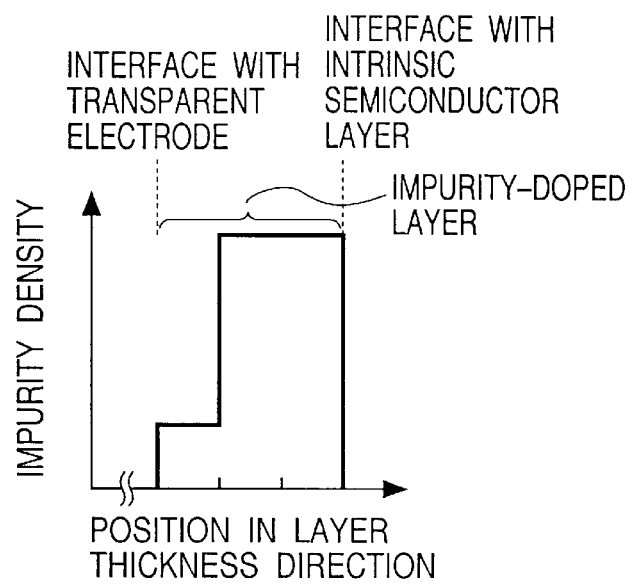
Figure 13B:
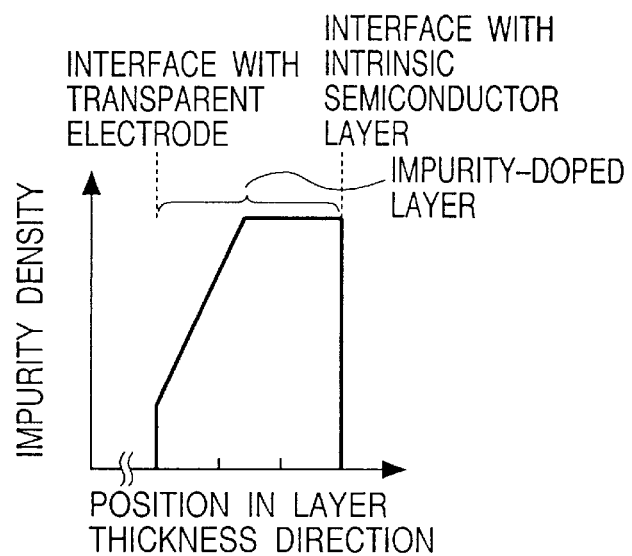
Figure 13C:
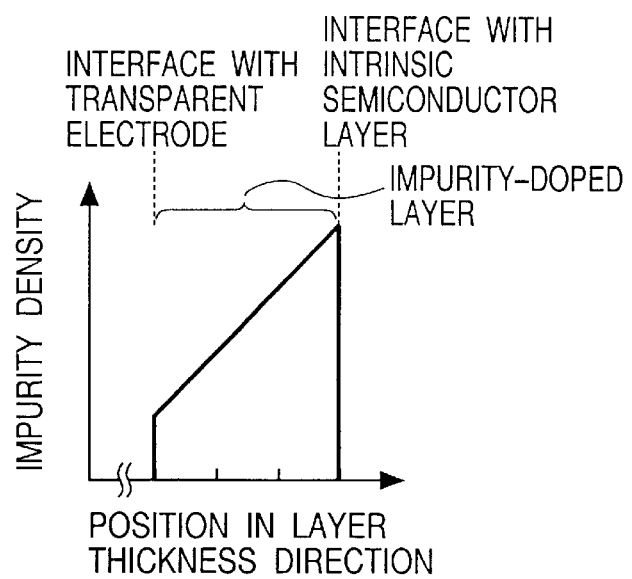

In the photovoltaic device of the present invention, in the case where the density of a dopant impurity determining the conductivity type of the impurity-doped layer in contact with the transparent electrode is varied in that layer so as to be lower on the side of the interface with the transparent electrode, the form of distribution of the impurity density may include, e.g., the forms as shown in FIGS. 13A to 13C. FIGS. 13A to 13C show density distributions that are higher on the side of the interface with the substantially intrinsic semiconductor layer and lower toward the interface with the transparent electrode. The impurity density may be varied in various forms so long as the impurity density is controlled within the predetermined lower range in the region adjacent to the interface with the transparent electrode and the above conditions of $\rho$ and d are fulfilled.

Such distribution of impurity density in the layer thickness direction can be obtained by, e.g., varying the feed proportions of silicon and dopant impurity during deposition of the impurity-doped layer.

As previously described, dopant impurities used for valence electron control of the silicon type non-single-crystal semiconductors may include, as those which impart p-type conductivity, the elements of Group 3B of the periodic table as exemplified by B, A1, Ga, In, and T1, and, as those which impart n-type conductivity, the elements of Group 5B of the periodic table as exemplified by N, P, As, Sb, and Bi. In particular, B, Ga, P, and Sb are preferred. As substances for introducing such impurity elements, those which are gaseous at normal temperature and normal pressure or readily gasifiable at least under film-forming conditions may be employed when, e.g., silicon type non-single-crystal semiconductors are formed by plasma-assisted CVD. Such substances for introducing dopant impurities may specifically include $PH_3$, $P_2H_4$, $PF_3$, $PCl_3$, $ASH_3$, $AsF_3$, $AsF_5$, $AsCl_3$, $SbH_3$, $SbF_5$, $BiH_3$, $BF_3$, $BCl_3$, $BBr_3$, $B_2H_6$, $B_4H_4$, $B_5H_9$, $B_5H_{11}$, $B_6H_{10}$, $B_6H_{12}$, $AlCl_3$, $B(CH_3)_3$, $Al(CH_3)_3$, $Ga(CH_3)_3$, and $As(CH_3)_3$. These compounds containing dopant impurity elements may each be used alone or in combination of two or more.

Figure 14A:
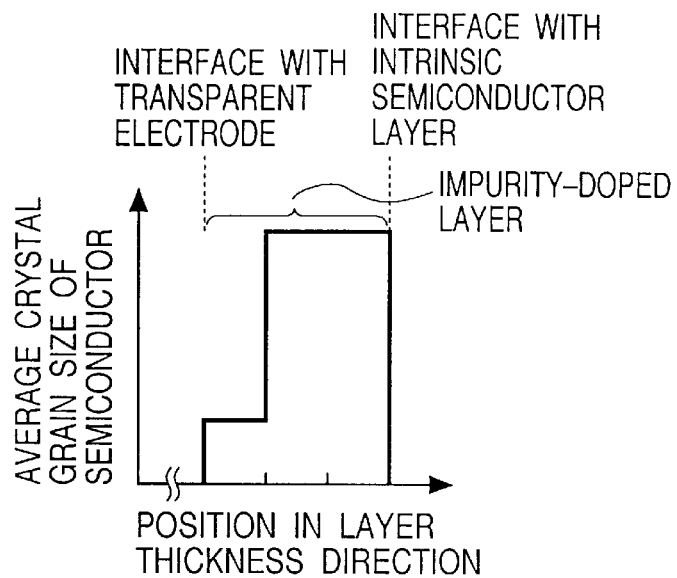
Figure 14B:
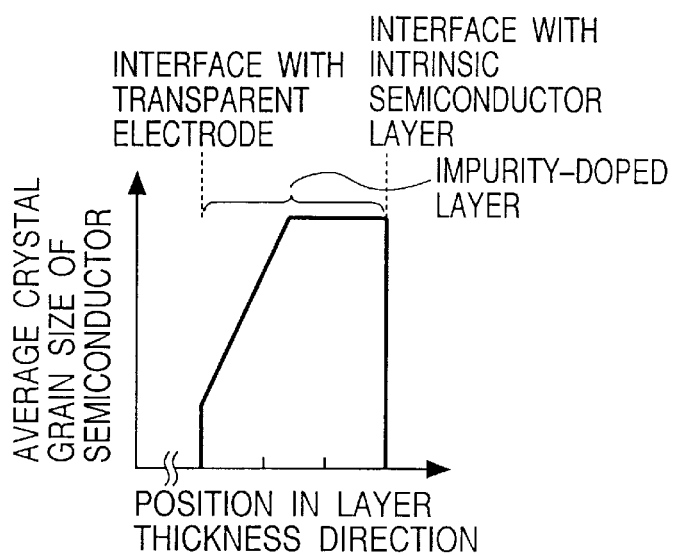
Figure 14C:
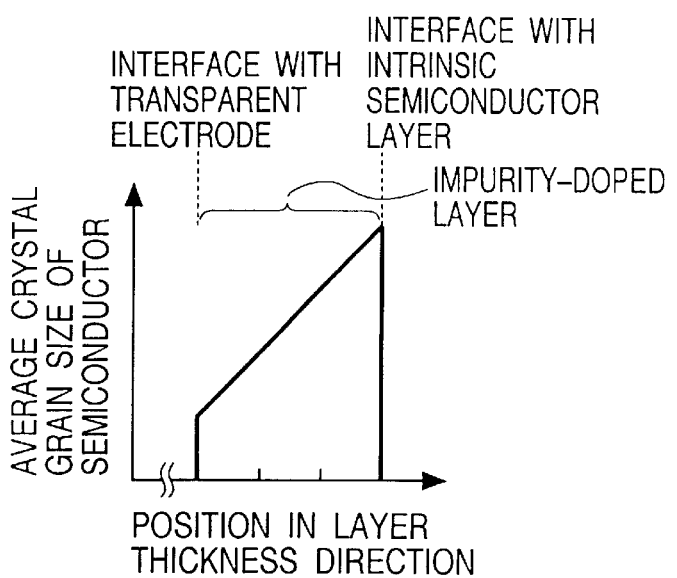

In the photovoltaic device of the present invention, in the case where the crystal grain size of silicon in the impurity-doped layer in contact with the transparent electrode is varied in that layer so as to be lower on the side of the interface with the transparent electrode, the form of distribution of the impurity density may include, e.g., the forms as shown in FIGS. 14A to 14C. FIGS. 14A to 14C show crystal grain size distributions that are higher on the side of the interface with the substantially intrinsic semiconductor layer and lower toward the interface with the transparent electrode.

The crystal grain size referred to in the present invention is the size of a grain of silicon crystal observed with a cross-sectional TEM (transmission electron microscope), which size is represented as the diameter of a sphere having the volume of the crystal grain. When the crystal grain has the shape of a column having a height in the layer thickness direction, the crystal grain size at a certain position in the layer thickness direction is defined as the diameter of a circle having the cross-sectional area at this position of this column-like crystal.

The non-single-crystal silicon referred to in the present invention means silicon having polycrystalline to perfectly amorphous structure. Compared with what is called amorphous in a narrow sense, containing almost no microcrystalline phase and having an average crystal grain size of about 2 nm or smaller, what is called microcrystals, containing many microcrystalline phases and a little amorphous phase and having an average crystal grain size of about 2 nm or larger, are known to lower the resistivity by three to four orders. Accordingly, the region adjacent to the interface with the transparent electrode can be made to have a higher resistivity by making the crystal grain size of the non-single-crystal silicon smaller in the vicinity of the interface with the transparent electrode.

Such distribution of crystal grain size in the layer thickness direction can be obtained by, e.g., when the impurity-doped layer is deposited by plasma-assisted CVD, changing the conditions such as discharge power, dilution with hydrogen and deposition temperature, that affect the crystallinity of deposited films, during deposition of the impurity-doped layer. In the plasma-assisted CVD, as methods for enlarging the crystal grain size of non-single-crystal silicon, methods are known in which the discharge power is made greater with respect to raw material gas flow rate or the dilution with hydrogen is made higher with respect to the raw material gas. The crystal grain size in that region can be made smaller by making the discharge power smaller in the vicinity of the interface with the transparent electrode or by making the dilution with hydrogen lower.

Making crystal grain size smaller in the impurity-doped layer in the region adjacent to the interface with the transparent electrode and making impurity density lower in that region may be carried out alone or in combination. Both the crystal grain size and the impurity density may be varied in the impurity-doped layer so as to be smaller on the side of the transparent electrode of that layer. In such an instance, the form of distribution of crystal grain size and the form of distribution of impurity density need not be identical so long as they are smaller on the side of the interface with the transparent electrode. For example, the crystal grain size may be varied stepwise with an abrupt change in the middle of the layer and the impurity density may be varied slopewise with a continuous change.

The non-single-crystal silicon is known to tend to have a large crystal grain size when it contains P as an impurity element and to tend to have a small crystal grain size when it contains B as an impurity element. Hence, when B is used as an impurity element and the impurity density is made lower in the impurity-doped layer in the region adjacent to the interface with the transparent electrode, there is a possibility that the crystal grain size becomes abruptly larger as a result of a decrease in the B content to make the region have a low resistance, the reverse of what is intended. In order to avoid this possibility, it is necessary to not use film-forming conditions that may cause an abrupt change of what is called an amorphous state in a narrow sense into what is called a microcrystalline state, and to set film-forming conditions so that a decrease in the B content does not cause an abrupt change in crystal structure.

Conductive Substrate

As materials constituting the conductive substrate of the photovoltaic device according to the present invention, those which may cause less deformation or strain at the temperature required when semiconductor layers are formed thereon and have the desired strength are preferred, and specifically include thin sheets of metals such as stainless steel, aluminum and alloys thereof, iron and alloys thereof, copper and alloys thereof, and composites of these; these materials subjected to surface coating by sputtering, vacuum deposition, plating or the like to cover their surfaces with a metal thin film formed of a different kind of metal or an insulating thin film formed of $SiO_2$, $Si_3N_4$, $Al_2O_3$, $AlN_3$ or the like; and heat-resistant resin sheets made of polyimide, polyamide, polyethylene terephthalate, epoxy or the like, or composites of any of these with glass fiber, carbon fiber, boron fiber, metal fiber or the like whose surfaces have been made conductive by plating, vacuum deposition, sputtering or coating of a single metal, an alloy, a transparent conductive oxide (TCO) or the like.

With regard to the surface properties of the conductive belt substrate, it may have what is called a smooth surface, or it may have a finely irregular surface. When the substrate has a finely irregular surface, it may have spherical, conical, or pyramidical irregularities with a maximum height (Rmax) preferably from 50 nm to 500 nm. This makes the reflection of light from the surface irregular, thereby causing an increase in optical path length of the reflected light.

Electrodes

In the photovoltaic device according to the present invention, suitable electrodes are selected according to the form of device constitution. Such electrodes may include a lower electrode, an upper electrode (transparent electrode), and a collector electrode (herein, the upper electrode means an electrode provided on the light-incident side, and the lower electrode means an electrode opposed to the upper electrode, interposing semiconductor layers between them).

Materials constituting the lower electrode that are preferably used in the present invention may include metals such as Ag, Au, Pt, Ni, Cr, Al, Ti, Zn, Mo, and W or alloys of these. The lower electrode can be formed using any of these metals by film-forming methods such as vacuum deposition, electron beam deposition, and sputtering. When it is formed, care must be taken so that the thin metal film does become a resistive component against current output, and it may preferably have a sheet resistance of 50Ω or below, and more preferably 10Ω or below.

A buffer layer of ZnO or the like for preventing short circuits and diffusion of electrode metal may be provided between the lower electrode and an n-type semiconductor layer or p-type semiconductor layer. Such a buffer layer can provide advantages such that not only metal elements of the lower electrode are prevented from being diffused into the n-type semiconductor layer or p-type semiconductor layer but also, when the layer is made to have a small resistance, short circuits are prevented from being caused by defects such as pinholes between the lower electrode and the upper (transparent) electrode, and that the incident light is subjected to multiple interference due to thin films, and is entrapped in photovoltaic devices.

Materials constituting such a buffer layer include materials based on magnesium fluoride; oxides, nitrides or carbides of indium, tin, cadmium, zinc, antimony, silicon, chromium, silver, copper or aluminum, or mixtures of any of these. In particular, magnesium fluoride and zinc oxide are preferred because they can readily form layers and provide appropriate resistance and light transmittance as buffer layers.

The transparent electrode used in the present invention preferably have a light transmittance of 70% or more so that sunlight or light from a white luminescent lamp or the like can be efficiently absorbed in the semiconductor layers, and more preferably have a light transmittance of 80% or more. Materials having such properties include metal oxides such as $SnO_2$, $In_2O_3$, $ZnO$, $CdO$, $Cd_2SO_4$, and ITO ($In_2O_3$+$SnO_2$), and metal thin films obtained by forming metals such as Au, Al, and Cu into very thin semitransparent films. The transparent electrode is superposingly formed on the p-type semiconductor layer or n-type semiconductor layer and can be formed by a process such as resistance heat vacuum deposition, sputtering or spraying, which may be appropriately selected as desired.

In the present invention, a collector electrode may be provided on the transparent electrode for the purpose of decreasing the sheet resistance of the transparent electrode. When the transparent electrode is formed after the semiconductor layers are formed, the substrate temperature at the time of the formation of the transparent electrode can not be substantially elevated, so that the sheet resistance of the transparent electrode can not avoid being relatively high. Thus, it is preferable to form the collector electrode.

Materials constituting the lower electrode that are preferably used in the present invention include single metals such as Ag, Cr, Ni, Al, Au, Ti, Pt, Cu, Mo, and W or alloys of these, and carbon. Advantages possessed by these metals and carbon (e.g., low resistance, less diffusible into semiconductor layers, toughness, capable of readily forming electrodes by printing or the like) may be utilized in combination. In order to ensure the amount of light incident on the semiconductor layers, this electrode may preferably have such a shape that it extends evenly with respect to the light-receiving face of the photovoltaic device and may preferably have an area of 15% or less, and more preferably 10% or less, of the light-receiving area. It may also preferably have a sheet resistance of 50Ω or below, and more preferably 10Ω.

Semiconductor Layers

In the semiconductor layers of the photovoltaic device according to the present invention, preferably semiconductor materials constituting the substantially intrinsic semiconductor layer (i-type semiconductor layer) include silicon type non-single-crystal semiconductor materials as exemplified by amorphous semiconductor materials such as a-Si:H, a-Si:F, a-Si:H:F, a-SiC:H, a-SiC:F, a-SiC:H:F, a-SiGe:H, a-SiGe:F and a-SiGe:H:F, and polycrystalline semiconductor materials such as polycrystalline Si:H and polycrystalline Si:H:F. This layer is usable as long as it is substantially intrinsic, and may also contain impurities in a small quantity. Incidentally, microcrystalline semiconductor materials are included in the amorphous semiconductor materials.

Semiconductor materials constituting the p-type or n-type semiconductor layer that are preferably used in the present invention can be obtained by doping valence electron controlling impurities in the semiconductor material constituting the i-type semiconductor layer described above. Crystal layers are more preferably used for the p- or n-type semiconductor layer, because light utilization and carrier density can be made higher.

Methods for forming the respective semiconductor layers used in the photovoltaic device of the present invention include microwave plasma-assisted CVD, RF (radio frequency) plasma-assisted CVD, ion plating, sputtering, reactive sputtering, photo CVD, thermal CVD, MOCVD (metal organic CVD), and MBE (molecular beam epitaxy), which are methods for depositing semiconductor films.

Photovoltaic Device Fabrication Apparatus and Fabrication Process

To manufacture photovoltaic devices according to the present invention, it is possible to use fabrication apparatus and processes of various types. When photovoltaic devices of single cell configuration as shown in FIG. 1 are manufactured, they can be produced using a fabrication apparatus having a construction as diagrammatically shown in FIG. 15. The fabrication apparatus shown in FIG. 15 is an apparatus in which one film-forming chamber has been removed from the fabrication apparatus previously shown in FIG. 8.

In the present invention, the dopant impurity density and/or crystal grain size is varied in the impurity-doped layer on the side of the conductive substrate, which is the side opposite to and farthest from the light-incident side, to form a high-resistance region in the vicinity of the interface with the conductive substrate. Hence, it is unnecessary to additionally provide a film-forming chamber for forming the high-resistance layer (region), so that the fabrication apparatus and process are not complicated.

Figure 15:
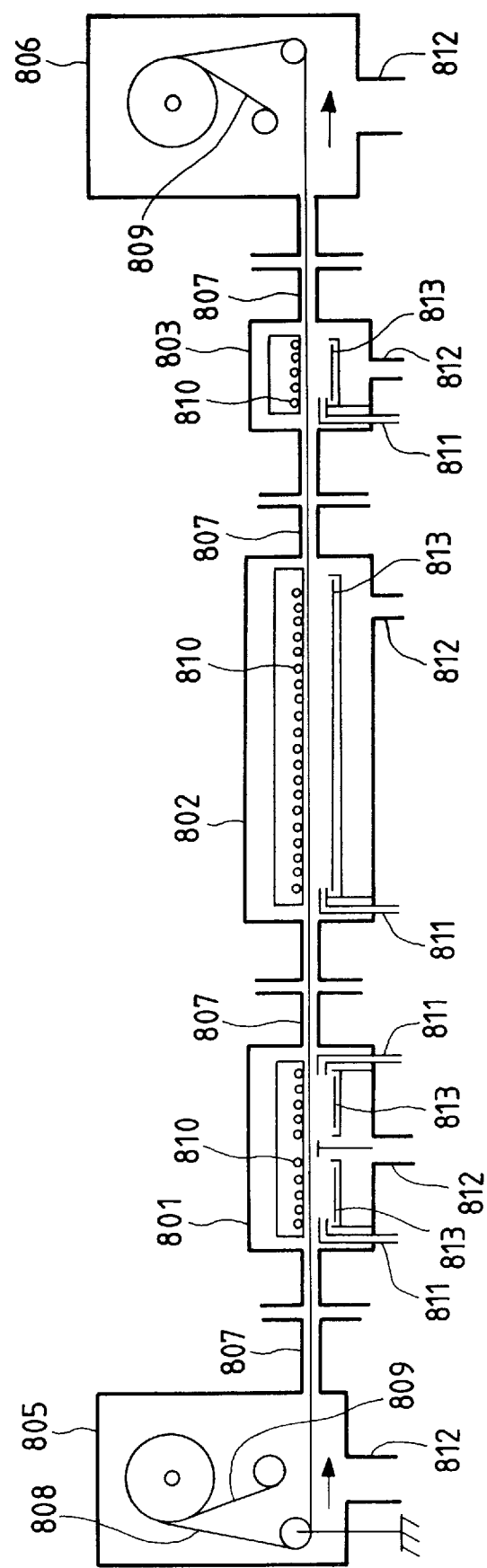
FIGS. 15 to 22 are diagrammatic cross sections for illustrating examples of the construction of fabrication apparatus for producing the photovoltaic devices according to the present invention.

In FIG. 15, reference numerals 801, 802, and 803 respectively denote n-, i-, and p-type or p-, i-, and n-type film-forming chambers; 805 and 806, a supply chamber and a wind-up chamber, respectively, of a conductive belt substrate. Vacuum chambers of the respective film-forming chambers are connected through gas gates 807 in the narrow spaces of which a purge gas such as hydrogen is flowed to prevent gases in the respective film-forming chambers from being intermixed with one another. Reference numeral 808 denotes a belt substrate such as a stainless steel sheet, e.g., 0.13 mm thick and 36 cm wide. It is unwound from a bobbin in the feed chamber 805 and, while being continuously transported, passed through the three film-forming chambers 801, 802, and 803 until it is wound up on a bobbin in the wind-up chamber 806, in the course of which non-single-crystal silicon semiconductor layers for photovoltaic devices having three-layer nip or pin structure are formed on its surface.

Reference numeral 809 denotes a belt made of heat-resistant nonwoven fabric, which is simultaneously wound when the belt substrate is unwound (and vice versa) so that the surface of the belt substrate can be prevented from being scratched.

Each of the film-forming chambers 801, 802, and 803 is provided with a heater 810 for heating the substrate to a predetermined temperature, a raw material gas feed pipe 811 from which raw material gases for forming semiconductor layers are introduced from a gas feeding means (not shown) into each film-forming chamber, a discharge pipe 812 from which the film-forming chamber is evacuated by an evacuation means (not shown) to control its interior at a predetermined pressure, and a discharge electrode 813 that supplies high-frequency power from a high-frequency power source (not shown) to the gases inside the film-forming chamber to cause glow discharge to occur between it and the grounded substrate. In the film-forming chambers 801, 802, and 803, n-, i-, and p-type or p-, i-, and n-type non-single-crystal silicon semiconductor layers are deposited by plasma-assisted CVD.

In the film-forming chamber 801 for the impurity-doped layer on the side nearest to the conductive substrate, there are two discharge zones respectively provided with separate raw material gas feed pipes 811 and discharge electrodes 813, where the impurity density or crystal grain size in that layer can be varied in its layer thickness direction by changing film-forming conditions in the two zones.

Figure 16:
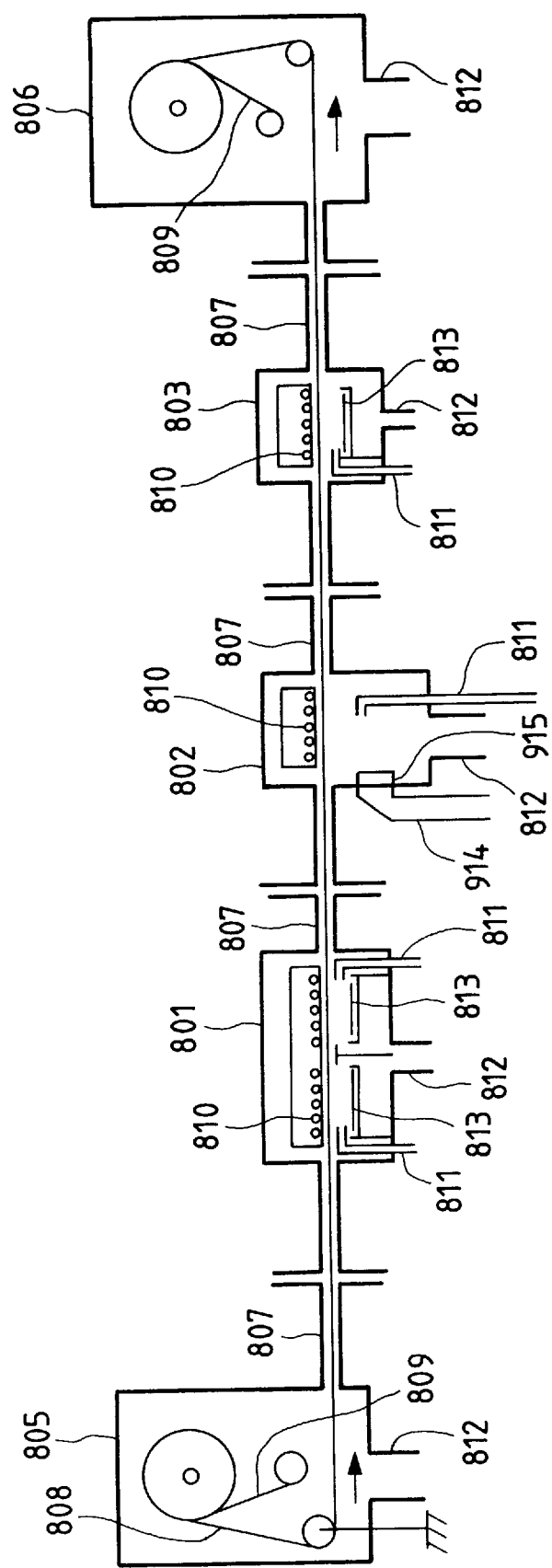

The fabrication apparatus shown in FIG. 16 corresponds to the fabrication apparatus shown in FIG. 15 except that the high-frequency discharge power in the film-forming chamber for the substantially intrinsic semiconductor layer has been changed to microwave discharge power. The photovoltaic device of the present invention also can be produced in such a fabrication apparatus.

In FIG. 16, reference numeral 914 denotes a waveguide through which microwave power is guided from a microwave power source (not shown) into the film-forming chamber 802; and 915, a microwave guide window made of a dielectric and through which the microwave power enters into the film-forming chamber 802. In the apparatus shown in FIG. 16, the substantially intrinsic semiconductor layer, which is of a relatively large thickness, can be formed by microwave plasma-assisted CVD having a high film formation rate, and hence the length of the film-forming chamber 802 can be made smaller than that shown in FIG. 15.

Figure 17:
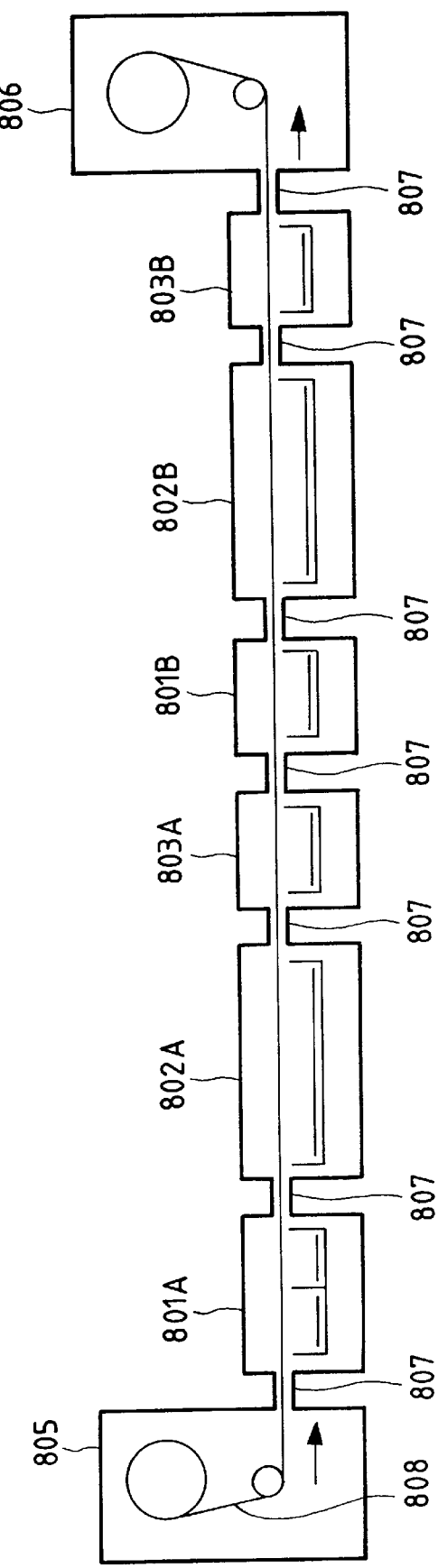

The photovoltaic device of double-layer tandem cell constitution of the present invention as shown in FIG. 3, can be produced by using, e.g., a fabrication apparatus having the construction diagrammatically shown in FIG. 17. The fabrication apparatus shown in FIG. 17 corresponds to the fabrication apparatus shown in FIG. 15 except that the film-forming chambers for the n-, i-, and p-type or p-, i-, and n-type semiconductor layers are arranged in two sets (A and B), where double-layer tandem cell photovoltaic devices of nipnip or pinpin structure can be produced. In FIG. 17, the belts made of heat-resistant nonwoven fabric and the rolls therefor are not shown.

In a film-forming chamber 801A for the impurity-doped layer on the side nearest to the conductive substrate, two discharge zones having different conditions are provided, and semiconductor layers whose characteristics are varied in its thickness direction can be formed.

Figure 18:
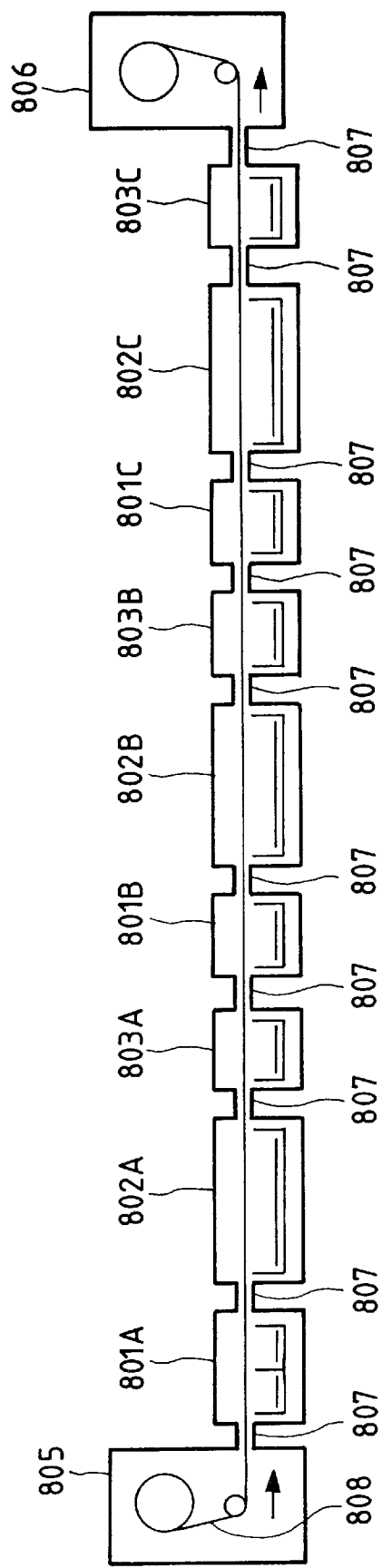

The photovoltaic device of three-layer triple cell constitution of the present invention as shown in FIG. 5 can be produced by using, e.g., a fabrication apparatus having the construction diagrammatically shown in FIG. 18. The fabrication apparatus shown in FIG. 18 corresponds to the fabrication apparatus shown in FIG. 17 except that the film-forming chambers for the n-, i-, and p-type or p-, i-, and n-type semiconductor layers are arranged in three sets (A, B, and C), where three-layer triple photovoltaic devices of nipnipnip or pinpinpin structure can be produced.

In FIG. 18 also, the nonwoven fabric belts sheet and the rolls therefor are not shown.

In a film-forming chamber 1801A for the impurity-doped layer on-the side nearest to the conductive substrate, two discharge zones having different conditions are provided, and semiconductor layers whose characteristics are varied in its thickness direction can be formed.

Figure 19:
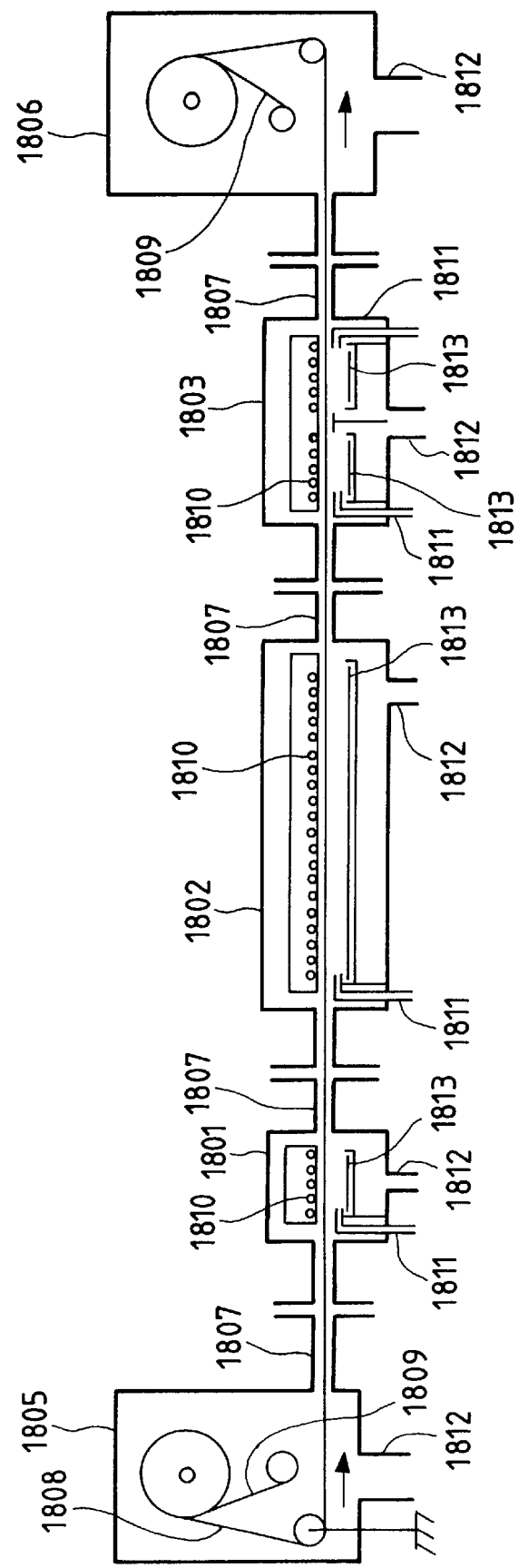

When photovoltaic devices of single configuration as shown in FIG. 2 are manufactured, they can be produced using a fabrication apparatus having the construction diagrammatically shown in FIG. 19. The fabrication apparatus shown in FIG. 19 corresponds to the fabrication apparatus previously shown in FIG. 12 except that one film-forming chamber has been removed.

In the present invention, the dopant impurity density and/or crystal grain size may be varied in the impurity-doped layer nearest to the light-incident side, to form a high-resistance region in the vicinity of the interface with the transparent electrode. Hence, it is unnecessary to additionally provide a film-forming chamber for forming the high-resistance layer (region), so that the fabrication apparatus and process are not complicated.

In FIG. 19, reference numerals 1801, 1802, and 1803 respectively denote n-, i-, and p-type or p-, i-, and n-type layer film-forming chambers; 1805 and 1806, a supply chamber and a wind-up chamber, respectively, of a conductive belt substrate. Vacuum chambers of the respective film-forming chambers are connected through gas gates 1807 in the narrow spaces of which a purge gas such as hydrogen is flowed to prevent gases in the respective film-forming chambers from being intermixed with one another. Reference numeral 1808 denotes a belt substrate such as a stainless steel sheet, e.g., 0.13 mm thick and 36 cm wide. It is wound off a bobbin in the feed chamber 1805 and, while being continuously transported, passed through the three film-forming chambers 1801, 1802, and 1803 until it is wound up on a bobbin in the wind-up chamber 1806, in the course of which non-single-crystal silicon semiconductor layers for photovoltaic devices having three-layer nip or pin structure are formed on its surface.

Reference numeral 1809 denotes a belt made of heat-resistant nonwoven fabric, which is simultaneously wound when the belt substrate is unwound (and vice versa) so that the surface of the belt substrate can be prevented from being scratched.

Each of the film-forming chambers 1801, 1802, and 1803 is provided with a heater 1810 for heating the substrate to a predetermined temperature, a raw material gas feed pipe 1811 from which raw material gases for forming semiconductor layers are introduced from a gas feeding means (not shown) into each film-forming chamber, a discharge pipe 1812 from which the film-forming chamber is evacuated by an evacuation means (not shown) to control its interior at a predetermined pressure, and a discharge electrode 1813 that supplies high-frequency power from a high-frequency power source (not shown) to the gases inside the film-forming chamber to cause glow discharge to occur between it and the grounded substrate. In the film-forming chambers 1801, 1802, and 1803, n-, i-, and p-type or p-, i-, and n-type non-single-crystal silicon semiconductor layers are deposited by plasma-assisted CVD.

In the film-forming chamber 1803 for the impurity-doped layer nearest to the light-incident side, there are two discharge zones respectively provided with separate raw material gas feed pipes 1811 and discharge electrodes 1813, where the impurity density and/or crystal grain size in that layer can be varied in its thickness direction by changing film-forming conditions in the two zones.

Figure 20:
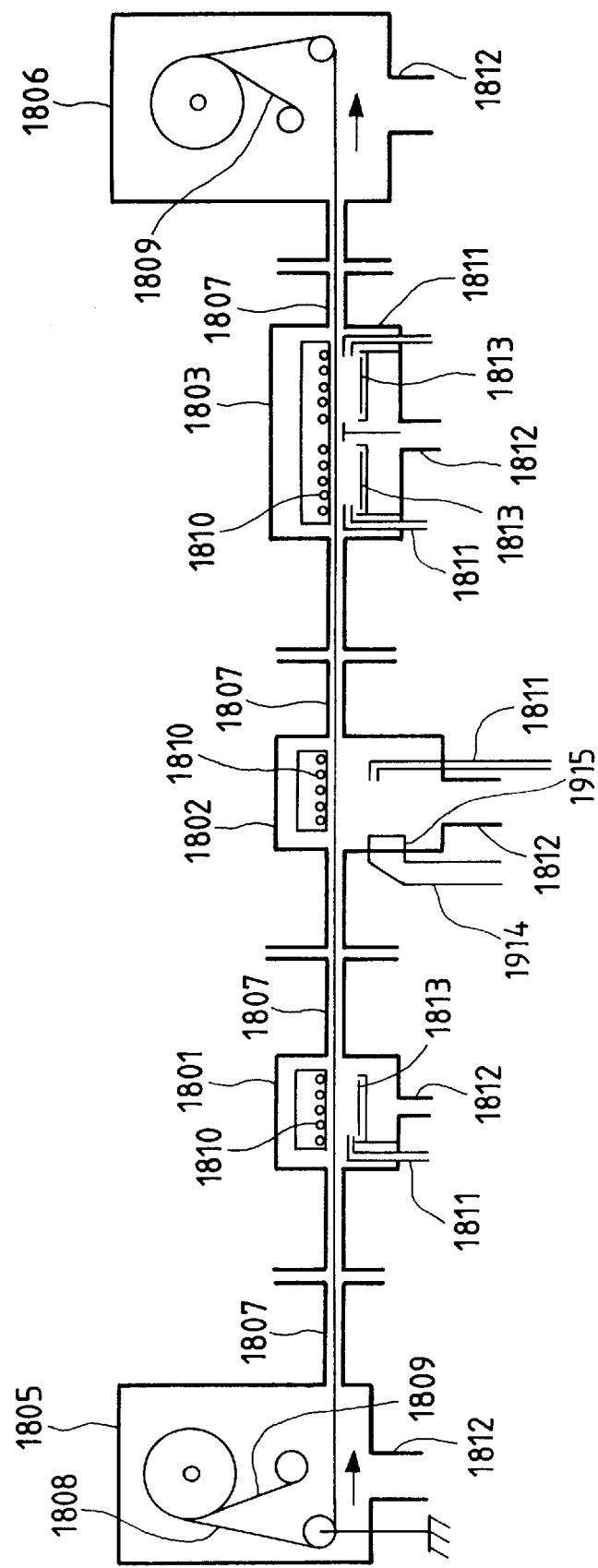

The fabrication apparatus shown in FIG. 20 corresponds to the fabrication apparatus shown in FIG. 19 except that the high-frequency discharge power in the film-forming chamber for the substantially intrinsic semiconductor layer has been changed to microwave discharge power. The photovoltaic device of the present invention can also be produced in such a fabrication apparatus.

In FIG. 20, reference numeral 1914 denotes a waveguide through which microwave power is guided from a microwave power source (not shown) into the film-forming chamber 1802; and 1915, a microwave guide window made of a dielectric and through which the microwave power enters into the film-forming chamber 1802. In the apparatus shown in FIG. 20, the substantially intrinsic semiconductor layer, which is of a relatively layer thickness, can be formed by microwave plasma-assisted CVD having a high film formation rate, and hence the length of the film-forming chamber 1802 can be made smaller than that shown in FIG. 19.

Figure 21:
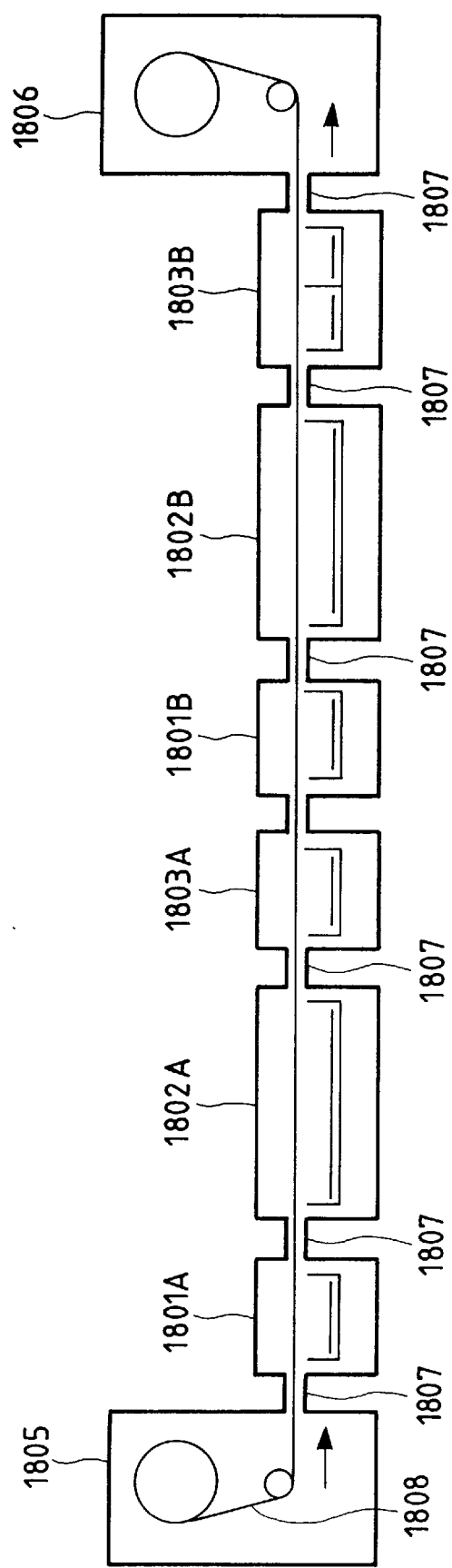

The photovoltaic device of double-layer tandem cell constitution of the present invention as shown in FIG. 4 can be produced by using, e.g., a fabrication apparatus having the construction diagrammatically shown in FIG. 21. The fabrication apparatus shown in FIG. 21 corresponds to the apparatus shown in FIG. 19 except that the film-forming chambers for the n-, i-, and p-type or p-, i-, and n-type semiconductor layers are arranged in two sets (A and B), where double-layer tandem cell photovoltaic devices of nipnip or pinpin structure can be produced. In FIG. 21, the non-woven fabric belt and the roll therefor are not shown.

In a film-forming chamber 1803B for the impurity-doped layer nearest to the light-incident side, two discharge zones having different conditions are provided, and semiconductor layers whose characteristics are varied in its thickness direction can be formed.

Figure 22:
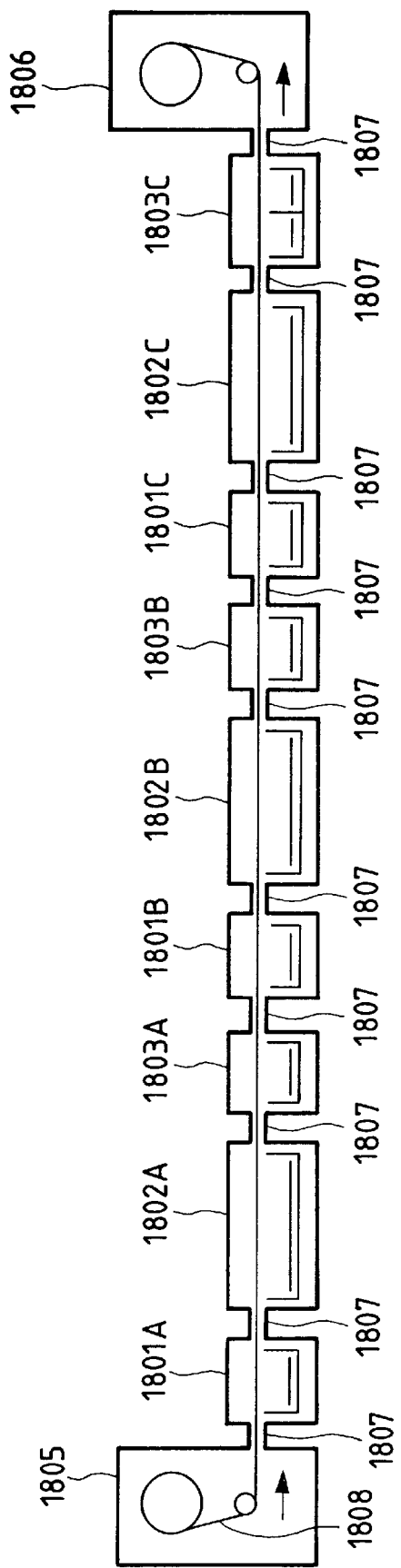

The photovoltaic device of three-layer triple cell constitution of the present as shown in FIG. 6 of the present invention can be produced by using, e.g., a fabrication apparatus having the construction diagrammatically shown in FIG. 22. The fabrication apparatus shown in FIG. 22 corresponds to the apparatus shown in FIG. 19 except that the film-forming chambers for the n-, i-, and p-type or p-, i-, and n-type semiconductor layers are arranged in three sets (A, B, and C), where three-layer triple photovoltaic devices of nipnipnip or pinpinpin structure can be produced. In a film-forming chamber 1803C for the impurity-doped layer nearest to the light-incident side, two discharge zones having different conditions are provided, and semiconductor layers whose characteristics are changed in its thickness direction can be formed.

The photovoltaic device of the present invention will be further described below by the following Examples and Comparative Examples, with reference to the drawings as required.

EXAMPLE A1

In the present example, photovoltaic devices of nip structure comprised of amorphous silicon were continuously produced on a conductive substrate by use of the fabrication apparatus shown in FIG. 15. The impurity-doped layer on the side nearest to the conductive substrate was formed in the two film-forming zones, where the dopant impurity gas concentration in the raw material gases was made lower in the film-forming zone for forming the region on the side of the interface with the conductive substrate than in the film-forming zone for forming the region on the side of the interface with the intrinsic semiconductor layer so that the density of P (phosphorus) as the dopant impurity element of the n-type amorphous silicon layer formed in the film-forming chamber 801 was varied so as to be lower on the side of the conductive substrate. Films were formed under conditions as shown in Table A1.

In the Tables, "HF-PCVD" represents high-frequency plasma-assisted chemical vapor deposition; and "a-Si", amorphous silicon.

The steps of fabrication will be described below in their order.

(1) A belt-like substrate 808 (36 cm wide×50 m long×0.13 mm thick) made of SUS430BA stainless steel was placed in the supply chamber 805 wound around a bobbin. This belt substrate was passed through the film-forming chambers 801 to 803 via the respective gas gates 807 until it reached the wind-up chamber 806, and tension was applied to the substrate to the extent that it was not loose. In the wind-up chamber 806, a bobbin around which a well-dried protective film 809 (36 cm wide×60 m long×0.05 mm thick) made of aramid had been wound up was installed so that the protective film was rolled up together with the belt substrate having the semiconductor layers formed thereon.

(2) After the belt substrate was thus installed, the interiors of the chambers 801 to 806 were evacuated by means of pumps comprised of a combination of a rotary pump and a mechanical booster pump. While evacuating them, He gas was supplied and the interiors of the respective film-forming chambers were heated to 350° C. in an about 200 Pa atmosphere of He to bake their inner walls.

(3) After the heating and baking, the chambers 801 to 806 were evacuated. While evacuating them, $H_2$ gas for preventing film-forming gases from being intermixed in the film-forming chambers adjacent to each other was fed via the gas gates 807 at a rate of 1,000 sccm for each, and corresponding raw material gases were respectively fed into the film-forming chambers 801 to 803 at predetermined flow rates.

Then, the openings of throttle valves provided to exhaust pipes 812 of the respective chambers was controlled so that the belt substrate supply chamber 805 and wind-up chamber 806 were each set at an internal pressure of 125 Pa and the film-forming chambers 801, 802, and 803 each at an internal pressure of 130 Pa.

(4) When the pressure in each chamber had become stable, the wind-up bobbin in the belt substrate wind-up chamber 806 was rotated to continuously transport the belt substrate 808 at a constant speed of 100 cm/min such that the belt substrate 808 moved from the film-forming chamber 801 toward the chamber 803. Heaters 810 connected to temperature control systems (not shown) provided in the film-forming chambers 801 to 803 were also operated to control temperatures so that the moving belt substrate was heated to a predetermined temperature in the film-forming space in each film-forming chamber.

(5) When the temperature of the belt substrate had become stable, high-frequency power of 13.56 MHz was supplied to the film-forming chambers 801, 802, and 803 through discharge electrodes 813 provided therein, from corresponding power sources (not shown) via matching devices. Upon application of the discharge power, the raw material gases in the film-forming chambers 801 to 803 were converted into plasma, and semiconductor layers were formed on the surface of the belt substrate continuously moving through the respective film-forming chambers, so that semiconductor layers of nip structure were continuously formed on the surface of the belt substrate.

Film-forming conditions in the chambers 801 to 803 are shown in Table A1.

(6) The belt substrate was moved continuously for 40 minutes after the start of its transport, in the course of which the semiconductor layers were continuously formed for 35 minutes. After the multiple semiconductor layers were formed over a substrate length of about 35 m, the application of discharge power, the feeding of raw material gases, and the heating of the belt substrate and film-forming chambers were stopped, and the interiors of the film-forming chambers were purged. After the belt substrate and the interiors of the film-forming chambers were well cooled, the apparatus was opened to remove the belt substrate (with semiconductor layers thereon) from the wind-up chamber 806.

(7) The belt substrate thus taken out was further continuously processed using a continuous processing apparatus, wherein a 70 nm thick ITO ($In_2O_3$+$SnO_2$) thin film was formed as a transparent electrode over the entire surface of the semiconductor layers thus formed, and thin-line Ag electrodes were formed thereon as collector electrodes at given intervals. Thus, one hundred 30 cm×30 cm photovoltaic devices were continuously produced. Post-treatment for making short-circuited portions have high resistance was not carried out after the semiconductor multiple layers were formed.

The layer configuration of the photovoltaic devices produced is diagrammatically shown in FIG. 1.

Characteristics of the one hundred 30 cm×30 cm photovoltaic devices thus produced (Sample A1) were measured. When normalized to the characteristics of photovoltaic devices (Standard A1) produced from 1 cm×1 cm portions perfectly free of short-circuited portions due to pinholes and defects, open-circuit voltages of Sample A1 measured under low-illuminance light (AM 1. 5, 1 mW/cm$^2$) were 0.80 on average. True conversion efficiencies of Sample A1 under artificial sunlight (AM 1. 5, 100 mW/cm$^2$) were 0.90 on average. Also, Sample A1 exhibited only very slight lowering of device characteristics even before post-treatment for making short-circuited portions have high resistance.

The photovoltaic devices produced (Sample A1) were also subjected to measurement of element distribution as a function of their layer thickness by the use of secondary ion mass spectroscopy (SIMS). As a result, it was confirmed that, in the impurity-doped layer in contact with the conductive substrate, the dopant impurity element P (phosphorus) was present in a lower density on the side of the conductive substrate and in a higher density on the side of the substantially intrinsic semiconductor layer.

Comparative Example A1

The present example is different from Example A1 in that the dopant impurity density in the impurity-doped layer on the side nearest to the conductive substrate was made uniform. That is, the impurity-doped layer on the side nearest to the conductive substrate was formed in one film-forming zone in the fabrication apparatus shown in FIG. 15, where the dopant impurity gas concentration in the raw material gases was not made different between the film-forming zone for forming the region on the side of the interface with the intrinsic semiconductor layer and the film-forming zone for forming the region on the side of the interface with the conductive substrate.

The same procedures as in Example A1 except for the foregoing was repeated to continuously produce one hundred 30 cm×30 cm photovoltaic devices of nip structure (Comparative Sample A1). Post-treatment for making short-circuited portions have high resistance having was not carried out after the multiple semiconductor layers were formed.

Characteristics of the one hundred 30 cm×30 cm photovoltaic devices thus produced (Comparative Sample A1) were measured. When normalized to the characteristics of photovoltaic devices (Standard A1) produced from 1 cm×1 cm portions perfectly free of short-circuited portions due to pinholes and defects, open-circuit voltages of Comparative Sample A1 measured under low-illuminance light (AM 1.5, 1 mW/cm$^2$) were 0.13 on average. True conversion efficiencies of Comparative Sample A1 under artificial sunlight (AM 1.5, 100 mW/cm$^2$) were 0.33 on average.

Thus, compared with Sample A1, Comparative Sample A1 was found to have greatly lowered device characteristics.

The produced photovoltaic devices were also subjected to measurement of element distribution as a function of their layer thickness by the use of secondary ion mass spectroscopy (SIMS). As a result, it was confirmed that, in the impurity-doped layer in contact with the conductive substrate, the dopant impurity element P (phosphorus) was present in a uniform density between the side of the conductive substrate and the side of the substantially intrinsic semiconductor layer.

EXAMPLE A2

This example is different from Example A1 in that, in place of nip structure, photovoltaic devices of pin structure were produced. That is, when photovoltaic devices of pin structure comprised of amorphous silicon were continuously produced on a conductive substrate using the fabrication apparatus as shown in FIG. 15, the impurity-doped layer on the side nearest to the conductive substrate was formed in the two film-forming zones, where the dopant impurity gas concentration in the raw material gases was made lower in the film-forming zone for forming the region on the side of the conductive substrate than in the film-forming zone for forming the region on the side of the intrinsic semiconductor layer so that the density of B (boron) as the dopant impurity element of the p-type amorphous silicon layer formed in the film-forming chamber 801 was varied so as to be lower on the side of the conductive substrate.

Films of the respective layers were formed under conditions shown in Table A2.

The same procedures as in Example A1 except for the foregoing was repeated to continuously produce one hundred 30 cm×30 cm photovoltaic devices of pin structure (Sample A2). Post-treatment for making short-circuited portions have high resistance was not carried out after the multiple semiconductor layers were formed.

The layer configuration of the produced photovoltaic devices is diagrammatically shown in FIG. 1.

Characteristics of the one hundred 30 cm×30 cm photovoltaic devices thus produced (Sample A2) were measured. When normalized to the characteristics of photovoltaic devices (Standard A2) produced from 1 cm×1 cm portions perfectly free of short-circuited portions due to pinholes and defects, open-circuit voltages of Sample A2 measured under low-illuminance light (AM 1.5, 1 mW/cm$^2$) were 0.80 on average. True conversion efficiencies of Sample A2 under artificial sunlight (AM 1.5, 100 mW/cm$^2$) were 0.90 on average. Also, Sample A2 exhibited only very slight lowering of device characteristics even before post-treatment for making short-circuited portions have high resistance.

The photovoltaic devices produced (Sample A2) were also subjected to measurement of element distribution as a function of their layer thickness by the use of secondary ion mass spectroscopy (SIMS). As a result, it was confirmed that, in the impurity-doped layer in contact with the conductive substrate, the dopant impurity element B (boron) was present in a lower density on the side of the conductive substrate and in a higher density on the side of the substantially intrinsic semiconductor layer.

Comparative Example A2

This example is different from Example A2 in that the dopant impurity density in the impurity-doped layer on the side nearest to the conductive substrate was made uniform. That is, the impurity-doped layer on the side nearest to the conductive substrate was formed in one film-forming zone in the fabrication apparatus shown in FIG. 15, where the dopant impurity gas concentration in the raw material gases was not made different between the film-forming zone for forming the region on the side of the intrinsic semiconductor layer and the film-forming zone for forming the region on the side of the conductive substrate.

The same procedures as in Example A2 except for the foregoing was repeated to continuously produce one hundred 30 cm×30 cm photovoltaic devices of pin structure (Comparative Sample A2). Post-treatment for making short-circuited portions have high resistance was not carried out after the multiple semiconductor layers were formed.

Characteristics of the one hundred 30 cm×30 cm photovoltaic devices thus produced (Comparative Sample A2) were measured. When normalized to the characteristics of photovoltaic devices (Standard A2) produced from 1 cm×1 cm portions perfectly free of short-circuited portions due to pinholes and defects, open-circuit voltages of Comparative Sample A2 measured under low-illuminance light (AM 1.5, 1 mW/cm$^2$) were 0.15 on average. True conversion efficiencies of Comparative Sample A2 under artificial sunlight (AM 1.5, 100 mW/cm$^2$) were 0.35 on average.

Thus, compared with Sample A2, Comparative Sample A2 was found to exhibit greatly lowered device characteristics.

The produced photovoltaic devices were also subjected to measurement of element distribution as a function of their layer thickness by the use of secondary ion mass spectroscopy (SIMS). As a result, it was confirmed that, in the impurity-doped layer in contact with the conductive substrate, the dopant impurity element B (boron) was present in a uniform density between the side of the conductive substrate and the side of the substantially intrinsic semiconductor layer.

EXAMPLE A3

In this example, photovoltaic devices of nip structure comprised of amorphous silicon were continuously produced on a conductive substrate by use of the fabrication apparatus shown in FIG. 15. The dopant impurity gas concentration with respect to the Si raw material gas was not changed, and the discharge power and the dilution of the Si raw material gas with $H_2$ gas were made lower in the film-forming zone for forming the region on the side of the conductive substrate than in the film-forming zone for forming the region on the side of the intrinsic semiconductor layer so that the crystal grain size of the n-type amorphous silicon layer formed in the film-forming chamber 801 was varied so as to be smaller on the side of the conductive substrate. The present example is different from Example A1 in this regard.

Films of the respective layers were formed under conditions shown in Table A3.

The same procedures as in Example A1 except for the foregoing were repeated to continuously produce one hundred 30 cm×30 cm photovoltaic devices of nip structure (Sample A3). Post-treatment for making short-circuited portions high resistance having was not carried out after the multiple semiconductor layers were formed.

The layer configuration of the produced photovoltaic devices is diagrammatically shown in FIG. 1.

Characteristics of the one hundred 30 cm×30 cm photovoltaic devices thus produced (Sample A3) were measured. When normalized to the characteristics of photovoltaic devices (Standard A3) produced from 1 cm×1 cm portions perfectly free of short-circuited portions due to pinholes and defects, open-circuit voltages of Sample A3 measured under low-illuminance light (AM 1.5, 1 mW/cm$^2$) were 0.78 on average. True conversion efficiencies of Sample A3 under artificial sunlight (AM 1.5, 100 mW/cm$^2$) were 0.88 on average. Also, Sample A3 exhibited only very slight lowering of device characteristics even before post-treatment for making short-circuited portions have high resistance.

Using cross-sectional TEM, the photovoltaic devices produced were also subjected to measurement of crystal grain size distribution as a function of their layer thickness. As a result, it was confirmed that, in the impurity-doped layer in contact with the conductive substrate, the crystal grain size of Si was smaller on the side of the conductive substrate and larger on the side of the substantially intrinsic semiconductor layer.

Comparative Example A3

This example is different from Example A3 in that the crystal grain size in the impurity-doped layer on the side nearest to the conductive substrate was made uniform. That is, the impurity-doped layer on the side nearest to the conductive substrate was formed in one film-forming zone in the fabrication apparatus shown in FIG. 15, where the crystal grain size was not made different between the film-forming zone for forming the region on the side of the intrinsic semiconductor layer and the film-forming zone for forming the region on the side of the conductive substrate.

The same procedures as in Example A3 except for the foregoing were repeated to continuously produce one hundred 30 cm×30 cm photovoltaic devices of nip structure (Comparative Sample A3). Post-treatment for making short-circuited portions have high resistance was not carried out after the multiple semiconductor layers were formed.

Characteristics of the one hundred 30 cm×30 cm photovoltaic devices thus produced (Comparative Sample A3) were measured. When normalized to the characteristics of photovoltaic devices (Standard A3) produced from 1 cm×1 cm portions perfectly free of short-circuited portions due to pinholes and defects, open-circuit voltages of Comparative Sample A3 measured under low-illuminance light (AM 1.5, 1 mW/cm$^2$) were 0.13 on average. True conversion efficiencies of Comparative Sample A3 under artificial sunlight (AM 1.5, 100 mW/cm$^2$) were 0.33 on average.

Thus, compared with Sample A3, Comparative Sample A3 was found to exhibit greatly lowered device characteristics.

Using cross-sectional TEM, the photovoltaic devices produced were also subjected to measurement of crystal grain size distribution as a function of their layer thickness. As a result, it was confirmed that, in the impurity-doped layer in contact with the conductive substrate, the crystal grain size of Si was constant between the side of the conductive substrate and the side of the substantially intrinsic semiconductor layer.

EXAMPLE A4

This example is different from Example A3 in that, in place of nip structure, photovoltaic devices of pin structure were produced. That is, when photovoltaic devices of pin structure comprised of amorphous silicon were continuously produced on a conductive substrate by the use of the fabrication apparatus as shown in FIG. 15, the impurity-doped layer on the side nearest to the conductive substrate was formed in the two film-forming zones, the dopant impurity gas concentration with respect to the Si raw material gas was not changed, and the discharge power and the dilution of Si raw material gas with $H_2$ gas were made lower in the film-forming zone for forming the region on the side of the conductive substrate than in the film-forming zone for forming the region on the side of the intrinsic semiconductor layer so that the crystal grain size of the p-type amorphous silicon layer formed in the film-forming chamber 801 was varied so as to be smaller on the side of the conductive substrate.

Films of the respective layers were formed under conditions shown in Table A4.

The same procedures as in Example A1 except for the foregoing were repeated to continuously produce one hundred 30 cm×30 cm photovoltaic devices of pin structure (Sample A4). Post-treatment for making short-circuited portions having high resistance was not carried out after the semiconductor multiple layers were formed.

The layer configuration of the photovoltaic devices produced is diagrammatically shown in FIG. 1.

Characteristics of the one hundred 30 cm×30 cm photovoltaic devices thus produced (Sample A4) were measured.

When normalized to the characteristics of photovoltaic devices (Standard A4) produced from 1 cm×1 cm portions perfectly free of short-circuited portions due to pinholes and defects, open-circuit voltages of Sample A4 measured under low-illuminance light (AM 1.5, 1 mW/cm$^2$) were 0.78 on average. True conversion efficiencies of Sample A4 under artificial sunlight (AM 1.5, 100 mW/cm$^2$) were 0.88 on average. Also, Sample A4 exhibited only very slight lowering of device characteristics even before post-treatment for making short-circuited portions having high resistance.

Using cross-sectional TEM, the photovoltaic devices produced were also subjected to measurement of crystal grain size distribution as a function of their layer thickness. As a result, it was confirmed that, in the impurity-doped layer in contact with the conductive substrate, the crystal grain size of Si was smaller on the side of the conductive substrate and larger on the side of the substantially intrinsic semiconductor layer.

Comparative Example A4

This example is different from Example A4 in that the crystal grain size in the impurity-doped layer on the side nearest to the conductive substrate was made uniform. That is, the impurity-doped layer on the side nearest to the conductive substrate was formed in one film-forming zone in the fabrication apparatus shown in FIG. 15, where the crystal grain size was not made different between the film-forming zone for forming the region on the side of the intrinsic semiconductor layer and the film-forming zone for forming the region on the side of the conductive substrate.

The same procedures as in Example A4 except for the foregoing was repeated to continuously produce one hundred 30 cm×30 cm photovoltaic devices of pin structure (Comparative Sample A4). Post-treatment for making short-circuited portions have high resistance was not carried out after the semiconductor multiple layers were formed.

Characteristics of the one hundred 30 cm×30 cm photovoltaic devices thus produced (Comparative Sample A4) were measured. When normalized to the characteristics of photovoltaic devices (Standard A4) produced from 1 cm×1 cm portions perfectly free of short-circuited portions due to pinholes and defects, open-circuit voltages of Comparative Sample A4 measured under low-illuminance light (AM 1.5, 1 mW/cm$^2$) were 0.13 on average. True conversion efficiencies of Comparative Sample A4 under artificial sunlight (AM 1.5, 100 mW/cm$^2$) were 0.33 on average.

Thus, compared with Sample A4, Comparative Sample A4 was found to exhibit a great lowering of device characteristics.

Using cross-sectional TEM, the photovoltaic devices produced were also subjected to measurement of crystal grain size distribution as a function of layer thickness. As a result, it was confirmed that, in the impurity-doped layer in contact with the conductive substrate, the crystal grain size of Si was identical between the side of the conductive substrate and the side of the substantially intrinsic semiconductor layer.

EXAMPLE A5

This example is different from Example A4 in that the dopant impurity density and crystal grain size in the impurity-doped layer on the side nearest to the conductive substrate were made smaller on the side of the conductive substrate. That is, when photovoltaic devices of pin structure comprised of amorphous silicon were continuously produced on a conductive substrate by the use of the fabrication apparatus as shown in FIG. 15, the impurity-doped layer on the side nearest to the conductive substrate was formed in the two film-forming zones, and the dopant impurity concentration, discharge power, and the dilution of Si containing raw material gas with H$_2$ gas were made lower in the film-forming zone for forming the region on the side of the conductive substrate interface than in the film-forming zone for forming the region on the side of the intrinsic semiconductor layer interface so that the dopant impurity density and crystal grain size in the p-type amorphous silicon layer formed in the film-forming chamber 801 were varied so as to be smaller on the side of the conductive substrate.

Films of the respective layers were formed under conditions as shown in Table A5.

The same procedures as in Example A1 except for the foregoing was repeated to continuously produce one hundred 30 cm×30 cm photovoltaic devices of pin structure (Sample A5). Post-treatment for making short-circuited portions have high resistance was not carried out after the semiconductor multiple layers were formed.

The layer configuration of the photovoltaic devices produced is diagrammatically shown in FIG. 1.

Characteristics of the one hundred 30 cm×30 cm photovoltaic devices thus produced (Sample A5) were measured. When normalized by the characteristics of photovoltaic devices (Standard A5) produced from 1 cm×1 cm portions perfectly free of short-circuited portions due to pinholes and defects, open-circuit voltages of Sample A5, measured under low-illuminance light (AM 1.5, 1 mW/cm$^2$) were 0.82 on average. True conversion efficiencies of Sample A5 under artificial sunlight (AM 1.5, 100 mW/cm$^2$) were 0.92 on average. Also, Sample A5 exhibited only very slight lowering of device characteristics even before the post-treatment for making short-circuited portions have high resistance.

The photovoltaic devices thus produced (Sample A5) were also subjected to measurement of element distribution as a function of layer thickness by the use of secondary ion mass spectroscopy (SIMS). As a result, it was confirmed that, in the impurity-doped layer in contact with the conductive substrate, the dopant impurity element B (boron) was present in a lower density on the side of the conductive substrate and in a higher density on the side of the substantially intrinsic semiconductor layer.

Using cross-sectional TEM, the photovoltaic devices produced were further subjected to measurement of crystal grain size distribution as a function of layer thickness. As a result, it was confirmed that, in the impurity-doped layer in contact with the conductive substrate, the crystal grain size of Si was smaller on the side of the conductive substrate and larger on the side of the substantially intrinsic semiconductor layer.

EXAMPLE A6

This example is different from Example A4 in that the dopant impurity density in the impurity-doped layer on the side nearest to the conductive substrate was made lower on the side of the conductive substrate. That is, when photovoltaic devices of pin structure comprised of amorphous silicon were continuously produced on a conductive substrate by the use of the fabrication apparatus shown in FIG. 15, the impurity-doped layer on the side nearest to the conductive substrate was formed in the two film-forming zones, and the dopant impurity concentration was made lower in the film-forming zone for forming the region on the side of the conductive substrate than in the film-forming zone for forming the region on the side of the intrinsic semiconductor layer so that the density of B (boron), the dopant impurity element of the p-type amorphous silicon layer formed in the film-forming chamber 803 was varied so as to be lower on the side of the conductive substrate.

Films of the respective layers were formed under conditions shown in Table A6.

The same procedures as in Example A1 repeated except for the foregoing to continuously produce one hundred 30 cm×30 cm photovoltaic devices of pin structure (Sample A6). Post-treatment for making short-circuited portions have high resistance was not carried out after the semiconductor multiple layers were formed.

The layer configuration of the photovoltaic devices produced is diagrammatically shown in FIG. 1.

Characteristics of the one hundred 30 cm×30 cm photovoltaic devices thus produced (Sample A6) were measured. When normalized by the characteristics of photovoltaic devices (Standard A6) produced from 1 cm×1 cm portions perfectly free of short-circuited portions due to pinholes and defects, open-circuit voltages of Sample A6 measured under low-illuminance light (AM 1.5, 1 mW/cm$^2$) were 0.80 on the average. True conversion efficiencies of Sample A6 under artificial sunlight (AM 1.5, 100 mW/cm$^2$) were 0.90 on the average. Also, Sample A6 exhibited only very slight lowering of device characteristics even before the post-treatment for making short-circuited portions have high resistance.

The photovoltaic devices thus produced (Sample A6) were also subjected to measurement of element distribution as a function of layer thickness by the use of secondary ion mass spectroscopy (SIMS). As a result, it was confirmed that, in the impurity-doped layer in contact with the conductive substrate, the dopant impurity element B (boron) was present in a lower density on the side of the conductive substrate and in a higher density on the side of the substantially intrinsic semiconductor layer.

EXAMPLE A7

This example is different from Example A1 in that photovoltaic devices of nipnip structure comprised of amorphous silicon were continuously produced on a conductive substrate by use of the fabrication apparatus shown in FIG. 17. When they were produced, the impurity-doped layer on the side nearest to the conductive substrate was formed in the two film-forming zones, where the dopant impurity containing gas concentration in the raw material gases was made lower in the film-forming zone for forming the region on the side of the conductive substrate than in the film-forming zone for forming the region on the side of the intrinsic semiconductor layer so that the density of P (phosphorus) as the dopant impurity element of the n-type amorphous silicon layer formed in the film-forming chamber 801A was varied so as to be lower on the side of the conductive substrate.

As the conductive substrate, a substrate was used which was obtained by superposingly forming a 300 nm thick Ag layer and a 1,000 nm thick, transparent and low-resistance ($\rho=1\times10^{-2}$ $\Omega$.cm) ZnO layer on a 0.13 mm thick SUS430BA stainless steel sheet by magnetron sputtering to increase the reflectance and impart fine irregularities to the surface.

Films of the respective layers were formed under conditions shown in Tables A7 and A8.

The same procedures as in Example A1 were repeated except for the foregoing to continuously produce one hundred 30 cm×30 cm photovoltaic devices of nipnip structure (Sample A7). Post-treatment for making short-circuited portions have high resistance was not carried out after the semiconductor multiple layers were formed.

The layer configuration of the produced photovoltaic devices is diagrammatically shown in FIG. 3.

Characteristics of the one hundred 30 cm×30 cm photovoltaic devices thus produced (Sample A7) were measured. When normalized to the characteristics of photovoltaic devices (Standard A7) produced from 1 cm×1 cm portions perfectly free of short-circuited portions due to pinholes and defects, open-circuit voltages of Sample A7 measured under low-illuminance light (AM 1.5, 1 mW/cm$^2$) were 0.80 on average. True conversion efficiencies of Sample A7 under artificial sunlight (AM 1.5, 100 mW/cm$^2$) were 0.90 on average. Also, Sample A7 exhibited only very slight lowering of device characteristics even before the post-treatment for making short-circuited portions have high resistance.

The photovoltaic devices thus produced (Sample A7) were also subjected to measurement of element distribution as a function of layer thickness by the use of secondary ion mass spectroscopy (SIMS). As a result, it was confirmed that, in the impurity-doped layer in contact with the conductive substrate, the dopant impurity element P (phosphorus) was present in a lower density on the side of the conductive substrate and in a higher density on the side of the substantially intrinsic semiconductor layer.

Comparative Example A7

This example is different from Example A7 in that the dopant impurity density in the impurity-doped layer on the side nearest to the conductive substrate was made uniform. That is, the impurity-doped layer on the side nearest to the conductive substrate was formed in one film-forming zone in the fabrication apparatus shown in FIG. 17, where the dopant impurity gas concentration in the raw material gases was not made different between the film-forming zone for forming the region on the side of the intrinsic semiconductor layer and the film-forming zone for forming the region on the side of the conductive substrate.

The same procedures as in Example A7 were repeated except for the foregoing to continuously produce one hundred 30 cm×30 cm photovoltaic devices of nipnip structure (Comparative Sample A7). Post-treatment for making short-circuited portions have high resistance was not carried out after the semiconductor multiple layers were formed.

Characteristics of the one hundred 30 cm×30 cm photovoltaic devices thus produced (Comparative Sample A7) were measured. When normalized to the characteristics of photovoltaic devices (Standard A7) produced from 1 cm×1 cm portions perfectly free of short-circuited portions due to pinholes and defects, open-circuit voltages of Comparative Sample A7 measured under low-illuminance light (AM 1.5, 1 mW/cm$^2$) were 0.15 on average. True conversion efficiencies of Comparative Sample A7 under artificial sunlight (AM 1.5, 100 mW/cm$^2$) were 0.35 on average.

Thus, compared with Sample A7, Comparative Sample A7 was found to exhibit a great lowering of device characteristics.

The photovoltaic devices thus produced were also subjected to measurement of element distribution as a function of layer thickness by the use of secondary ion mass spectroscopy (SIMS). As a result, it was confirmed that, in the impurity-doped layer in contact with the conductive substrate, the dopant impurity element P (phosphorus) was present in a uniform density without difference between the side of the conductive substrate and the side of the substantially intrinsic semiconductor layer.

EXAMPLE A8

In this example, photovoltaic devices of nipnip structure comprised of amorphous silicon were continuously produced on a conductive substrate by use of the fabrication apparatus shown in FIG. 17. When they were produced, the dopant impurity gas concentration with respect to the Si raw material gas was not changed, and the discharge power and the dilution of Si raw material gas with $H_2$ gas were made lower in the film-forming zone for forming the region on the side of the conductive substrate than in the film-forming zone for forming the region on the side of the intrinsic semiconductor layer so that the crystal grain size in the n-type amorphous silicon layer formed in the FIG. 17 film-forming chamber 801A was varied so as to be smaller on the side of the conductive substrate. The present example is different from Example A7 in this regard.

Films of the respective layers were formed under the conditions shown in Tables A9 and A8.

The same procedures as in Example A1 were repeated except for the foregoing to continuously produce one hundred 30 cm×30 cm photovoltaic devices of nipnip structure (Sample A8). Post-treatment for making short-circuited portions have high resistance was not carried out after the semiconductor multiple layers were formed.

The layer configuration of the photovoltaic devices produced is diagrammatically shown in FIG. 3.

Characteristics of the one hundred 30 cm×30 cm photovoltaic devices thus produced (Sample A8) were measured. When normalized to the characteristics of photovoltaic devices (Standard A8) produced from 1 cm×1 cm portions perfectly free of short-circuited portions due to pinholes and defects, open-circuit voltages of Sample A8 measured under low-illuminance light (AM 1.5, 1 mW/cm$^2$) were 0.80 on average. True conversion efficiencies of Sample A8 under artificial sunlight (AM 1.5, 100 mW/cm$^2$) were 0.90 on average. Also, Sample A8 exhibited only very slight lowering of device characteristics even before the post-treatment for making short-circuited portions have high resistance.

Using cross-sectional TEM, the photovoltaic devices thus produced were also subjected to measurement of crystal grain size distribution as a function of layer thickness. As a result, it was confirmed that, in the impurity-doped layer in contact with the conductive substrate, the crystal grain size of Si was smaller on the side of the conductive substrate and larger on the side of the substantially intrinsic semiconductor layer.

Comparative Example A8

This example is different from Example A8 in that the crystal grain size in the impurity-doped layer on the side nearest to the conductive substrate was made uniform. That is, the impurity-doped layer on the side nearest to the conductive substrate was formed in one film-forming zone in the fabrication apparatus shown in FIG. 17, where the crystal grain size was not made different between the region formed on the side of the intrinsic semiconductor layer interface and the region formed on the side of the conductive substrate interface.

The same procedures as in Example A8 except for the foregoing were repeated to continuously produce one hundred 30 cm×30 cm photovoltaic devices of nipnip structure (Comparative Sample A8). Post-treatment for making short-circuited portions have high resistance was not carried out after the multiple semiconductor layers were formed.

Characteristics of the one hundred 30 cm×30 cm photovoltaic devices thus produced (Comparative Sample A8) were measured. When normalized to the characteristics of photovoltaic devices (Standard A8) produced from 1 cm×1 cm portions perfectly free of short-circuited portions due to pinholes and defects, open-circuit voltages of Comparative Sample A8 measured under low-illuminance light (AM 1.5, 1 mW/cm$^2$) were 0.15 on average. True conversion efficiencies of Comparative Sample A8 under artificial sunlight (AM 1.5, 100 mW/cm$^2$) were 0.35 on average.

Thus, compared with Sample A8, Comparative Sample A8 was found to exhibit a great lowering of device characteristics.

Using cross-sectional TEM, the photovoltaic devices thus produced were also subjected to measurement of crystal grain size distribution as a function of layer thickness. As a result, it was confirmed that, in the impurity-doped layer in contact with the conductive substrate, the crystal grain size of Si was not different between the side of the conductive substrate and the side of the substantially intrinsic semiconductor layer, having a uniform distribution.

EXAMPLE A9

This example is different from Example A1 in that photovoltaic devices of nipnipnip structure comprised of amorphous silicon were continuously produced on a conductive substrate by use of the fabrication apparatus shown in FIG. 18. When they were produced, the impurity-doped layer on the side nearest to the conductive substrate was formed in the two film-forming zones, where the dopant impurity gas concentration in the raw material gases was made lower in the film-forming zone for forming the region on the side of the conductive substrate than in the film-forming zone for forming the region on the side of the intrinsic semiconductor layer so that the density of P (phosphorus) as the impurity element of the n-type amorphous silicon layer formed in the film-forming chamber 801A was varied so as to be lower on the side of the conductive substrate.

As the conductive substrate, a substrate was used which was obtained by superposingly forming by magnetron sputtering a 300 nm thick Ag layer and a 1,000 nm thick, transparent and low-resistance ($\rho=1\times10^{-2}$ Ω.cm) ZnO layer on a 0.13 mm thick SUS430BA stainless steel sheet to increase reflectance and impart fine irregularities to the surface.

Films of the respective layers were formed under conditions as shown in Tables A10, A11, and A12.

The same procedures as in Example A1 except for the foregoing were repeated to continuously produce one hundred 30 cm×30 cm photovoltaic devices of nipnipnip structure (Sample A9). Post-treatment for making short-circuited portions have high resistance was not carried out after the semiconductor multiple layers were formed.

The layer configuration of the photovoltaic devices produced is diagrammatically shown in FIG. 5.

Characteristics of the one hundred 30 cm×30 cm photovoltaic devices thus produced (Sample A9) were measured. When normalized to the characteristics of photovoltaic devices (Sample A9) produced from 1 cm×1 cm portions perfectly free of short-circuited portions due to pinholes and defects, open-circuit voltages of Sample A9 measured under low-illuminance light (AM 1.5, 1 mW/cm$^2$) were 0.80 on average. True conversion efficiencies of Sample A9 under artificial sunlight (AM 1.5, 100 mW/cm$^2$) were 0.90 on average. Also, Sample A9 exhibited only very slight lowering of device characteristics even before the post-treatment for making short-circuited portions have high resistance.

The photovoltaic devices produced (Sample A9) were also subjected to measurement of element distribution as a function of layer thickness by the use of secondary ion mass spectroscopy (SIMS). As a result, it was confirmed that, in the impurity-doped layer in contact with the conductive substrate, the dopant impurity element P (phosphorus) was present in a lower density on the side of the conductive substrate and in a higher density on the side of the substantially intrinsic semiconductor layer.

Comparative Example A9

This example is different from Example A9 in that the dopant impurity density in the impurity-doped layer on the side nearest to the conductive substrate was made uniform. That is, the impurity-doped layer on the side nearest to the conductive substrate was formed in one film-forming zone in the fabrication apparatus shown in FIG. 18, where the dopant impurity gas concentration in the raw material gases was not made different between the film-forming zone for forming the region on the side of the intrinsic semiconductor layer and the film-forming zone for forming the region on the side of the conductive substrate.

The same procedures as in Example A9 except for the foregoing were repeated to continuously produce one hundred 30 cm×30 cm photovoltaic devices of nipnipnip structure (Comparative Sample A9). Post-treatment for making short-circuited portions have high resistance was not carried out after the semiconductor multiple layers were formed.

Characteristics of the one hundred 30 cm×30 cm photovoltaic devices thus produced (Comparative Sample A9) were measured. When normalized to the characteristics of photovoltaic devices (Standard A9) produced from 1 cm×1 cm portions perfectly free of short-circuited portions due to pinholes and defects, open-circuit voltages of Comparative Sample A9 measured under low-illuminance light (AM 1.5, 1 mW/cm$^2$) were 0.15 on average. True conversion efficiencies of Comparative Sample A9 under artificial sunlight (AM 1.5, 100 mW/cm$^2$) were 0.35 on average.

Thus, compared with Sample A9, Comparative Sample A9 was found to exhibit a great lowering of device characteristics.

The photovoltaic devices thus produced were also subjected to measurement of element distribution as a function of layer thickness by the use of secondary ion mass spectroscopy (SIMS). As a result, it was confirmed that, in the impurity-doped layer in contact with the conductive substrate, the dopant impurity element P (phosphorus) was present in a uniform density without difference between the side of the conductive substrate and the side of the substantially intrinsic semiconductor layer.

EXAMPLE A10

In this example, photovoltaic devices of nipnipnip structure comprised of amorphous silicon were continuously produced on a conductive substrate by use of the fabrication apparatus shown in FIG. 18. When they were produced, the dopant impurity gas concentration with respect to Si raw material gas was not changed, and the discharge power and the dilution of Si raw material gas with H$_2$ gas were made lower in the film-forming zone for forming the region on the side of the conductive substrate than in the film-forming zone for forming the region on the side of the intrinsic semiconductor layer interface so that the crystal grain size in the n-type amorphous silicon layer formed in the FIG. 18 film-forming chamber 801A was varied so as to be smaller on the side of the conductive substrate. The present example is different from Example A9 in this regard.

Films of the respective layers were formed under conditions as shown in Tables A13, A11, and A12. The same procedures as in Example A1 except for the foregoing were repeated to continuously produce one hundred 30 cm×30 cm photovoltaic devices of nipnipnip structure (Sample A10). Post-treatment for making short-circuited portions have high resistance was not carried out after the semiconductor multiple layers were formed.

The layer configuration of the photovoltaic devices produced is diagrammatically shown in FIG. 5.

Characteristics of the one hundred 30 cm×30 cm photovoltaic devices thus produced (Sample A10) were measured. When normalized by the characteristics of photovoltaic devices (Standard A10) produced from 1 cm×1 cm portions perfectly free of short-circuited portions due to pinholes and defects, open-circuit voltages of Sample A10 measured under low-illuminance light (AM 1.5, 1 mW/cm$^2$) were 0.80 on average. True conversion efficiencies of Sample A10 under artificial sunlight (AM 1.5, 100 mW/cm$^2$) were 0.90 on average. Also, Sample A10 exhibited only very slight lowering of device characteristics even before the post-treatment for making short-circuited portions have high resistance Using cross-sectional TEM, the photovoltaic devices thus produced were also subjected to measurement of crystal grain size distribution as a function of layer thickness. As a result, it was confirmed that, in the impurity-doped layer in contact with the conductive substrate, the crystal grain size of Si was smaller on the side of the conductive substrate and larger on the side of the substantially intrinsic semiconductor layer.

Comparative Example A10

This example is different from Example A10 in that the crystal grain size in the impurity-doped layer on the side nearest to the conductive substrate was made uniform. That is, the impurity-doped layer on the side nearest to the conductive substrate was formed in one film-forming zone in the fabrication apparatus shown in FIG. 18, where the crystal grain size was not made different between the region formed on the side of the intrinsic semiconductor layer and the region formed on the side of the conductive substrate.

The same procedures as in Example A10 except for the foregoing were repeated to continuously produce one hundred 30 cm×30 cm photovoltaic devices of nipnipnip structure (Comparative Sample A10). Post-treatment for making short-circuited portions have high resistance was not carried out after the semiconductor multiple layers were formed.

Characteristics of the one hundred 30 cm×30 cm photovoltaic devices thus produced (Comparative Sample A10) were measured. When normalized to the characteristics of photovoltaic devices (Standard A10) produced from 1 cm×1 cm portions perfectly free of short-circuited portions due to pinholes and defects, open-circuit voltages of Comparative Sample A10 measured under low-illuminance light (AM 1.5, 1 mW/cm$^2$) were 0.15 on average. True conversion efficiencies of Comparative Sample A10 under artificial sunlight (AM 1.5, 100 mW/cm$^2$) were 0.35 on average.

Thus, compared with Working Sample A10, Comparative Sample A10 was found to exhibit a great lowering of device characteristics.

Using cross-sectional TEM, the photovoltaic devices thus produced were also subjected to measurement of crystal grain size distribution as a function of layer thickness. As a result, it was confirmed that, in the impurity-doped layer in contact with the conductive substrate, the crystal grain size of Si was not different between the side of the conductive substrate and the side of the substantially intrinsic semiconductor layer, having a uniform distribution.

EXAMPLE B1

In the present example, photovoltaic devices of nip structure comprised of amorphous silicon were continuously produced on a conductive substrate by use of the fabrication apparatus shown in FIG. 19. The impurity-doped layer on the side nearest to the transparent electrode was formed in the two film-forming zones, where the dopant impurity gas concentration in the raw material gases was made lower in the film-forming zone for forming the region on the side of the transparent electrode than in the film-forming zone for forming the region on the side of the intrinsic semiconductor layer so that the density of B (boron) as the dopant impurity element of the p-type amorphous silicon layer formed in the film-forming chamber 1803 was varied so as to be lower on the side of the transparent electrode. Films were formed under conditions as shown in Table B1.

The fabrication steps will be described below according to their order.

(1) A belt-like substrate 1808 (36 cm wide×50 m long×0.13 mm thick) made of SUS430BA stainless steel was placed in the feed chamber 1805 wound around a bobbin. This belt substrate was passed through the film-forming chambers 1801 to 1803 via the respective gas gates 1807 until it extended to the belt substrate wind-up chamber 1806, and a tension was applied to the substrate to the extent that it did not become loose. In the wind-up chamber 1806, a bobbin around which a well-dried protective film 1809 (36 cm wide×60 m long×0.05 mm thick) made of aramid had been wound was installed so that the protective film was rolled up together with the belt substrate having semiconductor layers formed thereon.

(2) After the belt substrate was thus installed, the interiors of the chambers 1801 to 1806 were evacuated by means of pumps comprised of a combination of a rotary pump and a mechanical booster pump. While successively evacuating them, He gas was fed and the interiors of the respective film-forming chambers were heated to 350° C. in an about 200 Pa atmosphere of He to bake their inner walls.

(3) After the heating and baking, the chambers 1801 to 1806 were evacuated. While successively evacuating them, $H_2$ gas as the gas for preventing film-forming gases from being intermixed in the adjacent film-forming chambers was fed into the gas gates 1807 at a rate of 1,000 sccm for each, and corresponding raw material gases were respectively fed into the film-forming chambers 1801 to 1803 at predetermined flow rates. Then, the openings of throttle valves provided to the exhaust pipes 1812 of the respective chambers were controlled so that the belt substrate feed chamber 1805 and wind-up chamber 1806 were each set at an internal pressure of 125 Pa and the film-forming chambers 1801, 1802 and 1803 each at an internal pressure of 130 Pa.

(4) When the pressure in each chamber had become stable, the wind-up bobbin in the belt substrate wind-up chamber 1806 was rotated to continuously transport the belt substrate 1808 at a constant speed of 100 cm/min so that the belt substrate 1808 moved from the film-forming chamber 1801 toward the chamber 1803. Heaters 1810 connected to temperature control systems (not shown) provided in the film-forming chambers 1801 to 1803 were also operated to control temperatures so that the moving belt substrate was heated to a predetermined temperature in the film-forming space in each film-forming chamber.

(5) When the temperature of the belt substrate had become stable, high-frequency power of 13.56 MHz was applied into the film-forming chambers 1801, 1802 and 1803 through discharge electrodes 1813 provided therein, from corresponding power sources (not shown) via matching devices. Upon application of the discharge power, the raw material gases in the film-forming chambers 1801 to 1803 were changed into plasma, and semiconductor layers were formed on the surface of the belt substrate continuously moving through the respective film-forming chambers, whereby semiconductor layers of nip structure were continuously formed on the surface of the belt substrate.

Film-forming conditions in the film-forming chambers 1801 to 1803 are shown in Table B1.

(6) The belt substrate was moved continuously for 40 minutes after the start of its transport, in the course of which the semiconductor layers were continuously formed for 35 minutes. After the multiple semiconductor layers were formed over a substrate length of about 35 m, the application of discharge power, the feeding of raw material gases and the heating of the belt substrate and film-forming chambers were stopped, and the interiors of the film-forming chambers were purged. After the belt substrate and the insides of the film-forming chambers were well cooled, the apparatus was opened to remove the belt substrate (with semiconductor layers) from the wind-up chamber 1806 to the outside of the apparatus.

(7) The belt substrate thus removed was further continuously processed using a continuous processing apparatus, wherein a 70 nm thick ITO ($In_2O_3$+$SnO_2$) thin film was formed as a transparent electrode over the entire surfaces of the semiconductor layers thus formed, and thin-line Ag electrodes were formed thereon as collector electrodes at given intervals. Thus, one hundred 30 cm×30 cm photovoltaic devices were continuously produced. Post-treatment for making short-circuited portions have high resistance was not carried out after the semiconductor multiple layers were formed.

The layer configuration of the photovoltaic devices produced is diagrammatically shown in FIG. 2.

Characteristics of the one hundred 30 cm×30 cm photovoltaic devices thus produced (Sample B1) were measured. When normalized to the characteristics of photovoltaic devices (Standard B1) produced from 1 cm×1 cm portions perfectly free of short-circuited portions due to pinholes and defects, open-circuit voltages of Sample B1 measured under low-illuminance light (AM 1.5, 1 $mW/cm^2$) were 0.90 on average. True conversion efficiencies of Sample B1 under artificial sunlight (AM 1.5, 100 $mW/cm^2$) were 0.95 on average. Almost no lowering of device characteristics was observed.

The photovoltaic devices thus produced (Sample B1) were also subjected to measurement of element distribution as a function of layer thickness by the use of secondary ion mass spectroscopy (SIMS). As a result, it was confirmed that, in the impurity-doped layer in contact with the transparent electrode, the dopant impurity element B (boron) was present in a lower density on the side of the transparent electrode and in a higher density on the side of the substantially intrinsic semiconductor layer.

Comparative Example B1

This example is different from Example B1 in that the dopant impurity density in the impurity-doped layer on the side nearest to the transparent electrode was made uniform. That is, the impurity-doped layer on the side nearest to the transparent electrode was formed in one film-forming zone in the fabrication apparatus shown in FIG. 19, where the dopant impurity gas concentration in the raw material gases was not made different between the film-forming zone for forming the region on the side of the intrinsic semiconductor layer and the film-forming zone for forming the region on the side of the transparent electrode.

The same procedures as in Example B1 except for the foregoing were repeated to continuously produce one hundred 30 cm×30 cm photovoltaic devices of nip structure (Comparative Sample B1). Post-treatment for making short-circuited portions have high resistance was not carried out after the semiconductor multiple layers were formed.

Characteristics of the one hundred 30 cm×30 cm photovoltaic devices thus produced (Comparative Sample B1) were measured. When normalized to the characteristics of photovoltaic devices (Standard B1) produced from 1 cm×1 cm portions perfectly free of short-circuited portions due to pinholes and defects, open-circuit voltages of Comparative Sample B1 measured under low-illuminance light (AM 1.5, 1 mW/cm$^2$) were 0.13 on average. True conversion efficiencies of Comparative Sample B1 under artificial sunlight (AM 1.5, 100 mW/cm$^2$) were 0.33 on average.

Thus, compared with Working Sample B1, Comparative Sample B1 was found to exhibit a great lowering of device characteristics.

The photovoltaic devices thus produced were also subjected to measurement of element distribution as a function of layer thickness by the use of secondary ion mass spectroscopy (SIMS). As a result, it was confirmed that, in the impurity-doped layer in contact with the transparent electrode, the dopant impurity element B (boron) was present in a uniform density without difference between the side of the transparent electrode and the side of the substantially intrinsic semiconductor layer.

EXAMPLE B2

This example is different from Example B1 in that, in place of nip structure, photovoltaic devices of pin structure were produced. That is, when photovoltaic devices of pin structure comprised of amorphous silicon were continuously produced on a conductive substrate using the fabrication apparatus shown in FIG. 19, the impurity-doped layer on the side nearest to the transparent electrode was formed in the two film-forming zones, where the dopant impurity gas concentration in the raw material gases was made lower in the film-forming zone for forming the region on the side of the transparent electrode than in the film-forming zone for forming the region on the side of the intrinsic semiconductor layer so that the density of P (phosphorus) as the dopant impurity element of the n-type amorphous silicon layer formed in the film-forming chamber 1803 was varied so as to be lower on the side of the transparent electrode.

Films of the respective layers were formed under conditions shown in Table B2.

The same procedures as in Example B1 except for the foregoing were repeated to continuously produce one hundred 30 cm×30 cm photovoltaic devices of pin structure (Sample B2). Post-treatment for making short-circuited portions have high resistance was not carried out after the semiconductor multiple layers were formed.

The layer configuration of the photovoltaic devices produced is diagrammatically shown in FIG. 2.

Characteristics of the one hundred 30 cm×30 cm photovoltaic devices thus produced (Sample B2) were measured. When normalized to the characteristics of photovoltaic devices (Standard B2) produced from 1 cm×1 cm portions perfectly free of short-circuited portions due to pinholes and defects, open-circuit voltages of Sample B2 measured under low-illuminance light (AM 1.5, 1 mW/cm$^2$) were 0.90 on average. True conversion efficiencies of Sample B2 under artificial sunlight (AM 1.5, 100 mW/cm$^2$) were 0.95 on average. Also, practically no lowering of device characteristics was observed.

The photovoltaic devices thus produced (Sample B2) were also subjected to measurement of element distribution as a function of layer thickness by the use of secondary ion mass spectroscopy (SIMS). As a result, it was confirmed that, in the impurity-doped layer in contact with the transparent electrode, the dopant impurity element P (phosphorus) was present in a lower density on the side of the transparent electrode and in a higher density on the side of the substantially intrinsic semiconductor layer.

Comparative Example B2

This example is different from Example B2 in that the dopant impurity density in the impurity-doped layer on the side nearest to the transparent electrode was made uniform. That is, the impurity-doped layer on the side nearest to the transparent electrode was formed in one film-forming zone in the fabrication apparatus shown in FIG. 19, where the dopant impurity gas concentration in the raw material gases was not made different between the film-forming zone for forming the region on the side of the intrinsic semiconductor layer and the film-forming zone for forming the region on the side of the transparent electrode.

The same procedures as in Example B2 except for the foregoing were repeated to continuously produce one hundred 30 cm×30 cm photovoltaic devices of pin structure (Comparative Sample B2). Post-treatment for making short-circuited portions have high resistance was not carried out after the semiconductor multiple layers were formed.

Characteristics of the one hundred 30 cm×30 cm photovoltaic devices thus produced (Comparative Sample B2) were measured. When normalized to the characteristics of photovoltaic devices (Standard B2) produced from 1 cm×1 cm portions perfectly free of short-circuited portions due to pinholes and defects, open-circuit voltages of Comparative Sample B2 measured under low-illuminance light (AM 1.5, 1 mW/cm$^2$) were 0.15 on average. True conversion efficiencies of Comparative Sample B2 under artificial sunlight (AM 1.5, 100 mW/cm$^2$) were 0.35 on average.

Thus, compared with Sample B2, Comparative Sample B2 was found to exhibit a great lowering of device characteristics.

The photovoltaic devices thus produced were also subjected to measurement of element distribution as a function of layer thickness by the use of secondary ion mass spectroscopy (SIMS). As a result, it was confirmed that, in the impurity-doped layer in contact with the transparent electrode, the dopant impurity element P (phosphorus) was present in a uniform density without difference between the side of the transparent electrode and the side of the substantially intrinsic semiconductor layer.

EXAMPLE B3

In the present example, photovoltaic devices of nip structure comprised of amorphous silicon were continuously produced on a conductive substrate by use of the fabrication apparatus shown in FIG. 19. When they were produced, the dopant impurity gas concentration with respect to the Si containing raw material gas was not changed, and the discharge power and the dilution of Si raw material gas with H$_2$ gas were made lower in the film-forming zone for forming the region on the side of the transparent electrode than in the film-forming zone for forming the region on the side of the intrinsic semiconductor layer so that the crystal grain size in the p-type amorphous silicon layer formed in the film-forming chamber 1803 was varied so as to be smaller on the side of the transparent electrode. The present example is different from Example B1 in this regard.

Films of the respective layers were formed under the conditions shown in Table B3.

The same procedure as in Example B1 except for the foregoing was repeated to continuously produce one hundred 30 cm×30 cm photovoltaic devices of nip structure (Sample B3). Post-treatment for making short-circuited portions have high resistance was not carried out after the semiconductor multiple layers were formed.

The layer configuration of the photovoltaic devices thus produced is diagrammatically shown in FIG. 2.

Characteristics of the one hundred 30 cm×30 cm photovoltaic devices thus produced (Sample B3) were measured. When normalized to the characteristics of photovoltaic devices (Standard B3) produced from 1 cm×1 cm portions perfectly free of short-circuited portions due to pinholes and defects, open-circuit voltages of Sample B3 measured under low-illuminance light (AM 1.5, 1 mW/cm$^2$) were 0.88 on average. True conversion efficiencies of Sample B3 under artificial sunlight (AM 1.5, 100 mW/cm$^2$) were 0.95 on average. Also, practically no lowering of device characteristics was seen.

Using cross-sectional TEM, the photovoltaic devices thus produced were also subjected to measurement of crystal grain size distribution as a function of layer thickness. As a result, it was confirmed that, in the impurity-doped layer in contact with the transparent electrode, the crystal grain size of Si was smaller on the side of the transparent electrode and larger on the side of the substantially intrinsic semiconductor layer.

Comparative Example B3

This example is different from Example B3 in that the crystal grain size in the impurity-doped layer on the side nearest to the transparent electrode was made uniform. That is, the impurity-doped layer on the side nearest to the transparent electrode was formed in one film-forming zone in the fabrication apparatus shown in FIG. 19, where the crystal grain size was not made different between the film-forming zone for forming the region on the side of the intrinsic semiconductor layer and the film-forming zone for forming the region on the side of the transparent electrode.

The same procedures as in Example B3 except for the foregoing were repeated to continuously produce one hundred 30 cm×30 cm photovoltaic devices of nip structure (Comparative Sample B3). Post-treatment for making short-circuited portions have high resistance was not carried out after the semiconductor multiple layers were formed.

Characteristics of the one hundred 30 cm×30 cm photovoltaic devices thus produced (Comparative Sample B3) were measured. When normalized to the characteristics of photovoltaic devices (Standard B3) produced from 1 cm×1 cm portions perfectly free of short-circuited portions due to pinholes and defects, open-circuit voltages of Comparative Sample B3 measured under low-illuminance light (AM 1.5, 1 mW/cm$^2$) were 0.13 on average. True conversion efficiencies of Comparative Sample B3 under artificial sunlight (AM 1.5, 100 mW/cm$^2$) were 0.33 on average.

Thus, compared with Sample B3, Comparative Sample B3 was found to exhibit a great lowering of device characteristics.

Using cross-sectional TEM, the photovoltaic devices thus produced were also subjected to measurement of crystal grain size distribution as a function of layer thickness. As a result, it was confirmed that, in the impurity-doped layer in contact with the transparent electrode, the crystal grain size of Si was identical between the side of the transparent electrode and the side of the substantially intrinsic semiconductor layer.

EXAMPLE B4

This example is different from Example B3 in that, in place of nip structure, photovoltaic devices of pin structure were produced. That is, when photovoltaic devices of pin structure comprised of amorphous silicon were continuously produced on a conductive substrate by use of the fabrication apparatus shown in FIG. 19, the impurity-doped layer on the side nearest to the transparent electrode was formed in the two film-forming zones, the dopant impurity gas concentration with respect to the Si containing raw material gas was not changed, and the discharge power and the dilution of Si raw material gas with H$_2$ gas were made lower in the film-forming zone for forming the region on the side of the transparent electrode than in the film-forming zone for forming the region on the side of the intrinsic semiconductor layer so that the crystal grain size in the n-type amorphous silicon layer formed in the film-forming chamber 1803 was varied so as to be smaller on the side of the transparent electrode.

Films of the respective layers were formed under conditions as shown in Table B4.

The same procedures as in Example B1 except for the foregoing were repeated to continuously produce one hundred 30 cm×30 cm photovoltaic devices of pin structure (Sample B4). Post-treatment for making short-circuited portions have high resistance was not carried out after the semiconductor multiple layers were formed.

The layer configuration of the photovoltaic devices thus produced is diagrammatically shown in FIG. 2.

Characteristics of the one hundred 30 cm×30 cm photovoltaic devices thus produced (Sample B4) were measured. When normalized to the characteristics of photovoltaic devices (Standard B4) produced from 1 cm×1 cm portions perfectly free of short-circuited portions due to pinholes and defects, open-circuit voltages of Sample B4 measured under low-illuminance light (AM 1.5, 1 mW/cm$^2$) were 0.88 on average. True conversion efficiencies of Sample B4 under artificial sunlight (AM 1.5, 100 mW/cm$^2$) were 0.95 on average. Also, practically no lowering of device characteristics was seen.

Using cross-sectional TEM, the photovoltaic devices thus produced were also subjected to measurement of crystal grain size distribution as a function of layer thickness. As a result, it was confirmed that, in the impurity-doped layer in contact with the transparent electrode, the crystal grain size of Si was smaller on the side of the transparent electrode and larger on the side of the substantially intrinsic semiconductor layer.

Comparative Example B4

This example is different from Example B4 in that the crystal grain size in the impurity-doped layer on the side nearest to the transparent electrode was made uniform. That is, the impurity-doped layer on the side nearest to the transparent electrode was formed in one film-forming zone in the fabrication apparatus shown in FIG. 19, where the crystal grain size was not made different between the film-forming zone for forming the region on the side of the intrinsic semiconductor layer and the film-forming zone for forming the region on the side of the transparent electrode.

The same procedures as in Example B4 except for the foregoing were repeated to continuously produce one hundred 30 cm×30 cm photovoltaic devices of pin structure (Comparative Sample B4). Post-treatment for making short-circuited portions have high resistance was not carried out after the semiconductor multiple layers were formed.

Characteristics of the one hundred 30 cm×30 cm photovoltaic devices thus produced (Comparative Sample B4) were measured. When normalized to the characteristics of photovoltaic devices (Standard B4) produced from 1 cm×1 cm portions perfectly free of short-circuited portions due to pinholes and defects, open-circuit voltages of Comparative Sample B4 measured under low-illuminance light (AM 1.5, 1 mW/cm$^2$) were 0.13 on average. True conversion efficiencies of Comparative Sample B4 under artificial sunlight (AM 1.5, 100 mW/cm$^2$) were 0.33 on average.

Thus, compared with Working Sample B4, Comparative Sample B4 was found to exhibit a great lowering of device characteristics.

Using cross-sectional TEM, the photovoltaic devices thus produced were also subjected to measurement of crystal grain size distribution as a function of layer thickness. As a result, it was confirmed that, in the impurity-doped layer in contact with the transparent electrode, the crystal grain size of Si was identical between the side of the transparent electrode and the side of the substantially intrinsic semiconductor layer.

EXAMPLE B5

This example is different from Example B4 in that the dopant impurity density and crystal grain size in the impurity-doped layer on the side nearest to the transparent electrode were made smaller on the side of the transparent electrode. That is, when photovoltaic devices of pin structure comprised of amorphous silicon were continuously produced on a conductive substrate by use of the fabrication apparatus shown in FIG. 19, the impurity-doped layer on the side nearest to the transparent electrode was formed in the two film-forming zones, and the impurity concentration, discharge power, and the dilution of Si material gas with H$_2$ gas were made lower in the film-forming zone for forming the region on the side of the transparent electrode than in the film-forming zone for forming the region on the side of the intrinsic semiconductor layer so that the dopant impurity density and crystal grain size in the n-type amorphous silicon layer formed in the film-forming chamber 1803 were varied so as to be smaller on the side of the transparent electrode.

Films of the respective layers were formed under the conditions shown in Table B5.

The same procedures as in Example B1 except for the foregoing were repeated to continuously produce one hundred 30 cm×30 cm photovoltaic devices of pin structure (Sample B5). Post-treatment for making short-circuited portions have high resistance was not carried out after the semiconductor multiple layers were formed.

The layer configuration of the photovoltaic devices thus produced is diagrammatically shown in FIG. 2.

Characteristics of the one hundred 30 cm×30 cm photovoltaic devices thus produced (Sample B5) were measured. When normalized to the characteristics of photovoltaic devices (Sample B5) produced from 1 cm×1 cm portions perfectly free of short-circuited portions due to pinholes and defects, open-circuit voltages of Sample B5 measured under low-illuminance light (AM 1.5, 1 mW/cm$^2$) were 0.91 on average. True conversion efficiencies of Sample B5 under artificial sunlight (AM 1.5, 100 mW/cm$^2$) were 0.97 on average. Also, practically no lowering of device characteristics was seen.

The photovoltaic devices thus produced (Sample B5) were also subjected to measurement of element distribution as a function of layer thickness by the use of secondary ion mass spectroscopy (SIMS). As a result, it was confirmed that, in the impurity-doped layer in contact with the transparent electrode, the dopant impurity element P (phosphorus) was present in a lower density on the side of the transparent electrode and in a higher density on the side of the substantially intrinsic semiconductor layer.

Using cross-sectional TEM, the photovoltaic devices thus produced were further subjected to measurement of crystal grain size distribution as a function of layer thickness. As a result, it was confirmed that, in the dopant impurity-doped layer in contact with the transparent electrode, the crystal grain size of Si was smaller on the side of the transparent electrode and larger on the side of the substantially intrinsic semiconductor layer.

EXAMPLE B6

This example is different from Example B4 in that the dopant impurity density in the impurity-doped layer on the side nearest to the transparent electrode was made lower on the side of the transparent electrode. That is, when photovoltaic devices of pin structure comprised of amorphous silicon were continuously produced on a conductive substrate by use of the fabrication apparatus shown in FIG. 19, the impurity-doped layer on the side nearest to the transparent electrode was formed in the two film-forming zones, and the dopant impurity gas concentration in the raw material gases was made lower in the film-forming zone for forming the region on the side of the transparent electrode than in the film-forming zone for forming the region on the side of the intrinsic semiconductor layer so that the density of P (phosphorus) as the dopant impurity element of the n-type amorphous silicon layer formed in the film-forming chamber 1803 was varied so as to be lower on the side of the transparent electrode.

Films of the respective layers were formed under conditions as shown in Table B6.

The same procedures as in Example B1 except for the foregoing were repeated to continuously produce one hundred 30 cm×30 cm photovoltaic devices of pin structure (Sample B6). Post-treatment for making short-circuited portions have high resistance was not carried out after the semiconductor multiple layers were formed.

The layer configuration of the photovoltaic devices thus produced is diagrammatically shown in FIG. 2.

Characteristics of the one hundred 30 cm×30 cm photovoltaic devices thus produced (Sample B6) were measured. When normalized to the characteristics of photovoltaic devices (Standard B6) produced from 1 cm×1 cm portions perfectly free of short-circuited portions due to pinholes and defects, open-circuit voltages of Sample B6 measured under low-illuminance light (AM 1.5, 1 mW/cm$^2$) were 0.90 on average. True conversion efficiencies of Sample B6 under artificial sunlight (AM 1.5, 100 mW/cm$^2$) were 0.95 on average. Also, practically no lowering of device characteristics was seen.

The photovoltaic devices thus produced (Sample B6) were also subjected to measurement of element distribution as a function of layer thickness by the use of secondary ion mass spectroscopy (SIMS). As a result, it was confirmed that, in the impurity-doped layer in contact with the transparent electrode, the dopant impurity element P (phosphorus) was present in a lower density on the side of the transparent electrode and in a higher density on the side of the substantially intrinsic semiconductor layer.

EXAMPLE B7

This example is different from Example B1 in that photovoltaic devices of nipnip structure comprised of amorphous silicon were continuously produced on a conductive substrate by use of the fabrication apparatus shown in FIG. 21. When they were produced, the impurity-doped layer on the side nearest to the transparent electrode was formed in the two film-forming zones, where the dopant impurity gas concentration in the raw material gases was made lower in the film-forming zone for forming the region on the side of the transparent electrode than in the film-forming zone for forming the region on the side of the intrinsic semiconductor layer so that the density of B (boron) as the dopant impurity element of the p-type amorphous silicon layer formed in the film-forming chamber 1803B was varied so as to be lower on the side of the transparent electrode.

As the conductive substrate, a substrate was used which was obtained by superposingly forming by magnetron sputtering a 300 nm thick Ag layer and a 1,000 nm thick, transparent, and low-resistance ($\rho=1\times10^{-2}$ $\Omega$.cm) Zno layer on a 0.13 mm thick SUS430BA stainless steel sheet to increase the reflectance and impart fine irregularities to the surface.

Films of the respective layers were formed under conditions as shown in Tables B7 and B8.

The same procedures as in Example B1 except for the foregoing were repeated to continuously produce one hundred 30 cm×30 cm photovoltaic devices of nipnip structure (Sample B7). Post-treatment for making short-circuited portions have high resistance was not carried out after the semiconductor multiple layers were formed.

The layer configuration of the photovoltaic devices thus produced is diagrammatically shown in FIG. 4.

Characteristics of the one hundred 30 cm×30 cm photovoltaic devices thus produced (Sample B7) were measured. When normalized to the characteristics of photovoltaic devices (Standard B7) produced from 1 cm×1 cm portions perfectly free of short-circuited portions due to pinholes and defects, open-circuit voltages of Sample B7 measured under low-illuminance light (AM 1.5, 1 mW/cm$^2$) were 0.90 on average. True conversion efficiencies of Sample B7 under artificial sunlight (AM 1.5, 100 mW/cm2) were 0.95 on average. Also, Sample B7 exhibited only very slight lowering of device characteristics even before the post-treatment for making short-circuited portions have high resistance.

The photovoltaic devices thus produced (Sample B7) were also subjected to measurement of element distribution as a function of layer thickness by the use of secondary ion mass spectroscopy (SIMS). As a result, it was confirmed that, in the dopant impurity-doped layer in contact with the transparent electrode, the dopant impurity element B (boron) was present in a lower density on the side of the transparent electrode and in a higher density on the side of the substantially intrinsic semiconductor layer.

Comparative Example B7

This example is different from Example B7 in that the dopant impurity density in the impurity-doped layer on the side nearest to the transparent electrode was made uniform. That is, the impurity-doped layer on the side nearest to the transparent electrode was formed in one film-forming zone in the fabrication apparatus shown in FIG. 21, where the dopant impurity gas concentration in the raw material gases was not made different between the film-forming zone for forming the region on the side of the intrinsic semiconductor layer and the film-forming zone for forming the region on the side of the transparent electrode.

The same procedures as in Example B7 except for the foregoing were repeated to continuously produce one hundred 30 cm×30 cm photovoltaic devices of nipnip structure (Comparative Sample B7). Post-treatment for making short-circuited portions have high resistance was not carried out after the semiconductor multiple layers were formed.

Characteristics of the one hundred 30 cm×30 cm photovoltaic devices thus produced (Comparative Sample B7) were measured. When normalized to the characteristics of photovoltaic devices (Standard Sample B7) produced from 1 cm×1 cm portions perfectly free of short-circuited portions due to pinholes and defects, open-circuit voltages of Comparative Sample B7 measured under low-illuminance light (AM 1.5, 1 mW/cm2) were 0.15 on average. True conversion efficiencies of Comparative Sample B7 under artificial sunlight (AM 1.5, 100 mW/cm$^2$) were 0.35 on average.

Thus, compared with Sample B7, Comparative Sample B7 was found to exhibit a great lowering of device characteristics.

The photovoltaic devices thus produced were also subjected to measurement of element distribution as a function of layer thickness by the use of secondary ion mass spectroscopy (SIMS). As a result, it was confirmed that, in the impurity-doped layer in contact with the transparent electrode, the dopant impurity element B (boron) was present in a uniform density without difference between the side of the transparent electrode and the side of the substantially intrinsic semiconductor layer.

EXAMPLE B8

In this example, photovoltaic devices of nipnip structure comprised of amorphous silicon were continuously produced on a conductive substrate by use of the fabrication apparatus shown in FIG. 21. When they were produced, the dopant impurity gas concentration with respect to the Si containing raw material gas was not changed, and the discharge power and the dilution of Si raw material gas with H$_2$ gas were made lower in the film-forming zone for forming the region on the side of the transparent electrode than in the film-forming zone for forming the region on the side of the intrinsic semiconductor layer so that the crystal grain size in the p-type amorphous silicon layer formed in the FIG. 21 film-forming chamber 1803B was varied so as to be smaller on the side of the transparent electrode. The present example is different from Example B7 in this regard.

Films of the respective layers were formed under conditions as shown in Tables B7 and B9.

The same procedures as in Example B1 except for the foregoing were repeated to continuously produce one hundred 30 cm×30 cm photovoltaic devices of nipnip structure (Sample B8). Post-treatment for making short-circuited portions have high resistance was not carried out after the semiconductor multiple layers were formed.

The layer configuration of the photovoltaic devices thus produced is diagrammatically shown in FIG. 4.

Characteristics of the one hundred 30 cm×30 cm photovoltaic devices thus produced (Sample B8) were measure.

When normalized to the characteristics of photovoltaic devices (Standard B8) produced from 1 cm×1 cm portions perfectly free of short-circuited portions due to pinholes and defects, open-circuit voltages of Sample B8 measured under low-illuminance light (AM 1.5, 1 mW/cm$^2$) were 0.90 on average. True conversion efficiencies of Sample B8 under artificial sunlight (AM 1.5, 100 mW/cm$^2$) were 0.95 on average. Also, Sample B8 exhibited only very slight lowering of device characteristics even before the post-treatment for making short-circuited portions have high resistance.

Using cross-sectional TEM, the photovoltaic devices thus produced were also subjected to measurement of crystal grain size distribution as a function of layer thickness. As a result, it was confirmed that, in the impurity-doped layer in contact with the transparent electrode, the crystal grain size of Si was smaller on the side of the transparent electrode and larger on the side of the substantially intrinsic semiconductor layer.

Comparative Example B8

This example is different from Example B8 in that the crystal grain size in the impurity-doped layer on the side nearest to the transparent electrode was made uniform. That is, the impurity-doped layer on the side nearest to the transparent electrode was formed in one film-forming zone in the fabrication apparatus shown in FIG. 21, where the crystal grain size was not made different between the region formed on the side of the intrinsic semiconductor layer interface and the region formed on the side of the transparent electrode interface.

The same procedures as in Example B8 except for the foregoing were repeated to continuously produce one hundred 30 cm×30 cm photovoltaic devices of nipnip structure (Comparative Sample B8). Post-treatment for making short-circuited portions have high resistance was not carried out after the semiconductor multiple layers were formed.

Characteristics of the one hundred 30 cm×30 cm photovoltaic devices thus produced (Comparative Sample B8) were measured. When normalized to the characteristics of photovoltaic devices Standard B8) produced from 1 cm×1 cm portions perfectly free of short-circuited portions due to pinholes and defects, open-circuit voltages of Comparative Sample B8 measured under low-illuminance light (AM 1.5, 1 mW/cm$_2$) were 0.15 on average. True conversion efficiencies of Comparative Sample B8 under artificial sunlight (AM 1.5, 100 mW/cm$^2$) were 0.35 on average.

Thus, compared with Sample B8, Comparative Sample B8 was found to exhibit a great lowering of device characteristics.

Using cross-sectional TEM, the photovoltaic devices thus produced were also subjected to measurement of crystal grain size distribution as a function of layer thickness. As a result, it was confirmed that, in the impurity-doped layer in contact with the transparent electrode, the crystal grain size of Si was not different between the side of the transparent electrode and the side of the substantially intrinsic semiconductor layer, having a uniform distribution.

EXAMPLE B9

This example is different from Example B1 in that photovoltaic devices of nipnipnip structure comprised of amorphous silicon were continuously produced on a conductive substrate by use of the fabrication apparatus shown in FIG. 22. When they were produced, the impurity-doped layer on the side nearest to the transparent electrode was formed in the two film-forming zones, where the dopant impurity gas concentration in the raw material gases was made lower in the film-forming zone for forming the region on the side of the transparent electrode than in the film-forming zone for forming the region on the side of the intrinsic semiconductor layer so that the density of B (boron) as the dopant impurity element of the n-type amorphous silicon layer formed in the film-forming chamber 1803C was varied so as to be lower on the side of the transparent electrode.

As the transparent electrode, a substrate was used which was obtained by superposingly forming by magnetron sputtering a 300 nm thick Ag layer and a 1,000 nm thick, transparent and low-resistance ($\rho=1\times10^{-2}$ $\Omega$.cm) ZnO layer on a 0.13 mm thick SUS430BA stainless steel sheet to increase the reflectance and impart fine irregularities to the surface.

Films of the respective layers were formed under the conditions shown in Tables B10, B11 and B12.

The same procedure as in Example B1 except for the foregoing were repeated to continuously produce one hundred 30 cm×30 cm photovoltaic devices of nipnipnip structure (Sample B9). Post-treatment for making short-circuited portions have high resistance was not carried out after the semiconductor multiple layers were formed.

The layer configuration of the photovoltaic devices thus produced is diagrammatically shown in FIG. 6.

Characteristics of the one hundred 30 cm×30 cm photovoltaic devices thus produced (Sample B9) were measured. When normalized to the characteristics of photovoltaic devices (Standard B9) produced from 1 cm×1 cm portions perfectly free of short-circuited portions due to pinholes and defects, open-circuit voltages of Sample B9 measured under low-illuminance light (AM 1.5, 1 mW/cm$^2$) were 0.92 on average. True conversion efficiencies of Sample B9 under artificial sunlight (AM 1.5, 100 mW/cm$^2$) were 0.97 on average. Also, practically no lowering of device characteristics was seen.

The photovoltaic devices thus produced (Sample B9) were also subjected to measurement of element distribution as a function of layer thickness by the use of secondary ion mass spectroscopy (SIMS). As a result, it was confirmed that, in the impurity-doped layer in contact with the transparent electrode, the dopant impurity element B (boron) was present in a lower density on the side of the transparent electrode and in a higher density on the side of the substantially intrinsic semiconductor layer.

Comparative Example B9

This example is different from Example B9 in that the dopant impurity density in the impurity-doped layer on the side nearest to the transparent electrode was made uniform. That is, the impurity-doped layer on the side nearest to the transparent electrode was formed in one film-forming zone in the fabrication apparatus shown in FIG. 22, where the dopant impurity gas concentration in the raw material gases was not made different between the film-forming zone for forming the region on the side of the intrinsic semiconductor layer interface and the film-forming zone for forming the region on the side of the transparent electrode interface.

The same procedures as in Example B9 except for the foregoing were repeated to continuously produce one hundred 30 cm×30 cm photovoltaic devices of nipnipnip structure (Comparative Sample B9). Post-treatment for making short-circuited portions have high resistance was not carried out after the semiconductor multiple layers were formed.

Characteristics of the one hundred 30 cm×30 cm photovoltaic devices thus produced (Comparative Sample B9)

were measured. When normalized to the characteristics of photovoltaic devices (Standard B9) produced from 1 cm×1 cm portions perfectly free of short-circuited portions due to pinholes and defects, open-circuit voltages of Comparative Sample B9 measured under low-illuminance light (AM 1.5, 1 mW/cm$^2$) were 0.15 on average. True conversion efficiencies of Comparative Sample B9 under artificial sunlight (AM 1.5, 100 mW/cm$^2$) were 0.35 on average.

Thus, compared with Sample B9, Comparative Sample B9 was found to exhibit a great lowering of device characteristics.

The photovoltaic devices thus produced were also subjected to measurement of element distribution as a function of layer thickness by the use of secondary ion mass spectroscopy (SIMS). As a result, it was confirmed that, in the impurity-doped layer in contact with the transparent electrode, the dopant impurity element B (boron) was present in a uniform density without difference between the side of the transparent electrode and the side of the substantially intrinsic semiconductor layer.

EXAMPLE B10

In this example, photovoltaic devices of nipnipnip structure comprised of amorphous silicon were continuously produced on a conductive substrate by use of the fabrication apparatus shown in FIG. 22.

When they were produced, the dopant impurity gas concentration with respect to the Si containing raw material gas was not changed, and the discharge power and the dilution of Si material gas with H$_2$ gas were made lower in the film-forming zone for forming the region on the side of the transparent electrode than in the film-forming zone for forming the region on the side of the intrinsic semiconductor layer so that the crystal grain size in the n-type amorphous silicon layer formed in the FIG. 22 film-forming chamber 1803C was varied so as to be smaller on the side of the transparent electrode. The present example is different from Example B9 in this regard.

Films of the respective layers were formed under conditions shown in Tables B10, B11, and B13.

The same procedures as in Example B1 except for the foregoing were repeated to continuously produce one hundred 30 cm×30 cm photovoltaic devices of nipnipnip structure (Sample B10). Post-treatment for making short-circuited portions have high resistance was not carried out after the semiconductor multiple layers were formed.

The layer configuration of the photovoltaic devices thus produced is diagrammatically shown in FIG. 6.

Characteristics of the one hundred 30 cm×30 cm photovoltaic devices thus produced (Sample B10) were measured. When normalized to the characteristics of photovoltaic devices (Standard B10) produced from 1 cm×1 cm portions perfectly free of short-circuited portions due to pinholes and defects, open-circuit voltages of Sample B10 measured under low-illuminance light (AM 1.5, 1 mW/cm$^2$) were 0.90 on average. True conversion efficiencies of Sample B10 under artificial sunlight (AM 1.5, 100 mW/cm$^2$) were 0.95 on average. Also, almost no lowering of device characteristics was seen.

Using cross-sectional TEM, the photovoltaic devices thus produced were also subjected to measurement of crystal grain size distribution as a function of layer thickness. As a result, it was confirmed that, in the impurity-doped layer in contact with the transparent electrode, the crystal grain size of Si was smaller on the side of the transparent electrode and larger on the side of the substantially intrinsic semiconductor layer.

Comparative Example B10

This example is different from Example B10 in that the crystal grain size in the impurity-doped layer on the side nearest to the transparent electrode was made uniform. That is, the impurity-doped layer on the side nearest to the transparent electrode was formed in one film-forming zone in the fabrication apparatus shown in FIG. 22, where the crystal grain size was not made different between the region formed on the side of the intrinsic semiconductor layer and the region formed on the side of the transparent electrode interface.

The same procedures as in Example B10 except for the foregoing were repeated to continuously produce one hundred 30 cm×30 cm photovoltaic devices of nipnipnip structure (Comparative Sample B10). Post-treatment for making short-circuited portions have high resistance was not carried out after the semiconductor multiple layers were formed.

Characteristics of the one hundred 30 cm×30 cm photovoltaic devices thus produced (Comparative Sample B10) were measured. When normalized to the characteristics of photovoltaic devices (Standard B10) produced from 1 cm×1 cm portions perfectly free of short-circuited portions due to pinholes and defects, open-circuit voltages of Comparative Sample B10 measured under low-illuminance light (AM 1.5, 1 mW/cm$^2$) were 0.15 on average. True conversion efficiencies of Comparative Sample B10 under artificial sunlight (AM 1.5, 100 mW/cm$^2$) were 0.35 on average.

Thus, compared with Sample B10, Comparative Sample B10 was found to exhibit a great lowering of device characteristics.

Using cross-sectional TEM, the photovoltaic devices thus produced were also subjected to measurement of crystal grain size distribution as a function of layer thickness. As a result, it was confirmed that, in the impurity-doped layer in contact with the transparent electrode, the crystal grain size of Si was not different between the side of the transparent electrode and the side of the substantially intrinsic semiconductor layer, having a uniform distribution.

As described above, the present invention makes it possible to obtain a photovoltaic device comprised of silicon type non-single-crystal semiconductor, that does not experience significant lowering of characteristics even when short circuits locally occur in semiconductor layers during long-term service, has a long-term reliability, and can achieve such advantages without complicating the fabrication process.

Needless to say, the present invention is by no means limited to the above description and Examples, and can be appropriately modified and combined within the spirit of the present invention.

TABLE A1

| | Film-forming chambers | | | |
|---|---|---|---|---|
| Film forming conditions | 801 (Conductive substrate interface adjacent region)*1 | 801 (intrinsic semiconductor layer interface adjacent region)*2 | 802 | 803 |
| Formed by: | HF-PCVD | HF-PCVD | HF-PCVD | HF-PCVD |
| Semiconductor Layer formed: | n-Type a-Si P density: | n-Type a-Si | i-Type a-Si | i-Type a-Si |
| | (lower) | (higher) | | |
| Thickness: (nm) | 30 | 30 | 300 | 10 |
| Raw Material gases: (sccm) | $SiH_4$ 200] $H_2$ 2,000 $PH_3$ 0.4 ($PH_3/SiH_4$ = 0.2%) | $SiH_4$ 200 $H_2$ 2,000 $PH_3$ 4 ($PH_3/SiH_4$ 0.4 = 2%) | $SiH_4$ 600 $H_2$ 6,000 | $SiH_4$ 10 $H_2$ 3,000 $BF_3$ 0.2 |
| Film-forming chamber internal pressure: (Pa) | 130 | 130 | 130 | 130 |
| Substrate temp.: (°C.) | 270 | 270 | 220 | 170 |
| Discharge power: (W) | 200 (13.56 MHz) | 200 (13.56 MHz) | 1,200 (13.56 MHz) | 2,000 (13.56 MHz) |

*1 The region adjacent to the interface with the conductive substrate is referred to as "conductive substrate interface adjacent region".
*2 The region adjacent to the interface with the intrinsic semiconductor layer is referred to as "intrinsic semiconductor layer interface adjacent region".

TABLE A2

| | Film-forming chambers | | | |
|---|---|---|---|---|
| Film forming conditions | 801 (Conductive substrate interface adjacent region) | 801 (Intrinsic semiconductor layer interface adjacent region) | 802 | 803 |
| Formed by: | HF-PCVD | HF-PCVD | HF-PCVD | HF-PCVD |
| Semiconductor Layer formed: | p-Type a-Si B density: | p-Type a-Si | i-Type a-Si | n-Type a-Si |
| | (lower) | (higher) | | |
| Thickness: (nm) | 30 | 30 | 300 | 10 |
| Raw Material gases: (sccm) | $SiH_4$ 200 $H_2$ 2,000 $BF_3$ 0.4 ($BH_3/SiH_4$= 0.2%) | $SiH_4$ 200 $H_2$ 2,000 $BF_3/SiH_4$ 4 ($BF_3$ 0.4 = 2%) | $SiH_4$ 600 $H_2$ 6,000 | $SiH_4$ 10 $H_2$ 3,000 $PH_3$ 0.2 |
| Film-forming chamber internal pressure: (Pa) | 130 | 130 | 130 | 130 |
| Substrate temp.: (°C.) | 270 | 270 | 220 | 170 |
| Discharge power: (W) | 200 (13.56 MHz) | 200 (13.56 MHz) | 1,200 (13.56 MHz) | 1,000 (13.56 MHz) |

TABLE A3

| Film forming conditions | Film-forming chambers | | | |
|---|---|---|---|---|
| | 801 (Conductive substrate interface adjacent region) | 801 (Intrinsic semiconductor layer interface adjacent region) | 802 | 803 |
| Formed by: | HF-PCVD | HF-PCVD | HF-PCVD | HF-PCVD |
| Semiconductor Layer formed: | n-Type a-Si Crystal grain size: (smaller) | n-Type a-Si (larger) | i-Type a-Si | p-Type a-Si |
| Thickness: (nm) | 30 | 30 | 300 | 10 |
| Raw Material gases: (sccm) | $SiH_4$ 200 $H_2$ 2,000 $BF_3$ 1 ($BF_3/SiH_4$ = 0.5%) | $SiH_4$ 20 $H_2$ 5,000 $PH_3$ 0.1 ($BF_3/SiH_4$ = 0.5%) | $SiH_4$ 600 $H_2$ 6,000 | $SiH_4$ 10 $H_2$ 3,000 $PH_3$ 0.2 |
| Film-forming chamber internal pressure: (Pa) | 130 | 130 | 130 | 130 |
| Substrate temp.: (°C.) | 270 | 270 | 220 | 170 |
| Discharge power: (W) | 200 (13.56 MHz) | 5,000 (13.56 MHz) | 1,200 (13.56 MHz) | 1,000 (13.56 MHz) |

TABLE A4

| Film forming conditions | Film-forming chambers | | | |
|---|---|---|---|---|
| | 801 (Conductive substrate interface adjacent region) | 801 (Intrinsic semiconductor layer interface adjacent region) | 802 | 803 |
| Formed by: | HF-PCVD | HF-PCVD | HF-PCVD | HF-PCVD |
| Semiconducor layer formed: | p-Type a-Si Crystal grain size: (smaller) | p-Type a-Si (larger) | i-Type a-Si | n-Type a-Si |
| Thickness: (nm) | 30 | 30 | 300 | 10 |
| Raw Material gases: (sccm) | $SiH_4$ 200 $H_2$ 2,000 $BF_3$ 1 ($BF_3/SiH_4$ = .5%) | $SiH_4$ 20 $H_2$ 5,000 $BF_3$ 0.1 ($BF_3/SiH_4$ 0.5%) | $SiH_4$ 600 $H_2$ 6,000 | $SiH_4$ 10 $H_2$ 3,000 $BF_3$ 0.2 |
| Film-forming chamber internal pressure: (Pa) | 130 | 130 | 130 | 130 |
| Substrate temp.: (°C.) | 270 | 270 | 220 | 170 |
| Discharge power: (W) | 200 (13.56 MHz) | 5,000 (13.56 MHz) | 1,200 (13.56 MHz) | 2,000 (13.56 MHz) |

TABLE A5

| Film forming conditions | Film-forming chambers | | | |
|---|---|---|---|---|
| | 801 (Conductive substrate interface adjacent region) | 801 (Intrinsic semiconductor layer interface adjacent region) | 802 | 803 |
| Formed by: | HF-PCVD | HF-PCVD | HF-PCVD | HF-PCVD |
| Semiconductor layer formed: | p-Type a-Si Crystal grain size: (smaller) B density: (lower) | p-Type a-Si (larger) (higher) | i-Type a-Si | n-Type a-Si |
| Thickness: (nm) | 30 | 30 | 300 | 10 |
| Raw Material gases: (sccm) | $SiH_4$ 200 $H_2$ 2,000 $BF_3$ 0.1 ($BF_3/SiH_4$ = .5%) | $SiH_4$ 20 $H_2$ 5,000 $BF_3$ 1 ($BF_3/SiH_4$ = 0.5%) | $SiH_4$ 600 $H_2$ 6,000 | $SiH_4$ 10 $H_2$ 3,000 $PH_3$ 0.2 |
| Film-forming chamber internal pressure: (Pa) | 130 | 130 | 130 | 130 |
| Substrate temp.: (°C.) | 270 | 270 | 220 | 170 |
| Discharge power: (W) | 200 (13.56 Hz) | 5,000 (13.56 Hz) | 5,000 (13.56 MHz) | 1,000 (13.56 MHz) |

TABLE A6

| Film forming conditions | Film-forming chambers | | | |
|---|---|---|---|---|
| | 801 (Conductive substrate interface adjacent region) | 801 (Intrinsic semiconductor layer interface adjacent region) | 802 | 803 |
| Formed by: | HF-PCVD | HF-PCVD | HF-PCVD | HF-PCVD |
| Semiconductor layer formed: | p-Type a-Si B density: (lower) | p-Type a-Si (higher) | i-Type a-Si | n-Type a-Si |
| Thickness: (nm) | 30 | 30 | 300 | 10 |
| Raw Material gases: (sccm) | $SiH_4$ 200 $H_2$ 2,000 $BF_3$ 0.4 ($BF_3/SiH_4$ = 0.2%) | $SiH_4$ 200 $H_2$ 2,000 $BF_3$ 4 ($BF_3/SiH_4$ = 2%) | $SiH_4$ 600 $H_2$ 6,000 | $SiH_4$ 10 $H_2$ 3,000 $PH_3$ 0.2 |
| Film-forming chamber internal pressure: (Pa) | 130 | 130 | 130 | 130 |
| Substrate temp.: (°C.) | 270 | 270 | 220 | 170 |
| Discharge power: (W) | 200 (100 kHz) | 200 (100 kHz) | 1,200 (13.56 MHz) | 2,000 (13.56 MHz) |

TABLE A7

| Film forming conditions | 801A (Conductive substrate interface adjacent region) | 801A (Intrinsic semiconductor layer interface adjacent region) | 802A | 803A |
|---|---|---|---|---|
| Formed by: | HF-PCVD | HF-PCVD | HF-PCVD | HF-PCVD |
| Semiconductor Layer formed: | n-Type a-Si P density: | n-Type a-Si P density: | i-Type a-Si | p-Type a-Si |
|  | (lower) | (higher) |  |  |
| Thickness: (nm) | 30 | 30 | 100 | 10 |
| Raw Material gases: (sccm) | $SiH_4$ 200 $H_2$ 2,000 $PH_3$ 0.4 ($PH_3/SiH_4$ = 0.2%) | $SiH_4$ 200 $H_2$ 2,000 $PH_3$ 4 ($PH_3/SiH_4$ 0.4 =2%) | $SiH_4$ 150 $H_2$ 3,000 $GeH_4$ 150 | $SiH_4$ 10 $H_2$ 3,000 $BF_3$ 15 |
| Film-forming chamber internal pressure: (Pa) | 130 | 130 | 130 | 130 |
| Substrate temp.: (°C.) | 300 | 300 | 300 | 170 |
| Discharge power: (W) | 200 (13.56 MHz) | 200 (13.56 MHz) | 600 (13.56 MHz) | 2,000 (13.56 MHz) |

TABLE A8

| Film forming conditions | 801B | 802B | 803B |
|---|---|---|---|
| Formed by: | HF-PCVD | HF-PCVD | HF-PCVD |
| Semiconductor layer formed: | n-Type a-Si P density: | n-Type a-Si P density: | p-Type a-Si |
|  | (lower) | (higher) |  |
| Thickness: (nm) | 15 | 200 | 10 |
| Raw Material gases: (sccm) | $SiH_4$ 150 $H_2$ 1,500 $PH_3$ 3 | $SiH_4$ 500 $H_2$ 5,000 | $SiH_4$ 10 $H_2$ 6,000 $BF_3$ 0.2 |
| Film-forming chamber internal pressure: (Pa) | 150 | 1,000 | 2,000 |
| Substrate temp.: (°C.) | 270 | 220 | 170 |
| Discharge power: (W) | 150 (13.56 MHz) | 1,000 (13.56 MHz) | 2,000 (13.56 MHz) |

TABLE A9

| Film forming conditions | 801A (Conductive substrate interface adjacent region) | 801A (Intrinsic semiconductor layer interface adjacent region) | 802A | 803A |
|---|---|---|---|---|
| Formed by: | HF-PCVD | HF-PCVD | HF-PCVD | HF-PCVD |
| Semiconductor layer formed: | n-Type a-Si | n-Type a-Si | i-Type a-Si | p-Type a-Si |
| Thickness: (nm) | Crystal grain size: (smaller) 30 | Crystal grain size: (larger) 30 | 300 | 10 |
| Raw Material gases: (sccm) | $SiH_4$ 200 $H_2$ 2,000 $PH_3$ 1 ($PH_3/SiH_4$ = 0.5%) | $SiH_4$ 20 $H_2$ 5,000 $PH_3$ 0.1 ($PH_3/SiH_4$ = 0.5%) | $SiH_4$ 150 $H_2$ 3,000 $GeH_4$ 150 | $SiH_4$ 10 $H_2$ 3,000 $BF_3$ 15 |
| Film-forming chamber internal pressure: (Pa) | 130 | 130 | 130 | 130 |
| Substrate temp.: (°C.) | 300 | 300 | 300 | 170 |
| Discharge power: (W) | 200 (13.56 MHz) | 5,000 (13.56 MHz) | 600 (13.56 MHz) | 2,000 (13.56 MHz) |

TABLE A10

| Film forming conditions | Film-forming chambers | | | |
|---|---|---|---|---|
| | 801A (Conductive substrate interface adjacent region) | 801A (Intrinsic semiconductor layer interface adjacent region) | 802A | 803A |
| Formed by: | HF-PCVD | HF-PCVD | HF-PCVD | HF-PCVD |
| Semiconductor layer formed: | n-Type a-Si | n-Type a-Si | i-Type a-SiGe | p-Type a-Si |
| Thickness: (nm) | P density: (lower) 30 | (higher) 30 | 100 | 10 |
| Raw Material gases: (sccm) | $SiH_4$ 200 $H_2$ 2,000 $PH_3$ 0.4 ($PH_3/SiH_4$ = 0.2%) | $SiH_4$ 20 $H_2$ 2,000 $PH_3$ 4 ($PH_3/SiH_4$ = 0.2%) | $SiH_4$ 150 $H_2$ 3,000 $GeH_4$ 15 | $SiH_4$ 10 $H_2$ 3,000 $BF_3$ 15 |
| Film-forming chamber internal pressure: (Pa) | 130 | 130 | 130 | 130 |
| Substrate temp.: (°C.) | 300 | 300 | 300 | 170 |
| Discharge power: (W) | 200 (13.56 MHz) | 200 (13.56 MHz) | 600 (13.56 MHz) | 2,000 (13.56 MHz) |

TABLE A11

| Film forming conditions | Film-forming chambers | | |
|---|---|---|---|
| | 801B | 802B | 803B |
| Formed by: | HF-PCVD | HF-PCVD | HF-PCVD |
| Semiconductor layer formed: | n-Type a-Si | i-Type a-Si | p-Type a-Si |
| Thickness: (nm) | 15 | 100 | 10 |
| Raw Material gases: (sccm) | $SiH_4$ 150 $H_2$ 3,000 $PH_3$ 3 | $SiH_4$ 180 $H_2$ 4,000 $Ge_4$ 120 | $SiH_4$ 10 $H_2$ 3,000 $BF_3$ 15 |
| Film-forming chamber internal pressure: (Pa) | 130 | 130 | 130 |
| Substrate temp.: (°C.) | 270 | 270 | 170 |
| Discharge power: (W) | 150 (13.56 MHz) | 600 (13.56 MHz) | 2,000 (13.56 MHz) |

TABLE A12

| Film forming conditions | Film-forming chambers | | |
|---|---|---|---|
| | 801C | 802C | 803C |
| Formed by: | HF-PCVD | HF-PCVD | HF-PCVD |
| Semiconductor Layer formed: | n-Type a-Si | i-Type a-Si | p-Type a-Si |
| Thickness: (nm) | 15 | 100 | 10 |
| Raw Material gases: (sccm) | $SiH_4$ 150 $H_2$ 1,500 $PH_3$ 3 | $SiH_4$ 300 $H_2$ 3,000 | $SiH_4$ 5 $H_2$ 3,000 $BF_3$ 0.2 |
| Film-forming chamber internal pressure: (Pa) | 130 | 130 | 130 |
| Substrate temp.: (°C.) | 270 | 220 | 170 |
| Discharge power: (W) | 150 (13.56 MHz) | 600 (13.56 MHz) | 2,000 (100 kHz) |

TABLE A13

| Film forming conditions | Film-forming chambers | | | |
|---|---|---|---|---|
| | 801A (Conductive substrate interface adjacent region) | 801A (Intrinsic semiconductor layer interface adjacent region) | 802A | 803A |
| Formed by: | HF-PCVD | HF-PCVD | HF-PCVD | HF-PCVD |
| Semiconductor layer formed: | n-Type a-Si | n-Type a-Si | i-Type a-Si | p-Type a-Si |
| Thickness: (nm) | Crystal grain size: (smaller) 30 | (larger) 30 | 100 | 10 |
| Raw Material gases: (sccm) | $SiH_4$ 200 $H_2$ 2,000 $PH_3$ 1 ($PH_3/SiH_4$ = 0.5%) | $SiH_4$ 20 $H_2$ 5,000 $PH_3$ 0.1 ($PH_3/SiH_4$ = 0.5%) | $SiH_4$ 150 $H_2$ 3,000 $GeH_4$ 0.1 | $SiH_4$ 10 $H_2$ 3,000 $BF_3$ 15 |
| Film-forming chamber internal pressure: (Pa) | 130 | 130 | 130 | 130 |
| Substrate temp.: (°C.) | 300 | 300 | 300 | 170 |
| Discharge power: (W) | 200 (13.56 MHz) | 5,000 (13.56 MHz) | 600 (13.56 MHz) | 2,000 (13.56 MHz) |

TABLE B1

| Film forming conditions | Film-forming chambers | | | |
|---|---|---|---|---|
| | 1801 | 1802 | 1803 (Intrinsic semiconductor interface side region) *1 | 1803 (Transparent electrode interface side region) *2 |
| Formed by: | HF-PCVD | HF-PCVD | HF-PCVD | HF-PCVD |
| Semiconductor Layer formed: | n-Type a-Si | i-Type a-Si | p-Type a-Si | p-Type a-Si |
| Thickness: (nm) | 30 | 300 | B density: (higher) 10 | (lower) 10 |
| Raw Material gases: (sccm) | $SiH_4$ 200 $H_2$ 2,000 $PH_3$ 4 | $SiH_4$ 600 $H_2$ 2,000 | $SiH_4$ 10 $H_2$ 3,000 $BF_3$ 0.2 ($BF_3/SiH_4$ = 2%) | $SiH_4$ 10 $H_2$ 3,000 $BF_3$ 0.2 ($BF_3/SiH_4$ = 0.2%) |
| Film-forming chamber internal pressure: (Pa) | 130 | 130 | 130 | 130 |
| Substrate temp.: (°C.) | 270 | 220 | 170 | 170 |
| Discharge power: (W) | 200 (13.56 MHz) | 1,200 (13.56 MHz) | 2,000 (13.56 MHz) | 2,000 (13.56 MHz) |

*1 The region adjacent to the interface with the intrinsic semiconductor layer is referred to as "intrinsic semiconductor layer interface side region".
*2 The region adjacent to the interface with the transparent electrode is referred to as "transparent electrode interface side region".

TABLE B2

| Film forming conditions | Film-forming chambers | | | |
|---|---|---|---|---|
| | 1801 | 1802 | 1803 (Intrinsic semiconductor interface side region) | 1803 (Transparent electrode interface side region) |
| Formed by: | HF-PCVD | HF-PCVD | HF-PCVD | HF-PCVD |
| Semiconductor layer formed: | p-Type a-Si | i-Type a-Si | n-Type a-Si | n-Type a-Si |
| Thickness: (nm) | 30 | 300 | P density: (higher) 10 | (lower) 10 |
| Raw Material gases: (sccm) | $SiH_4$ 600 $H_2$ 2,000 $PH_3$ 4 | $SiH_4$ 600 $H_2$ 6,000 | $SiH_4$ 10 $H_2$ 3,000 $PH_3$ 0.2 ($PH_3/SiH_4$ = 2%) | $SiH_4$ 10 $H_2$ 3,000 $PH_3$ 0.02 ($PH_3/SiH_4$ = 0.2%) |
| Film-forming chamber internal pressure: (Pa) | 130 | 130 | 130 | 130 |
| Substrate temp.: (°C.) | 270 | 220 | 170 | 170 |
| Discharge power: (W) | 200 (13.56 MHz) | 1,200 (13.56 MHz) | 1,000 (13.56 MHz) | 1,000 (13.56 MHz) |

TABLE B3

| Film forming conditions | Film-forming chambers | | | |
|---|---|---|---|---|
| | 1801 | 1802 | 1803 (Intrinsic semiconductor interface side region) | 1803 (Transparent electrode interface side region) |
| Formed by: | HF-PCVD | HF-PCVD | HF-PCVD | HF-PCVD |
| Semiconductor layer formed: | n-Type a-Si | i-Type a-Si | p-Type a-Si | p-Type a-Si |
| Thickness: (nm) | 30 | 300 | Crystal grain size: (larger) 10 | (smaller) 10 |
| Raw Material gases: (sccm) | $SiH_4$ 200 $H_2$ 2,000 $PH_3$ 4 | $SiH_4$ 600 $H_2$ 2,000 | $SiH_4$ 10 $H_2$ 5,000 $BF_3$ 0.2 ($BF_3/SiH_4$ = 2%) | $SiH_4$ 10 $H_2$ 3,000 $BF_3$ 2 ($BF_3/SiH_4$ = 2%) |
| Film-forming chamber internal pressure: (Pa) | 130 | 130 | 130 | 130 |
| Substrate temp.: (°C.) | 270 | 220 | 170 | 170 |
| Discharge power: (W) | 200 (13.56 MHz) | 1,200 (13.56 MHz) | 5,000 (13.56 MHz) | 1,000 (13.56 MHz) |

TABLE B4

| Film forming conditions | Film-forming chambers | | | |
|---|---|---|---|---|
| | 1801 | 1802 | 1803 (Intrinsic semiconductor interface side region) | 1803 (Transparent electrode interface side region) |
| Formed by: | HF-PCVD | HF-PCVD | HF-PCVD | HF-PCVD |
| Semiconductor layer formed: | p-Type a-Si | i-Type a-Si | n-Type a-Si | n-Type a-Si |
| Thickness: (nm) | 30 | 300 | Crystal grain size: (larger) 10 | (smaller) 10 |
| Raw Material gases: (sccm) | $SiH_4$ 200 $H_2$ 2,000 $BF_3$ 4 | $SiH_4$ 600 $H_2$ 2,000 | $SiH_4$ 10 $H_2$ 3,000 $PH_3$ 0.2 ($PH_3/SiH_4$ = 2%) | $SiH_4$ 10 $H_2$ 3,000 $PH_3$ 0.02 ($PH_3/SiH_4$ = 2%) |
| Film-forming chamber internal pressure: (Pa) | 130 | 130 | 130 | 130 |
| Substrate temp.: (°C.) | 270 | 220 | 170 | 170 |
| Discharge power: (W) | 200 (13.56 MHz) | 1,200 (13.56 MHz) | 2,500 (13.56 MHz) | 100 (13.56 MHz) |

TABLE B5

| Film forming conditions | Film-forming chambers | | | |
|---|---|---|---|---|
| | 1801 | 1802 | 1803 (Intrinsic semiconductor interface side region) | 1803 (Transparent electrode interface side region) |
| Formed by: | HF-PCVD | HF-PCVD | HF-PCVD | HF-PCVD |
| Semiconductor Layer formed: | p-Type a-Si | i-Type a-Si | n-Type a-Si | n-Type a-Si |
| Thickness: (nm) | 30 | 300 | Crystal grain size: (larger) 10 | (smaller) 10 |
| Raw Material gases: (sccm) | $SiH_4$ 200 $H_2$ 2,000 $BF_3$ 4 | $SiH_4$ 600 $H_2$ 6,000 | $SiH_4$ 10 $H_2$ 5,000 $PH_3$ 0.2 ($PH_3/SiH_4$ = 2%) | $SiH_4$ 100 $H_2$ 1,000 $PH_3$ 0.02 ($PH_3/SiH_4$ = 0.2%) |
| Film-forming chamber internal pressure: (Pa) | 130 | 130 | 130 | 130 |
| Substrate temp.: (°C.) | 270 | 220 | 170 | 170 |
| Discharge power: (W) | 200 (13.56 MHz) | 1,200 (13.56 MHz) | 2,500 (13.56 MHz) | 1000 (13.56 MHz) |

TABLE B6

| Film forming conditions | Film-forming chambers | | | |
|---|---|---|---|---|
| | 1801 | 1802 | 1803 (Intrinsic semiconductor interface side region) | 1803 (Transparent electrode interface side region) |
| Formed by: | HF-PCVD | HF-PCVD | HF-PCVD | HF-PCVD |
| Semiconductor layer formed: | p-Type a-Si | i-Type a-Si | n-Type a-Si | n-Type a-Si |
| Thickness: (nm) | 30 | 300 | P density: (higher) 10 | P density: (lower) 10 |
| Raw Material gases: (sccm) | $SiH_4$ 200<br>$H_2$ 2,000<br>$BF_3$ 4 | $SiH_4$ 600<br>$H_2$ 6,000 | $SiH_4$ 1<br>$H_2$ 3,000<br>$PH_3$ 0.2<br>($PH_3/SiH_4$ = 2%) | $SiH_4$ 1<br>$H_2$ 3,000<br>$PH_3$ 0.02<br>($PH_3/SiH_4$ = 2%) |
| Film-forming chamber internal pressure: (Pa) | 130 | 130 | 130 | 130 |
| Substrate temp.: (°C) | 270 | 220 | 170 | 170 |
| Discharge power: (W) | 200 (13.56 MHz) | 1,200 (13.56 MHz) | 2,000 (13.56 MHz) | 2,000 (13.56 MHz) |

TABLE B7

| Film forming conditions | Film-forming chambers | | |
|---|---|---|---|
| | 1801A | 1802A | 1803A |
| Formed by: | HF-PCVD | HF-PCVD | HF-PCVD |
| Semiconductor layer formed: | n-Type a-Si | i-Type a-Si | p-Type a-Si |
| Thickness: (nm) | 30 | 100 | 10 |
| Raw Material gases: (sccm) | $SiH_4$ 200<br>$H_2$ 2,000<br>$PH_3$ 4 | $SiH_4$ 150<br>$H_2$ 3,000<br>$GeH_4$ 150 | $SiH_4$ 10<br>$H_2$ 3,000<br>$BF_3$ 15 |
| Film-forming chamber internal pressure: (Pa) | 130 | 130 | 130 |
| Substrate temp.: (°C) | 300 | 300 | 170 |
| Discharge power: (W) | 200 (13.56 MHz) | 600 (13.56 MHz) | 2,000 (13.56 MHz) |

TABLE B8

| Film forming conditions | Film-forming chambers | | | |
|---|---|---|---|---|
| | 1801B | 1802B | 1803B (Intrinsic semiconductor interface side region) | 1803B (Transparent electrode interface side region) |
| Formed by: | HF-PCVD | HF-PCVD | HF-PCVD | HF-PCVD |
| Semiconductor Layer formed: | n-Type a-Si | i-Type a-Si | p-Type a-Si | p-Type a-Si |
| Thickness: (nm) | 15 | 200 | B density: (higher) 10 | B density: (lower) 10 |
| Raw Material gases: (sccm) | $SiH_4$ 150<br>$H_2$ 1,500<br>$PH_3$ 3 | $SiH_4$ 500<br>$H_2$ 5,000 | $SiH_4$ 10<br>$H_2$ 3,000<br>$BF_3$ 0.2<br>($BF_3/SiH_4$ = 2%) | $SiH_4$ 10<br>$H_2$ 3,000<br>$BF_3$ 0.02<br>($BF_3/SiH_4$ = 0.2%) |
| Film-forming chamber internal pressure: (Pa) | 130 | 130 | 130 | 130 |
| Substrate temp.: (°C) | 270 | 220 | 170 | 170 |
| Discharge power: (W) | 150 (13.56 MHz) | 1,000 (13.56 MHz) | 2,000 (13.56 MHz) | 2,000 (13.56 MHz) |

TABLE B9

| Film forming conditions | Film-forming chambers | | | |
|---|---|---|---|---|
| | 1801B | 1802B | 1803B (Intrinsic semiconductor interface side region) | 1803B (Transparent electrode interface side region) |
| Formed by: | HF-PCVD | HF-PCVD | HF-PCVD | HF-PCVD |
| Semiconductor layer formed: | n-Type a-Si | i-Type a-Si | p-Type a-Si | p-Type a-Si |
| Thickness: (nm) | 15 | 200 | Crystal grain size: (larger) 10 | Crystal grain size: (smaller) 10 |
| Raw Material gases: (sccm) | $SiH_4$ 150<br>$H_2$ 1,500<br>$PH_3$ 3 | $SiH_4$ 600<br>$H_2$ 5,000 | $SiH_4$ 10<br>$H_2$ 5,000<br>$BF_3$ 0.2<br>($PH_3/SiH_4$ = 2%) | $SiH_4$ 100<br>$H_2$ 1,000<br>$BF_3$ 2<br>($PH_3/SiH_4$ = 2%) |
| Film-forming chamber internal pressure: (Pa) | 130 | 130 | 130 | 130 |
| Substrate temp.: (°C) | 270 | 220 | 170 | 170 |
| Discharge power: (W) | 150 (13.56 MHz) | 1,000 (13.56 MHz) | 5,000 (13.56 MHz) | 100 (13.56 MHz) |

TABLE B10

| Film forming conditions | Film-forming chambers | | |
|---|---|---|---|
| | 1801A | 1802A | 1803A |
| Formed by: | HF-PCVD | HF-PCVD | HF-PCVD |
| Semiconductor layer formed: | n-Type a-Si | i-Type a-Si | p-Type a-Si |
| Thickness: (nm) | 30 | 100 | 10 |
| Raw Material gases: (sccm) | $SiH_4$ 200<br>$H_2$ 2,000<br>$PH_3$ 4 | $SiH_4$ 150<br>$H_2$ 4,000<br>$GeH_4$ 150 | $SiH_4$ 10<br>$H_2$ 3,000<br>$BF_3$ 15 |
| Film-forming chamber internal pressure: (Pa) | 130 | 130 | 130 |
| Substrate temp.: (°C) | 300 | 300 | 170 |

TABLE B10-continued

| Film forming conditions | Film-forming chambers | | |
|---|---|---|---|
| | 1801A | 1802A | 1803A |
| Discharge power: (W) | 200 (13.56 MHz) | 600 (13.56 MHz) | 2,000 (13.56 MHz) |

TABLE B11

| Film forming conditions | Film-forming chambers | | |
|---|---|---|---|
| | 1801B | 1802B | 1803B |
| Formed by: | HF-PCVD | HF-PCVD | HF-PCVD |
| Semiconductor layer formed: | n-Type a-Si | i-Type a-Si | p-Type a-Si |
| Thickness: (nm) | 30 | 100 | 10 |
| Raw Material gases: (sccm) | $SiH_4$ 200 $H_2$ 3,000 $PH_3$ 3 | $SiH_4$ 180 $H_2$ 4,000 $GeH_4$ 120 | $SiH_4$ 10 $H_2$ 3,000 $BF_3$ 15 |
| Film-forming chamber internal pressure: (Pa) | 130 | 130 | 130 |
| Substrate temp.: (°C.) | 270 | 270 | 170 |
| Discharge power: (W) | 150 (13.56 MHz) | 600 (13.56 MHz) | 2,000 (13.56 MHz) |

TABLE B12

| Film forming conditions | Film-forming chambers | | | |
|---|---|---|---|---|
| | 1801C | 1802C | 1803C (Intrinsic semiconductor interface side region) | 1803C (Transparent electrode interface side region) |
| Formed by: | HF-PCVD | HF-PCVD | HF-PCVD | HF-PCVD |
| Semiconductor layer formed: | n-Type a-Si | i-Type a-Si | p-Type a-Si | p-Type a-Si |
| Thickness: (nm) | 15 | 200 | B density: (higher) 10 | (lower) 10 |
| Raw Material gases: (sccm) | $SiH_4$ 150 $H_2$ 1,500 $PH_3$ 4 | $SiH_4$ 600 $H_2$ 3,000 | $SiH_4$ 5 $H_2$ 3000 $BF_3$ 0.2 ($BF_3/SiH_4$ = 4%) | $SiH_4$ 5 $H_2$ 3,000 $BF_3$ 0.02 ($BF_3/SiH_4$ = 0.4%) |
| Film-forming chamber internal pressure: (Pa) | 130 | 130 | 130 | 130 |
| Substrate temp.: (°C.) | 270 | 220 | 170 | 170 |
| Discharge power: (W) | 150 (13.56 MHz) | 600 (13.56 MHz) | 2,000 (100 kHz) | 2,000 (100 kHz) |

TABLE B13

| Film forming conditions | Film-forming chambers | | | |
|---|---|---|---|---|
| | 1801C | 1802C | 1803C (Intrinsic semiconductor interface side region) | 1803C (Transparent electrode interface side region) |
| Formed by: | HF-PCVD | HF-PCVD | HF-PCVD | HF-PCVD |
| Semiconductor layer formed: | n-Type a-Si | i-Type a-Si | p-Type a-Si | p-Type a-Si |
| Thickness: (nm) | 15 | 100 | Crystal grain size: (larger) 10 | (smaller) 10 |
| Raw Material gases: (sccm) | $SiH_4$ 150 $H_2$ 1,500 $PH_3$ 3 | $SiH_4$ 300 $H_2$ 3,000 | $SiH_4$ 10 $H_2$ 5,000 $BF_3$ 0.2 ($BF_3/SiH_4$ = 2%) | $SiH_4$ 100 $H_2$ 1,000 $BF_3$ 2 ($BF_3/SiH_4$ = 2%) |
| Film-forming chamber internal pressure: (Pa) | 130 | 130 | 130 | 130 |
| Substrate temp.: (°C.) | 270 | 220 | 170 | 170 |
| Discharge power: (W) | 150 (13.56 MHz) | 600 (13.56 MHz) | 5,000 (13.56 MHz) | 100 (13.56 MHz) |

What is claimed is:

1. A photovoltaic device comprising in the following order, in its layer configuration, a conductive substrate, a first semiconductor layer having a first conductivity type, a substantially intrinsic second semiconductor layer, a third semiconductor layer having a conductivity type opposite to that of the first conductivity type, and a transparent electrode;

said first to third semiconductor layers each comprising a silicon-containing non-single-crystal semiconductor and light being made to be incident on the side of said transparent electrode;

wherein a dopant impurity determining the conductivity type of said first semiconductor layer is distributed therein so that the density of said impurity is lower on the side of said conductive substrate than on the side of said second semiconductor layer.

2. A photovoltaic device comprising in the following order, in its layer configuration, a conductive substrate, a first semiconductor layer having a first conductivity type, a substantially intrinsic second semiconductor layer, a third semiconductor layer having a conductivity type opposite to that of the first semiconductor, a fourth semiconductor layer having the first conductivity type, a substantially intrinsic fifth semiconductor layer, a sixth semiconductor layer having a conductivity type opposite to that of the first conductivity type, and a transparent electrode;

said first to sixth semiconductor layers each comprising a silicon-containing non-single-crystal semiconductor and light being made to be incident on the side of said transparent electrode;

wherein a dopant impurity determining the conductivity type of said first semiconductor layer is distributed therein so that the density of said impurity is lower on the side of said conductive substrate than on the side of said second semiconductor layer.

3. A photovoltaic device comprising in the following order, in its layer configuration, a conductive substrate, a first semiconductor layer having a first conductivity type, a substantially intrinsic second semiconductor layer, a third semiconductor layer having a conductivity type opposite to that of the first semiconductor, a fourth semiconductor layer having the first conductivity type, a substantially intrinsic fifth semiconductor layer, a sixth semiconductor layer having a conductivity type opposite to that of the first conductivity type, a seventh semiconductor layer having the first conductivity type, a substantially intrinsic eighth semiconductor layer, a ninth semiconductor layer having a conductivity type opposite to that of the first conductivity type, and a transparent electrode; said first to ninth semiconductor layers each comprising a silicon type non-single-crystal semiconductor and light being made to be incident on the side of said transparent electrode;

wherein a dopant impurity determining the conductivity type of said first semiconductor layer is distributed therein so that the density of said impurity is lower on the side of said conductive substrate than on the side of said second semiconductor layer.

4. A photovoltaic device comprising in the following order, in its layer configuration, a conductive substrate, a first semiconductor layer having a first conductivity type, a substantially intrinsic second semiconductor layer, a third semiconductor layer having a conductivity type opposite to that of the first conductivity type, and a transparent electrode;

said first to third semiconductor layers each comprising a silicon-containing non-single-crystal semiconductor and light being made to be incident on the side of said transparent electrode;

wherein crystals constituting said first semiconductor layer are distributed therein so that the grain size of said crystals is smaller on the side of said conductive substrate than on the side of said second semiconductor layer.

5. A photovoltaic device comprising in the following order, in its layer configuration, a conductive substrate, a first semiconductor layer having a first conductivity type, a substantially intrinsic second semiconductor layer, a third semiconductor layer having a conductivity type opposite to that of the first semiconductor, a fourth semiconductor layer having the first conductivity type, a substantially intrinsic fifth semiconductor layer, a sixth semiconductor layer having a conductivity type opposite to that of the first conductivity type, and a transparent electrode;

said first to sixth semiconductor layers each comprising a silicon-containing non-single-crystal semiconductor and light being made to be incident on the side of said transparent electrode;

wherein crystals constituting said first semiconductor layer are distributed therein so that the grain size of said crystals is smaller on the side of said conductive substrate than on the side of said second semiconductor layer.

6. A photovoltaic device comprising in the following order, in its layer configuration, a conductive substrate, a first semiconductor layer having a first conductivity type, a substantially intrinsic second semiconductor layer, a third semiconductor layer having a conductivity type opposite to that of the first semiconductor, a fourth semiconductor layer having the first conductivity type, a substantially intrinsic fifth semiconductor layer, a sixth semiconductor layer having a conductivity type opposite to that of the first conductivity type, a seventh semiconductor layer having the first conductivity type, a substantially intrinsic eighth semiconductor layer, a ninth semiconductor layer having a conductivity type opposite to that of the first conductivity type, and a transparent electrode;

said first to ninth semiconductor layers each comprising a silicon-containing non-single-crystal semiconductor and light being made to be incident on the side of said transparent electrode;

wherein crystals constituting said first semiconductor layer are distributed therein so that the grain size of said crystals is smaller on the side of said conductive substrate than on the side of said second semiconductor layer.

7. A photovoltaic device comprising in the following order, in its layer configuration, a conductive substrate, a first semiconductor layer having a first conductivity type, a substantially intrinsic second semiconductor layer, a third semiconductor layer having a conductivity type opposite to that of the first conductivity type, and a transparent electrode;

said first to third semiconductor layers each comprising a silicon-containing non-single-crystal semiconductor and light being made to be incident on the side of said transparent electrode;

wherein a dopant impurity determining the conductivity type of said third semiconductor layer is distributed therein so that the density of said impurity is lower on the side of said transparent electrode than on the side of said second semiconductor layer.

8. A photovoltaic device comprising in the following order, in its layer configuration, a conductive substrate, a first semiconductor layer having a first conductivity type, a substantially intrinsic second semiconductor layer, a third semiconductor layer having a conductivity type opposite to that of the first semiconductor, a fourth semiconductor layer having the first conductivity type, a substantially intrinsic fifth semiconductor layer, a sixth semiconductor layer having a conductivity type opposite to that of the first conductivity type, and a transparent electrode;

said first to sixth semiconductor layers each comprising a silicon-containing non-single-crystal semiconductor and light being made to be incident on the side of said transparent electrode;

wherein a dopant impurity determining the conductivity type of said sixth semiconductor layer is distributed therein so that the density of said impurity is lower on the side of said transparent electrode than on the side of said fifth semiconductor layer.

9. A photovoltaic device comprising in the following order, in its layer configuration, a conductive substrate, a first semiconductor layer having a first conductivity type, a substantially intrinsic second semiconductor layer, a third semiconductor layer having a conductivity type opposite to that of the first semiconductor, a fourth semiconductor layer having the first conductivity type, a substantially intrinsic fifth semiconductor layer, a sixth semiconductor layer having a conductivity type opposite to that of the first conductivity type, a seventh semiconductor layer having the first conductivity type, a substantially intrinsic eighth semiconductor layer, a ninth semiconductor layer having a conductivity type opposite to that of the first conductivity type, and a transparent electrode;

said first to ninth semiconductor layers each comprising a silicon-containing non-single-crystal semiconductor and light being made to be incident on the side of said transparent electrode;

wherein a dopant impurity determining the conductivity type of said ninth semiconductor layer is distributed therein so that the density of said impurity is lower on the side of said transparent electrode than on the side of said eighth semiconductor layer.

10. A photovoltaic device comprising in the following order, in its layer configuration, a conductive substrate, a first semiconductor layer having a first conductivity type, a substantially intrinsic second semiconductor layer, a third semiconductor layer having a conductivity type opposite to that of the first conductivity type, and a transparent electrode;

said first to third semiconductor layers each comprising a silicon-containing non-single-crystal semiconductor and light being made to be incident on the side of said transparent electrode;

wherein crystals constituting said third semiconductor layer are distributed therein so that the grain size of said crystals is smaller on the side of said transparent electrode than on the side of said second semiconductor layer.

11. A photovoltaic device comprising in the following order, in its layer configuration, a conductive substrate, a first semiconductor layer having a first conductivity type, a substantially intrinsic second semiconductor layer, a third semiconductor layer having a conductivity type opposite to that of the first semiconductor, a fourth semiconductor layer having the first conductivity type, a substantially intrinsic fifth semiconductor layer, a sixth semiconductor layer having a conductivity type opposite to that of the first conductivity type, and a transparent electrode;

said first to sixth semiconductor layers each comprising a silicon-containing non-single-crystal semiconductor and light being made to be incident on the side of said transparent electrode;

wherein crystals constituting said sixth semiconductor layer are distributed therein so that the grain size of said crystals is smaller on the side of said transparent electrode than on the side of said second semiconductor layer.

12. A photovoltaic device comprising in the following order, in its layer configuration, a conductive substrate, a first semiconductor layer having a first conductivity type, a substantially intrinsic second semiconductor layer, a third semiconductor layer having a conductivity type opposite to that of the first semiconductor, a fourth semiconductor layer having the first conductivity type, a substantially intrinsic fifth semiconductor layer, a sixth semiconductor layer having a conductivity type opposite to that of the first conductivity type, a seventh semiconductor layer having the first conductivity type, a substantially intrinsic eighth semiconductor layer, a ninth semiconductor layer having a conductivity type opposite to that of the first conductivity type, and a transparent electrode;

said first to ninth semiconductor layers each comprising a silicon-containing non-single-crystal semiconductor and light being made to be incident on the side of said transparent electrode;

wherein crystals constituting said ninth semiconductor layer are distributed therein so that the grain size of said crystals is smaller on the side of said transparent electrode than on the side of said eighth semiconductor layer.

13. A photovoltaic device comprising:
a) a semiconductor region having at least one set of semiconductor layers comprised of a first semiconductor layers, having a first conductivity type, an intrinsic or substantially intrinsic second semiconductor layer, and a third semiconductor layer having a conductivity type opposite to that of the first conductivity type, the layers being formed in this order, and b) first and second electrodes provided such that said electrodes interpose said semiconductor region;

wherein the density of a dopant impurity determining the conductivity type of the first semiconductor layer in a set of semiconductor layers which is in contact with said first electrode is varied so as to be lower on the side of the first electrode.

14. The photovoltaic device according to claim 13, wherein said first electrode comprises a substrate.

15. The photovoltaic device according to claim 13, wherein said first electrode comprises a transparent electrode.

16. The photovoltaic device according to claim 13, wherein said first electrode comprises a light-incident side electrode.

17. The photovoltaic device according to claim 13, wherein said first electrode comprises an electrode on the side opposite a light-incident side.

18. The photovoltaic device according to claim 13, wherein said semiconductor region comprises a non-single-crystal semiconductor material.

19. The photovoltaic device according to claim 18, wherein said non-single-crystal semiconductor material comprises a silicon containing material.

20. The photovoltaic device according to claim 18, wherein said non-single-crystal semiconductor material comprises an amorphous semiconductor material or a polycrystalline semiconductor material.

21. The photovoltaic device according to claim 20, wherein said amorphous semiconductor material comprises a microcrystalline semiconductor material.

22. The photovoltaic device according to claim 13, wherein said first conductivity type is p-type.

23. The photovoltaic device according to claim 13, wherein said first conductivity type is n-type.

24. The photovoltaic device according to claim 13, wherein said at least one set of semiconductor layers comprises two sets.

25. The photovoltaic device according to claim 13, wherein said at least one set of semiconductor layers comprises three sets.

26. A photovoltaic device comprising;
a) a semiconductor region having at least one set of semiconductor layers comprised of a first semiconductor layer having a first conductivity type, an intrinsic or substantially intrinsic second semiconductor layer, and a third semiconductor layer having a conductivity type opposite to that of the first conductivity type, the layers being formed in this order, and;

b) first and second electrodes provided such position that said electrodes interpose said semiconductor region;

wherein the grain size of crystals in said first semiconductor layer is varied so as to be smaller on the side of said first electrode.

27. The photovoltaic device according to claim 26, wherein said first electrode comprises a substrate.

28. The photovoltaic device according to claim 26, wherein said first electrode comprises a transparent electrode.

29. The photovoltaic device according to claim 26, wherein said first electrode comprises a light-incident side electrode.

30. The photovoltaic device according to claim 26, wherein said first electrode comprises an electrode on the side opposite a light-incident side.

31. The photovoltaic device according to claim 26, wherein said semiconductor region comprises a non-single-crystal semiconductor material.

32. The photovoltaic device according to claim 31, wherein said non-single-crystal semiconductor material comprises a silicon containing material.

33. The photovoltaic device according to claim 31, wherein said non-single-crystal semiconductor material comprises an amorphous semiconductor material or a polycrystalline semiconductor material.

34. The photovoltaic device according to claim 33, wherein said amorphous semiconductor material comprises a microcrystalline semiconductor material.

35. The photovoltaic device according to claim 26, wherein said first conductivity type is p-type.

36. The photovoltaic device according to claim 26, wherein said first conductivity type is n-type.

37. The photovoltaic device according to claim 26, wherein said at least one set of semiconductor layers comprises two sets.

38. The photovoltaic device according to claim 26, wherein said set of semiconductor layers comprises three sets.

* * * * *

UNITED STATES PATENT AND TRADEMARK OFFICE
CERTIFICATE OF CORRECTION

PATENT NO. : 5,769,963
DATED : June 23, 1998
INVENTOR(S) : Fujioka, et al.

It is certified that error appears in the above-identified patent and that said Letters Patent is hereby corrected as shown below:

Column 75, line 13, delete "silicon type" and replace with --silicon-containing--.

Signed and Sealed this

Twenty-third Day of March, 1999

Attest:

Q. TODD DICKINSON

Attesting Officer

Acting Commissioner of Patents and Trademarks

UNITED STATES PATENT AND TRADEMARK OFFICE
CERTIFICATE OF CORRECTION

PATENT NO. :  5,769,963

DATED      :  June 23, 1998

INVENTOR(S) :  YASUSHI FUJIOKA, ET AL.

It is certified that error appears in the above-identified patent and that said Letters Patent is hereby corrected as shown below:

COLUMN 2

Line 15, "can not" should read --cannot--; and
    Line 55, "range intermediate" should read
        --intermediate range--.

COLUMN 8

Line 14, "described" should read --describe--.

COLUMN 9

Line 15, "Subsequently," should be deleted; and
    Line 16, "examples" should read --Subsequently, examples--.

COLUMN 27

Line 6, "can not" should read --cannot--; and
    Line 8, "can not" should read --cannot--.

COLUMN 29

Line 32, "belts" should read --belt--; and
    Line 35, "on-the" should read --on the--.

COLUMN 33

Line 31, "have high resistance having was" should read
        --having high resistance was--.

COLUMN 35

Line 37, "high resistance having" should read
        --having high resistance--.

UNITED STATES PATENT AND TRADEMARK OFFICE
CERTIFICATE OF CORRECTION

PATENT NO. : 5,769,963

DATED : June 23, 1998

INVENTOR(S) : YASUSHI FUJIOKA, ET AL.

Page 2 of 3

It is certified that error appears in the above-identified patent and that said Letters Patent is hereby corrected as shown below:

COLUMN 39

Line 45, "impurity" should read --impurity- --.

COLUMN 50

Line 19, "Si containing" should read --Si-containing--.

COLUMN 54

Line 67, "measure." should read --measured.--.

COLUMN 55

Line 41, "Standard B8)" should read --(Standard B8)--.

COLUMN 69

Table B2, "Raw Material $SiH_4$ 600" should read
--Raw Material $SiH_4$ 200-- and
"(sccm) $PH_3$ 4" should read --(sccm) $BF_3$ 4--.

COLUMN 71

Table B8, "$BF_3$ 0.2 $BF_3$ 0.02" should read
--$BF_3$ 0.2 $PH_3$ 0.02--.

COLUMN 72

Table B9, "$SiH_4$ 600" should read --$SiH_4$ 500--.

COLUMN 73

Table B12, "$Si_4$ 600" should read --$SiH_4$ 300-- and
"$BF_3$ 0.2 $BF_3$ 0.02" should read
--$BF_3$ 0.2 $BF_3$ 0.2--.

UNITED STATES PATENT AND TRADEMARK OFFICE
CERTIFICATE OF CORRECTION

PATENT NO. : 5,769,963

DATED : June 23, 1998

INVENTOR(S) : YASUSHI FUJIOKA, ET AL.

It is certified that error appears in the above-identified patent and that said Letters Patent is hereby corrected as shown below:

COLUMN 77

Line 66, "layers," should read --layer,--.

COLUMN 78

Line 26, "silicon containing" should read --silicon-containing--;
    Line 44, "comprising;" should read --comprising:--; and
    Line 52, "position" should be deleted.

COLUMN 79

Line 6, "silicon containing" should read --silicon-containing--.

Signed and Sealed this

Sixth Day of April, 1999

Attest:

Q. TODD DICKINSON

Attesting Officer

Acting Commissioner of Patents and Trademarks